United States Patent
Poole et al.

(10) Patent No.: US 11,215,685 B2
(45) Date of Patent: Jan. 4, 2022

(54) B0 MAGNET METHODS AND APPARATUS FOR A MAGNETIC RESONANCE IMAGING SYSTEM

(71) Applicant: Hyperfine, Inc., Guilford, CT (US)

(72) Inventors: Michael Stephen Poole, Guilford, CT (US); Cedric Hugon, Guilford, CT (US); Christopher Thomas McNulty, Guilford, CT (US)

(73) Assignee: Hyperfine, Inc., Guilford, CT (US)

( * ) Notice: Subject to any disclaimer, the term of this patent is extended or adjusted under 35 U.S.C. 154(b) by 0 days.

(21) Appl. No.: 16/417,345

(22) Filed: May 20, 2019

(65) Prior Publication Data

US 2019/0353726 A1    Nov. 21, 2019

Related U.S. Application Data

(60) Provisional application No. 62/693,044, filed on Jul. 2, 2018, provisional application No. 62/674,482, filed on May 21, 2018.

(51) Int. Cl.
*G01R 33/383*  (2006.01)
*G01R 33/38*  (2006.01)

(52) U.S. Cl.
CPC ....... *G01R 33/383* (2013.01); *G01R 33/3802* (2013.01)

(58) Field of Classification Search
CPC .............. G01R 33/383; G01R 33/3802; G01R 33/3806
See application file for complete search history.

(56) References Cited

U.S. PATENT DOCUMENTS

| | | | |
|---|---|---|---|
| 5,134,374 A | 7/1992 | Breneman et al. |
| 5,153,546 A | 10/1992 | Laskaris |
| 5,194,810 A | 3/1993 | Breneman |
| 5,203,332 A | 4/1993 | Leunbach |
| 5,382,904 A | 1/1995 | Pissanetzky |
| 5,390,673 A | 2/1995 | Kikinis |
| 5,423,315 A | 6/1995 | Margosian et al. |

(Continued)

FOREIGN PATENT DOCUMENTS

| CN | 103892834 A | 7/2014 |
|---|---|---|
| JP | H10-127604 A | 5/1998 |

(Continued)

OTHER PUBLICATIONS

International Search Report and Written Opinion for International Application No. PCT/US2017/63000 dated Apr. 9, 2018.

(Continued)

*Primary Examiner* — G. M. A Hyder
(74) *Attorney, Agent, or Firm* — Wolf, Greenfield & Sacks, P.C.

(57) ABSTRACT

An apparatus for providing a $B_0$ magnetic field for a magnetic resonance imaging system. The apparatus includes at least one first $B_0$ magnet configured to produce a first magnetic field to contribute to the $B_0$ magnetic field for the magnetic resonance imaging system, the at least one first $B_0$ magnet comprising a first plurality of permanent magnet rings including at least two rings with respective different heights.

17 Claims, 24 Drawing Sheets

(56) References Cited

U.S. PATENT DOCUMENTS

| | | | |
|---|---|---|---|
| 5,570,073 A * | 10/1996 | Muller | G01R 33/3806 324/319 |
| 5,659,281 A | 8/1997 | Pissanetzky et al. | |
| 5,808,376 A | 9/1998 | Gordon et al. | |
| 5,864,236 A | 1/1999 | Li | |
| 6,131,690 A | 10/2000 | Galando et al. | |
| 6,150,911 A | 11/2000 | Katznelson et al. | |
| 6,157,281 A | 12/2000 | Katznelson et al. | |
| 6,317,618 B1 | 11/2001 | Livni et al. | |
| 6,411,187 B1 | 6/2002 | Rotem et al. | |
| 6,452,472 B1 | 9/2002 | Aoki et al. | |
| 6,611,702 B2 | 8/2003 | Rohling et al. | |
| 6,842,002 B2 | 1/2005 | Cheng et al. | |
| 7,019,610 B2 | 3/2006 | Creighton, IV et al. | |
| 7,116,102 B2 | 10/2006 | Clarke et al. | |
| 7,218,104 B2 | 5/2007 | Clarke et al. | |
| 7,417,426 B2 | 8/2008 | Race et al. | |
| 7,423,431 B2 * | 9/2008 | Amm | G01R 33/383 324/319 |
| 7,538,553 B2 | 5/2009 | Trequattrini et al. | |
| 7,759,938 B2 | 7/2010 | Prado et al. | |
| 7,834,270 B2 | 11/2010 | Zhu et al. | |
| 7,966,059 B2 | 6/2011 | Creighton, IV et al. | |
| 8,120,358 B2 | 2/2012 | Du | |
| 8,322,024 B2 | 12/2012 | Aoki et al. | |
| 8,335,359 B2 | 12/2012 | Fidrich et al. | |
| 8,368,402 B2 | 2/2013 | Lee et al. | |
| 8,378,682 B2 | 2/2013 | Subbarao | |
| 8,570,042 B2 | 10/2013 | Pines et al. | |
| 8,614,575 B2 | 12/2013 | Demas et al. | |
| 8,699,199 B2 | 4/2014 | Blakes | |
| 8,901,928 B2 | 12/2014 | Alexiuk et al. | |
| 8,993,898 B2 | 3/2015 | Weibler et al. | |
| 9,222,998 B2 | 12/2015 | Teklemariam et al. | |
| 9,255,978 B2 | 2/2016 | Fallone et al. | |
| 9,500,727 B2 | 11/2016 | Sohn et al. | |
| 9,541,616 B2 | 1/2017 | Rothberg et al. | |
| 9,547,057 B2 | 1/2017 | Rearick et al. | |
| 9,625,543 B2 | 4/2017 | Rearick et al. | |
| 9,625,544 B2 | 4/2017 | Poole et al. | |
| 9,638,773 B2 | 5/2017 | Poole et al. | |
| 9,645,210 B2 | 5/2017 | McNulty et al. | |
| 9,797,971 B2 | 10/2017 | Rearick et al. | |
| 9,817,093 B2 | 11/2017 | Rothberg et al. | |
| 9,897,668 B2 | 2/2018 | Piron et al. | |
| 9,910,115 B2 | 3/2018 | Wald et al. | |
| 10,139,464 B2 | 11/2018 | Rearick et al. | |
| 10,145,913 B2 | 12/2018 | Hugon et al. | |
| 10,145,922 B2 | 12/2018 | Rothberg et al. | |
| 10,222,434 B2 | 3/2019 | Poole et al. | |
| 10,222,435 B2 | 3/2019 | Mileski et al. | |
| 10,241,177 B2 | 3/2019 | Poole et al. | |
| 10,274,561 B2 | 4/2019 | Poole et al. | |
| 10,281,540 B2 | 5/2019 | Mileski et al. | |
| 10,281,541 B2 | 5/2019 | Poole et al. | |
| 10,295,628 B2 | 5/2019 | Mileski et al. | |
| 10,310,037 B2 | 6/2019 | McNulty et al. | |
| 10,324,147 B2 | 6/2019 | McNulty et al. | |
| 10,330,755 B2 | 6/2019 | Poole et al. | |
| 10,353,030 B2 | 7/2019 | Poole et al. | |
| 10,371,773 B2 | 8/2019 | Poole et al. | |
| 10,379,186 B2 | 8/2019 | Rothberg et al. | |
| 10,416,264 B2 | 9/2019 | Sofka et al. | |
| 10,444,310 B2 | 10/2019 | Poole et al. | |
| 10,466,327 B2 | 11/2019 | Rothberg et al. | |
| 10,488,482 B2 | 11/2019 | Rearick et al. | |
| 10,495,712 B2 | 12/2019 | Rothberg et al. | |
| 10,520,566 B2 | 12/2019 | Poole et al. | |
| 10,527,692 B2 | 1/2020 | McNulty et al. | |
| 10,534,058 B2 | 1/2020 | Sofka et al. | |
| 10,539,637 B2 | 1/2020 | Poole et al. | |
| 10,545,207 B2 | 1/2020 | Poole et al. | |
| 10,551,452 B2 | 2/2020 | Rearick et al. | |
| 10,564,239 B2 | 2/2020 | Poole et al. | |
| 10,591,561 B2 | 3/2020 | Sacolick et al. | |
| 2002/0175792 A1 | 11/2002 | Laskaris et al. | |
| 2005/0218896 A1 | 10/2005 | Gortler | |
| 2006/0071661 A1 | 4/2006 | Ong | |
| 2006/0077027 A1 | 4/2006 | Aoki | |
| 2006/0241333 A1 | 10/2006 | Hunter | |
| 2007/0120631 A1 | 5/2007 | Hobbs et al. | |
| 2007/0285197 A1 | 12/2007 | Shi et al. | |
| 2009/0099444 A1 | 4/2009 | Bogdanov | |
| 2009/0167304 A1 | 7/2009 | Prado et al. | |
| 2010/0000780 A1 | 1/2010 | Zhu et al. | |
| 2010/0219833 A1 | 9/2010 | McGinley et al. | |
| 2011/0088940 A1 | 4/2011 | Nordling et al. | |
| 2011/0115485 A1 | 5/2011 | Subbarao | |
| 2011/0175694 A1 | 7/2011 | Fallone et al. | |
| 2011/0210739 A1 | 9/2011 | Ham | |
| 2011/0248715 A1 | 10/2011 | Telemariam et al. | |
| 2012/0196753 A1 | 8/2012 | Laskaris et al. | |
| 2012/0323110 A1 | 12/2012 | Blake et al. | |
| 2013/0271142 A1 | 10/2013 | Penanen et al. | |
| 2013/0278255 A1 | 10/2013 | Khalighi et al. | |
| 2013/0285659 A1 | 10/2013 | Sohn et al. | |
| 2014/0111202 A1 | 4/2014 | Wald et al. | |
| 2014/0155732 A1 | 6/2014 | Patz et al. | |
| 2014/0229141 A1 | 8/2014 | Fallone et al. | |
| 2014/0347053 A1 | 11/2014 | Dempsey et al. | |
| 2015/0141799 A1 | 5/2015 | Rapoport et al. | |
| 2015/0177343 A1 | 6/2015 | Wald et al. | |
| 2015/0230810 A1 | 8/2015 | Creighton et al. | |
| 2015/0253401 A1 | 9/2015 | Rapoport | |
| 2015/0285882 A1 | 10/2015 | Mezrich et al. | |
| 2015/0301134 A1 | 10/2015 | Hoshino et al. | |
| 2015/0342177 A1 | 12/2015 | Hassanein et al. | |
| 2016/0011290 A1 | 1/2016 | Iannello | |
| 2016/0069968 A1 | 3/2016 | Rothberg et al. | |
| 2016/0069970 A1 | 3/2016 | Remick et al. | |
| 2016/0069971 A1 | 3/2016 | McNulty et al. | |
| 2016/0069972 A1 | 3/2016 | Poole et al. | |
| 2016/0069975 A1 | 3/2016 | Rothberg et al. | |
| 2016/0128592 A1 | 5/2016 | Rosen et al. | |
| 2016/0131727 A1 | 5/2016 | Sacolick et al. | |
| 2016/0169992 A1 | 6/2016 | Rothberg et al. | |
| 2016/0169993 A1 | 6/2016 | Remick et al. | |
| 2016/0187436 A1 | 6/2016 | Piron et al. | |
| 2016/0223631 A1 | 8/2016 | Poole et al. | |
| 2016/0231399 A1 | 8/2016 | Rothberg et al. | |
| 2016/0231402 A1 | 8/2016 | Rothberg et al. | |
| 2016/0231403 A1 | 8/2016 | Rothberg et al. | |
| 2016/0231404 A1 | 8/2016 | Rothberg et al. | |
| 2016/0299203 A1 | 10/2016 | Mileski et al. | |
| 2016/0334479 A1 | 11/2016 | Poole et al. | |
| 2016/0356869 A1 | 12/2016 | Dempsey et al. | |
| 2017/0007148 A1 | 1/2017 | Kaditz et al. | |
| 2017/0011255 A1 | 1/2017 | Kaditz et al. | |
| 2017/0102443 A1 | 4/2017 | Remick et al. | |
| 2017/0227616 A1 | 8/2017 | Poole et al. | |
| 2017/0276747 A1 | 9/2017 | Hugon et al. | |
| 2017/0276749 A1 | 9/2017 | Hugon et al. | |
| 2017/0285122 A1 | 10/2017 | Kaditz et al. | |
| 2018/0024208 A1 | 1/2018 | Rothberg et al. | |
| 2018/0038931 A1 | 2/2018 | Remick et al. | |
| 2018/0088193 A1 | 3/2018 | Remick et al. | |
| 2018/0136292 A1 | 5/2018 | Piron et al. | |
| 2018/0143274 A1 * | 5/2018 | Poole | G01R 33/389 |
| 2018/0143275 A1 | 5/2018 | Sofka et al. | |
| 2018/0143280 A1 | 5/2018 | Dyvorne et al. | |
| 2018/0143281 A1 | 5/2018 | Sofka et al. | |
| 2018/0144467 A1 | 5/2018 | Sofka et al. | |
| 2018/0156881 A1 | 6/2018 | Poole et al. | |
| 2018/0164390 A1 | 6/2018 | Poole et al. | |
| 2018/0168527 A1 | 6/2018 | Poole et al. | |
| 2018/0210047 A1 | 7/2018 | Poole et al. | |
| 2018/0224512 A1 | 8/2018 | Poole et al. | |
| 2018/0238978 A1 | 8/2018 | McNulty et al. | |
| 2018/0238980 A1 | 8/2018 | Poole et al. | |
| 2018/0238981 A1 | 8/2018 | Poole et al. | |
| 2019/0004130 A1 | 1/2019 | Poole et al. | |
| 2019/0011510 A1 | 1/2019 | Hugon et al. | |
| 2019/0011513 A1 | 1/2019 | Poole et al. | |
| 2019/0011514 A1 | 1/2019 | Poole et al. | |

(56) References Cited

U.S. PATENT DOCUMENTS

| | | |
|---|---|---|
| 2019/0011521 A1 | 1/2019 | Sofka et al. |
| 2019/0018094 A1 | 1/2019 | Mileski et al. |
| 2019/0018095 A1 | 1/2019 | Mileski et al. |
| 2019/0018096 A1 | 1/2019 | Poole et al. |
| 2019/0025389 A1 | 1/2019 | McNulty et al. |
| 2019/0033402 A1 | 1/2019 | McNulty et al. |
| 2019/0033414 A1 | 1/2019 | Sofka et al. |
| 2019/0033415 A1 | 1/2019 | Sofka et al. |
| 2019/0033416 A1 | 1/2019 | Rothberg et al. |
| 2019/0038233 A1 | 2/2019 | Poole et al. |
| 2019/0086497 A1 | 3/2019 | Remick et al. |
| 2019/0101607 A1 | 4/2019 | Rothberg et al. |
| 2019/0162806 A1 | 5/2019 | Poole et al. |
| 2019/0178962 A1 | 6/2019 | Poole et al. |
| 2019/0178963 A1 | 6/2019 | Poole et al. |
| 2019/0227136 A1 | 7/2019 | Mileski et al. |
| 2019/0227137 A1 | 7/2019 | Mileski et al. |
| 2019/0250227 A1 | 8/2019 | McNulty et al. |
| 2019/0250228 A1 | 8/2019 | McNulty et al. |
| 2019/0257903 A1 | 8/2019 | Poole et al. |
| 2019/0324098 A1 | 10/2019 | McNulty et al. |
| 2019/0353720 A1 | 11/2019 | Dyvorne et al. |
| 2019/0353723 A1 | 11/2019 | Dyvorne et al. |
| 2019/0353726 A1 | 11/2019 | Poole et al. |
| 2019/0353727 A1 | 11/2019 | Dyvorne et al. |
| 2020/0011952 A1 | 1/2020 | Rothberg et al. |
| 2020/0018806 A1 | 1/2020 | Rothberg et al. |
| 2020/0022611 A1 | 1/2020 | Nelson et al. |
| 2020/0022612 A1 | 1/2020 | McNulty et al. |
| 2020/0022613 A1 | 1/2020 | Nelson et al. |
| 2020/0025846 A1 | 1/2020 | Nelson et al. |
| 2020/0025851 A1 | 1/2020 | Rearick et al. |
| 2020/0033431 A1 | 1/2020 | Schlemper et al. |
| 2020/0034998 A1 | 1/2020 | Schlemper et al. |
| 2020/0041588 A1 | 2/2020 | O'Halloran et al. |
| 2020/0045112 A1 | 2/2020 | Sacolick et al. |
| 2020/0058106 A1 | 2/2020 | Lazarus et al. |
| 2020/0150202 A1 | 5/2020 | Hugon et al. |
| 2020/0150204 A1 | 5/2020 | Poole et al. |
| 2020/0200844 A1 | 6/2020 | Boskamp et al. |
| 2020/0209334 A1 | 7/2020 | O'Halloran et al. |
| 2020/0289019 A1 | 9/2020 | Schlemper et al. |
| 2020/0289022 A1 | 9/2020 | Coumans et al. |
| 2020/0294229 A1 | 9/2020 | Schlemper et al. |
| 2020/0294282 A1 | 9/2020 | Schlemper et al. |
| 2020/0294287 A1 | 9/2020 | Schlemper et al. |
| 2020/0337587 A1 | 10/2020 | Sacolick et al. |
| 2020/0355765 A1 | 11/2020 | Chen et al. |
| 2021/0048498 A1 | 2/2021 | Dyvorne et al. |

FOREIGN PATENT DOCUMENTS

| | | |
|---|---|---|
| JP | 2005-118098 A | 5/2005 |
| TW | 201712357 A | 4/2017 |
| WO | WO 2016/183284 A1 | 11/2016 |

OTHER PUBLICATIONS

International Preliminary Report on Patentability for International Application No. PCT/US2017/63000 dated Jun. 6, 2019.
International Search Report and Written Opinion for International Application No. PCT/US2019/33090 dated Aug. 6, 2019.
U.S. Appl. No. 16/207,971, filed Dec. 3, 2018, Rothberg et al.
U.S. Appl. No. 15/640,369, filed Jun. 30, 2017, Dyvorne et al.
U.S. Appl. No. 15/879,317, filed Jan. 24, 2018, Poole et al.
U.S. Appl. No. 15/880,482, filed Jan. 25, 2018, Poole et al.
U.S. Appl. No. 16/122,661, filed Sep. 5, 2018, Poole et al.
U.S. Appl. No. 15/878,791, filed Jan. 24, 2018, Poole et al.
U.S. Appl. No. 15/879,254, filed Jan. 24, 2018, Poole et al.
U.S. Appl. No. 16/123,989, filed Sep. 6, 2018, Poole.
U.S. Appl. No. 15/821,207, filed Nov. 22, 2017, Poole et al.
U.S. Appl. No. 15/879,203, filed Jan. 24, 2018, Poole et al.
U.S. Appl. No. 15/956,522, filed Apr. 18, 2018, Poole.
U.S. Appl. No. 15/956,554, filed Apr. 18, 2018, Poole.
U.S. Appl. No. 16/130,712, filed Sep. 13, 2018, Poole et al.
U.S. Appl. No. 16/130,788, filed Sep. 13, 2018, Poole et al.
U.S. Appl. No. 15/956,584, filed Apr. 18, 2018, McNulty et al.
U.S. Appl. No. 16/137,310, filed Sep. 20, 2018, McNulty.
U.S. Appl. No. 16/137,345, filed Sep. 20, 2018, McNulty.
PCT/US2017/63000, Apr. 9, 2018, International Search Report and Written Opinion.
PCT/US2017/63000, Jun. 6, 2019 International Preliminary Report on Patentability.
PCT/US2019/33090, Aug. 6, 2019 International Search Report and Written Opinion.

* cited by examiner

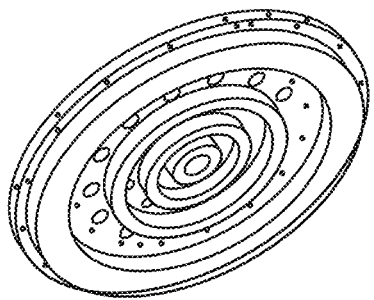
FIG. 6C
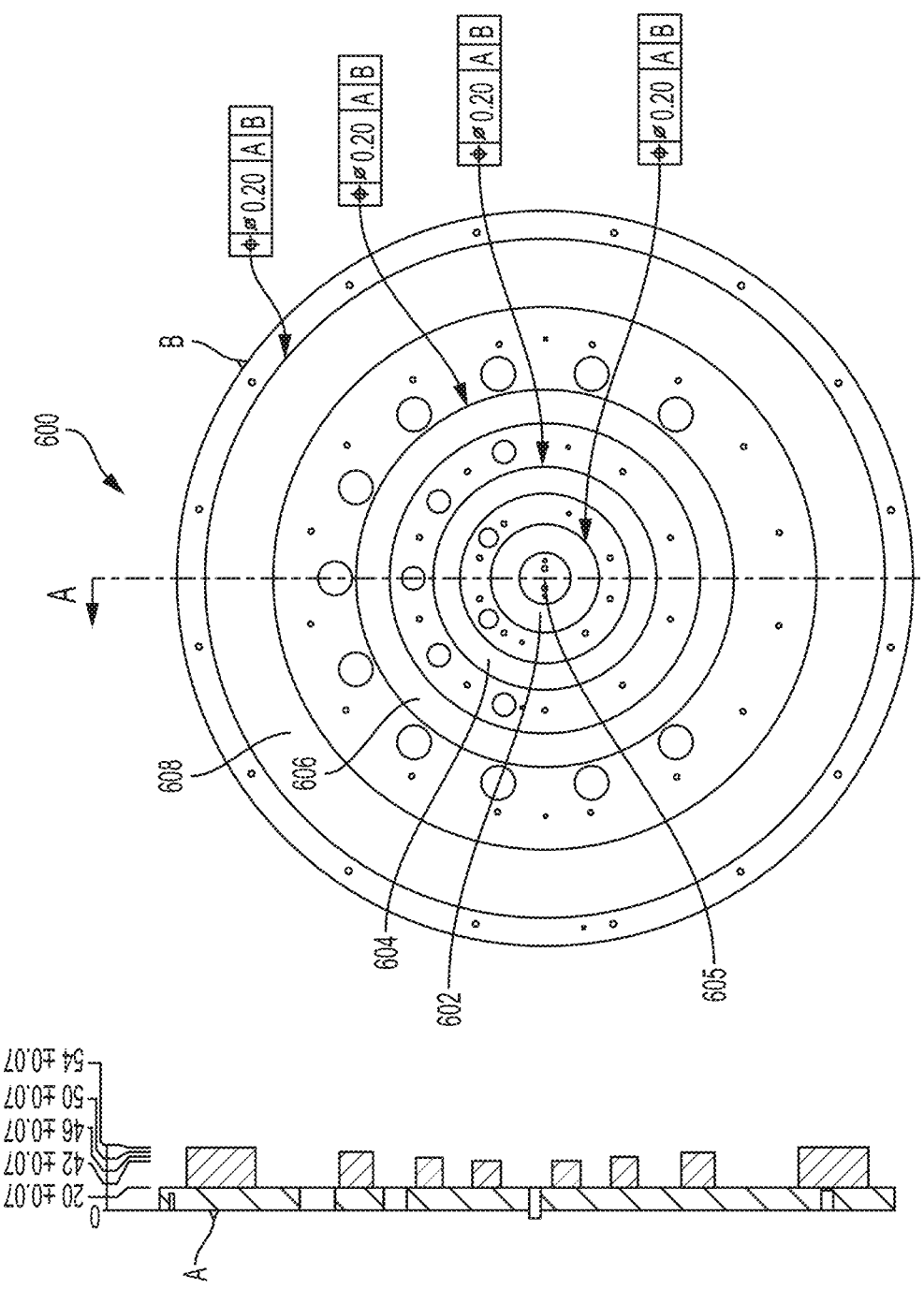
FIG. 6B
FIG. 6A

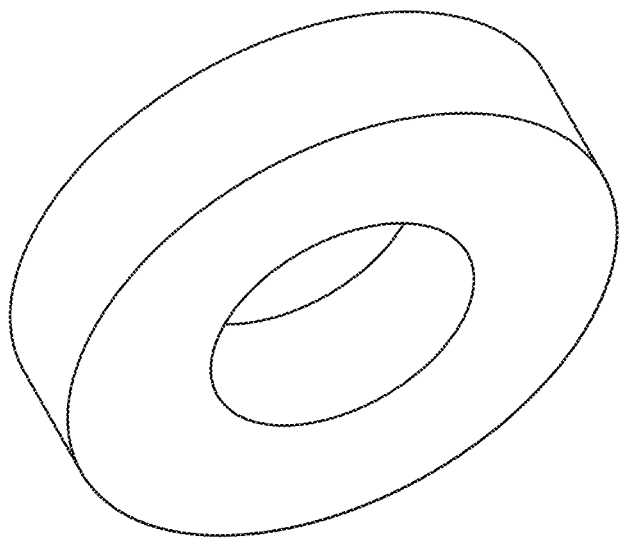
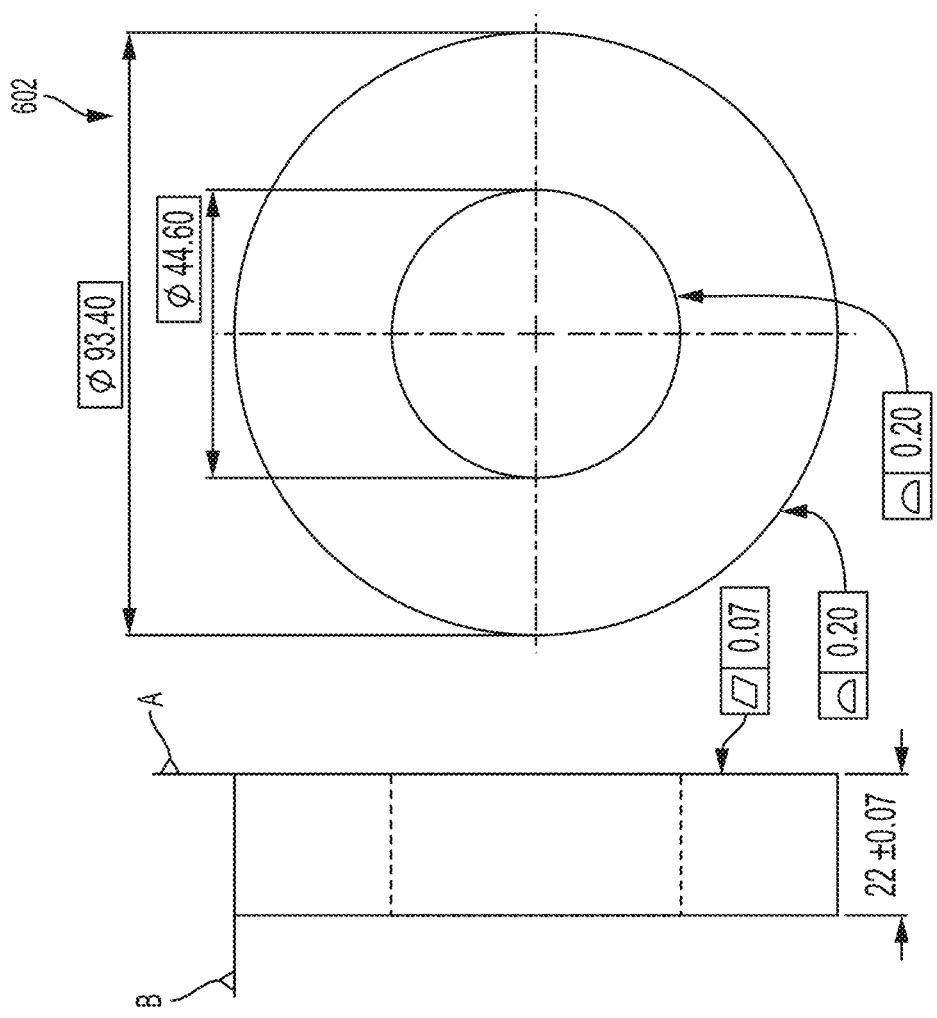
FIG. 7C
FIG. 7B
FIG. 7A

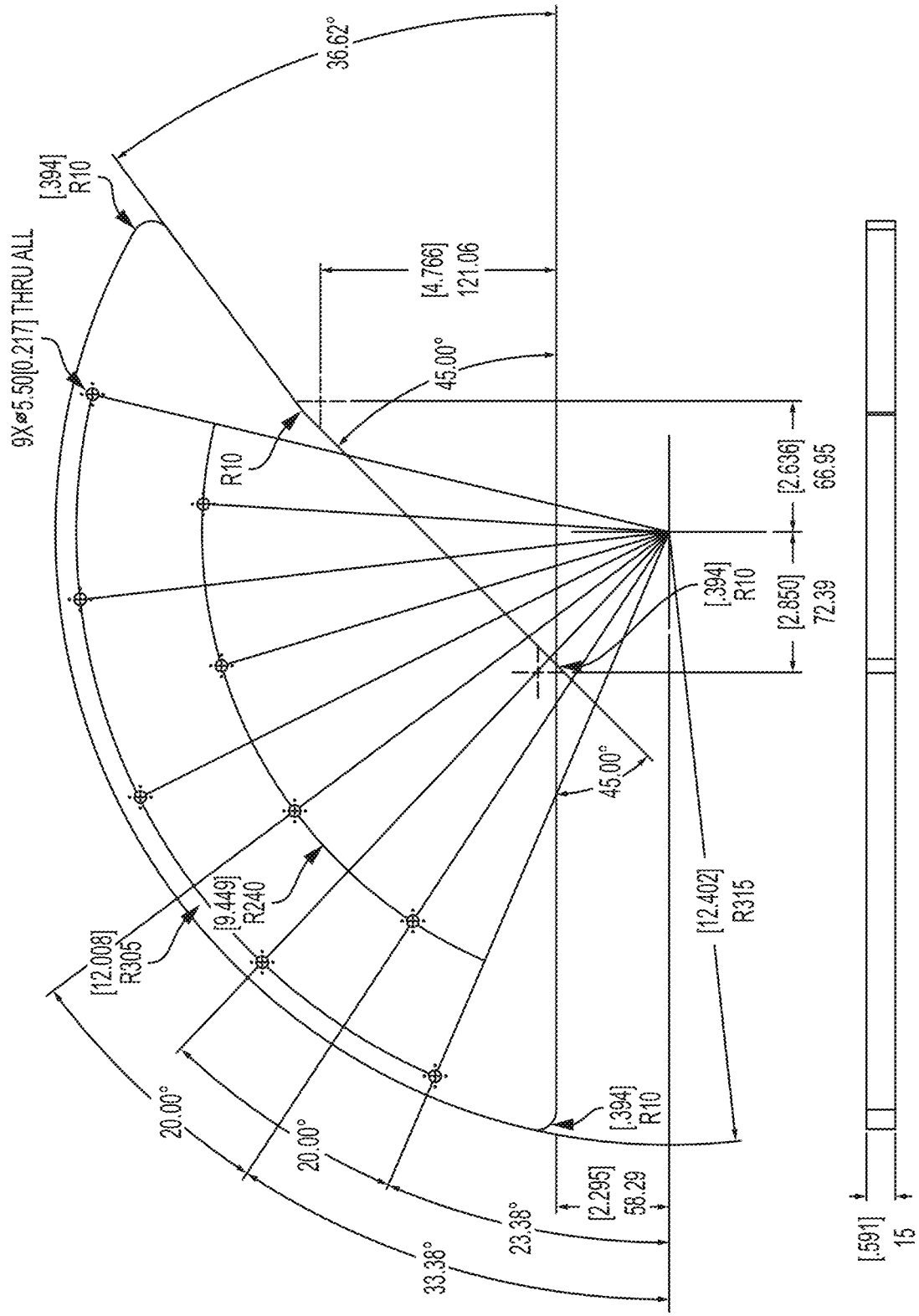

B0 MAGNET METHODS AND APPARATUS FOR A MAGNETIC RESONANCE IMAGING SYSTEM

CROSS-REFERENCE TO RELATED APPLICATIONS

This application claims the priority under 35 U.S.C. § 119 to U.S. Provisional Application Ser. No. 62/674,482, filed May 21, 2018, and titled "$B_0$ Magnet Methods and Apparatus for a Magnetic Resonance System" and U.S. Provisional Application Ser. No. 62/693,044, filed Jul. 2, 2018, and titled "$B_0$ Magnet Methods and Apparatus for a Magnetic Resonance System", each of which is incorporated by reference herein in its entirety.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

MRI provides an attractive imaging modality for biological imaging due to the ability to produce non-invasive images having relatively high resolution and contrast without the safety concerns of other modalities (e.g., without needing to expose the subject to ionizing radiation, e.g., x-rays, or introducing radioactive material to the body). Additionally, MRI is particularly well suited to provide soft tissue contrast, which can be exploited to image subject matter that other imaging modalities are incapable of satisfactorily imaging. Moreover, MR techniques are capable of capturing information about structures and/or biological processes that other modalities are incapable of acquiring. However, there are a number of drawbacks to MRI that, for a given imaging application, may involve the relatively high cost of the equipment, limited availability and/or difficulty in gaining access to clinical MRI scanners and/or the length of the image acquisition process.

The trend in clinical MRI has been to increase the field strength of MRI scanners to improve one or more of scan time, image resolution, and image contrast, which, in turn, continues to drive up costs. The vast majority of installed MRI scanners operate at 1.5 or 3 tesla (T), which refers to the field strength of the main magnetic field $B_0$. A rough cost estimate for a clinical MRI scanner is approximately one million dollars per tesla, which does not factor in the substantial operation, service, and maintenance costs involved in operating such MRI scanners.

Additionally, conventional high-field MRI systems typically require large superconducting magnets and associated electronics to generate a strong uniform static magnetic field ($B_0$) in which an object (e.g., a patient) is imaged. The size of such systems is considerable with a typical MRI installment including multiple rooms for the magnet, electronics, thermal management system, and control console areas. The size and expense of MRI systems generally limits their usage to facilities, such as hospitals and academic research centers, which have sufficient space and resources to purchase and maintain them. The high cost and substantial space requirements of high-field MRI systems results in limited availability of MRI scanners. As such, there are frequently clinical situations in which an MRI scan would be beneficial, but due to one or more of the limitations described above, is not practical or is impossible, as described in further detail below.

SUMMARY

Some embodiments include an apparatus for providing a $B_0$ magnetic field for a magnetic resonance imaging system, the apparatus comprising: at least one first $B_0$ magnet configured to produce a first magnetic field to contribute to the $B_0$ magnetic field for the magnetic resonance imaging system, the at least one first $B_0$ magnet comprising a first plurality of permanent magnet rings including at least two rings with respective different heights.

In some embodiments, each of the first plurality of permanent magnet rings has a respective different height.

In some embodiments the apparatus further comprises at least one second $B_0$ magnet configured to produce a second magnetic field to contribute to the $B_0$ magnetic field for the magnetic resonance imaging system, the at least one first $B_0$ magnet comprising a second plurality of permanent magnet rings including at least two rings with respective different heights.

In some embodiments, each of the second plurality of permanent magnet rings has a respective different height.

In some embodiments, the at least one first $B_0$ magnet and the at least one second $B_0$ magnet are arranged relative to one another so that an imaging region is provided there between, and wherein the different heights of the first plurality of permanent magnet rings and the different heights of the second plurality of permanent magnet rings are selected to obtain a first level of magnetic field homogeneity within a first field of view in the imaging region that is smaller than a second level of magnetic field homogeneity in the first field of view that would be obtained with an arrangement of the first plurality of permanent magnet rings having equal heights and the second plurality of permanent magnet rings having equal heights.

In some embodiments, the first field of view includes a sphere having a diameter in a range of 17-23 cm and the first level of magnetic field of homogeneity is at least a factor of two smaller than the second level of magnetic homogeneity.

In some embodiments, the at least one first $B_0$ magnet and the at least one second $B_0$ magnet are arranged relative to one another so that an imaging region is provided there between, wherein the different heights of the first plurality of permanent magnet rings and the different heights of the second plurality of permanent magnet rings are selected to obtain, in the imaging region, a first field of view having a first volume and a first magnetic field homogeneity, and wherein the first volume is greater than a second volume of a second field of view having the first magnetic field homogeneity that would be obtained if heights of the first plurality of permanent magnet rings were equal and heights of the second plurality of permanent magnet rings were equal.

In some embodiments, the first volume is at least 10 percent larger than the second volume.

In some embodiments, wherein the first plurality of permanent magnet rings is concentric about a common center.

In some embodiments, the first plurality of permanent magnet rings comprises a first permanent magnet ring closer to the common center than a second permanent magnet ring, and wherein a first height of permanent magnet segments in the first permanent magnet ring is smaller than a second height of permanent magnet segments in the second permanent magnet ring.

In some embodiments, the first plurality of permanent magnet rings comprises a third permanent magnet ring farther from the common center than the second permanent magnet ring, and wherein a third height of permanent magnet segments in the third permanent magnet ring is greater than the second height of the permanent magnet segments in the second permanent magnet ring.

In some embodiments, the first plurality of permanent magnet rings comprises a fourth permanent magnet ring farther from the common center than the third permanent magnet ring, and wherein a fourth height of permanent magnet segments in the fourth permanent magnet ring is greater than the third height of permanent magnet segments in the third permanent magnet ring.

In some embodiments, multiple permanent magnet segments in the first permanent magnet ring have the first height, and wherein multiple permanent magnet segments in the second permanent magnet ring have the second height.

In some embodiments, each of the permanent magnet segments in the first permanent magnet ring have the first height, and wherein each of the permanent magnet segments in the second permanent magnet ring have the second height.

In some embodiments, the permanent magnet segments in the first permanent magnet ring comprise circular arc segments. In some embodiments, the permanent magnet segments in the first permanent magnet ring comprise rectangular blocks. In some embodiments, the permanent magnet segments in the first permanent magnet ring comprise trapezoidal blocks.

In some embodiments, the second plurality of permanent magnet rings is concentric about a common center.

In some embodiments, the first plurality of permanent magnet rings and the second plurality of permanent magnet rings have a same number of rings such that each permanent magnet ring in the first plurality of permanent magnet rings has a corresponding permanent magnet ring in the second plurality of permanent magnet rings, and wherein each pair of corresponding permanent magnet rings have permanent magnet segments of a same height.

In some embodiments, the at least one first $B_0$ magnet and the at least one second $B_0$ magnet contribute to the $B_0$ magnetic field for the magnetic resonance imaging system, the $B_0$ magnetic field having a field strength of less than or equal to approximately 0.2 T and greater than or equal to approximately 0.1 T.

In some embodiments, the at least one first $B_0$ magnet and the at least one second $B_0$ magnet contribute to the $B_0$ magnetic field for the magnetic resonance imaging system, the $B_0$ magnetic field having a field strength of less than or equal to approximately 0.1 T and greater than or equal to approximately 50 mT.

In some embodiments, wherein the at least one first $B_0$ magnet and the at least one second $B_0$ magnet contribute to the $B_0$ magnetic field for the magnetic resonance imaging system, the $B_0$ magnetic field having a field strength of less than or equal to approximately 50 mT and greater than or equal to approximately 20 mT.

Some embodiments provide for an apparatus for providing a $B_0$ magnetic field for a magnetic resonance imaging system, the apparatus comprising: at least one first $B_0$ magnet configured to produce a first magnetic field to contribute to the $B_0$ magnetic field for the magnetic resonance imaging system; at least one second $B_0$ magnet configured to produce a second magnetic field to contribute to the $B_0$ magnetic field for the magnetic resonance imaging system, wherein the at least one first $B_0$ magnet and the at least one second $B_0$ magnet are arranged relative to one another so that an imaging region is provided there between; and a yoke configured to capture and direct at least some magnetic flux generated by the at least one first $B_0$ magnet and the at least one second $B_0$ magnet to increase the magnetic flux density within the imaging region, the yoke comprising: a first plate comprising ferromagnetic material and coupled to the at least one first $B_0$ magnet; a second plate comprising ferromagnetic material and coupled to the at least one second $B_0$ magnet; a frame comprising ferromagnetic material and coupled to the first plate and the second plate; first additional ferromagnetic material coupled to the first plate to compensate for magnetic saturation induced in the first plate; and second additional ferromagnetic material coupled to the second plate to compensate for magnetic saturation induced in the second plate.

In some embodiments, the first additional ferromagnetic material is attached to the first plate on a side of the first plate facing away from the second plate. In some embodiments, the first additional ferromagnetic material is part of the first plate.

In some embodiments, the first additional ferromagnetic material is attached to the yoke.

In some embodiments, the second additional ferromagnetic material is coupled to the second plate on a side of the second plate facing away from the first plate.

In some embodiments, the first plate comprises a first region having a first differential permeability and a second region having a second differential permeability lower than the first differential permeability, and wherein the first additional ferromagnetic material is disposed proximate the first region to compensate for differential permeability differences in the first and second regions.

In some embodiments, the first additional ferromagnetic material comprises at least one ferromagnetic plate.

In some embodiments, the frame comprises a first arm portion comprising ferromagnetic material coupled to the first plate, and wherein the at least one ferromagnetic plate is proximate the first arm portion.

In some embodiments, the at least one ferromagnetic plate comprises a third plate proximate to the first arm portion and a fourth plate proximate to the first arm portion.

In some embodiments, the first arm portion is disposed between and separates the third and fourth plates.

In some embodiments, each of the first and second plate is substantially circular.

In some embodiments, the first additional ferromagnetic material comprises a third plate having a substantially circular edge.

In some embodiments, the first additional ferromagnetic material comprises a third plate that is substantially a truncated circular sector.

In some embodiments, the frame is substantially C-shaped.

In some embodiments, the at least one first $B_0$ magnet and the at least one second $B_0$ magnet contribute to the $B_0$ magnetic field for the magnetic resonance imaging system, the $B_0$ magnetic field having a field strength of less than or equal to approximately 0.2 T and greater than or equal to approximately 0.1 T.

In some embodiments, the at least one first $B_0$ magnet and the at least one second $B_0$ magnet contribute to the $B_0$ magnetic field for the magnetic resonance imaging system, the $B_0$ magnetic field having a field strength of less than or equal to approximately 0.1 T and greater than or equal to approximately 50 mT.

In some embodiments, the at least one first $B_0$ magnet and the at least one second $B_0$ magnet contribute to the $B_0$ magnetic field for the magnetic resonance imaging system, the $B_0$ magnetic field having a field strength of less than or equal to approximately 50 mT and greater than or equal to approximately 20 mT.

In some embodiments, the yoke comprises at least one portion made from low carbon steel, cobalt steel (CoFe), and/or silicon steel.

In some embodiments, the at least one first $B_0$ magnet and the at least one second $B_0$ magnet each comprises a permanent $B_0$ magnet.

In some embodiments, the at least one first $B_0$ magnet and the at least one second $B_0$ magnet each comprises a plurality of concentric permanent magnet rings.

Some embodiments provide for an apparatus for providing a $B_0$ magnetic field for a magnetic resonance imaging system, the apparatus comprising: at least one first $B_0$ magnet configured to produce a first magnetic field to contribute to the $B_0$ magnetic field for the magnetic resonance imaging system; at least one second $B_0$ magnet configured to produce a second magnetic field to contribute to the $B_0$ magnetic field for the magnetic resonance imaging system, wherein the at least one first $B_0$ magnet and the at least one second $B_0$ magnet are arranged relative to one another so that an imaging region is provided there between; and a yoke configured to capture and direct at least some magnetic flux generated by the at least one first $B_0$ magnet and the at least one second $B_0$ magnet to increase the magnetic flux density within the imaging region, the yoke comprising: a first plate comprising ferromagnetic material and coupled to the at least one first $B_0$ magnet and a first set of one or more holes to compensate for magnetic saturation induced in the first plate; a second plate comprising ferromagnetic material and coupled to the at least one second $B_0$ magnet and a second set of one or more holes to compensate for magnetic saturation induced in the second plate; a frame comprising ferromagnetic material and coupled to the first plate and the second plate.

In some embodiments, holes in the first set of one or more holes are circular.

In some embodiments, the first set of one more holes makes permeability in the first plate substantially more symmetric relative to permeability in the first plate that would be present if the first set of one or more holes were absent.

Some embodiments provide for an apparatus for providing a $B_0$ magnetic field for a magnetic resonance imaging system, the apparatus comprising: at least one first $B_0$ magnet configured to produce a first magnetic field to contribute to the $B_0$ magnetic field for the magnetic resonance imaging system; at least one second $B_0$ magnet configured to produce a second magnetic field to contribute to the $B_0$ magnetic field for the magnetic resonance imaging system, wherein the at least one first $B_0$ magnet and the at least one second $B_0$ magnet are arranged relative to one another so that an imaging region is provided there between; and a yoke configured to capture and direct at least some magnetic flux generated by the at least one first $B_0$ magnet and the at least one second $B_0$ magnet to increase the magnetic flux density within the imaging region, the yoke comprising: a first plate comprising ferromagnetic material and coupled to the at least one first $B_0$ magnet, wherein the first plate has a varying thickness to compensate for magnetic saturation induced in the first plate; a second plate comprising ferromagnetic material and coupled to the at least one second $B_0$ magnet, wherein the second plate has a varying thickness to compensate for magnetic saturation induced in the second plate; and a frame comprising ferromagnetic material and coupled to the first plate and the second plate.

BRIEF DESCRIPTION OF THE DRAWINGS

Various aspects and embodiments of the disclosed technology will be described with reference to the following figures. It should be appreciated that the figures are not necessarily drawn to scale.

FIGS. 6A-C respectively illustrate a cross-section side view, a top view, and an isometric view of a permanent $B_0$ magnet, in accordance with some embodiments of the technology described herein.

FIGS. 7A-C respectively illustrate a cross-section side view, a top view, and an isometric view of an innermost ring of the four-ring permanent $B_0$ magnet shown in FIGS. 6A-C, in accordance with some embodiments of the technology described herein.

FIG. 8B is a schematic drawing of additional ferromagnetic material coupled to a plate to compensate for magnetic saturation induced in the plate, in accordance with some embodiments of the technology described herein.

DETAILED DESCRIPTION

Figure 1:
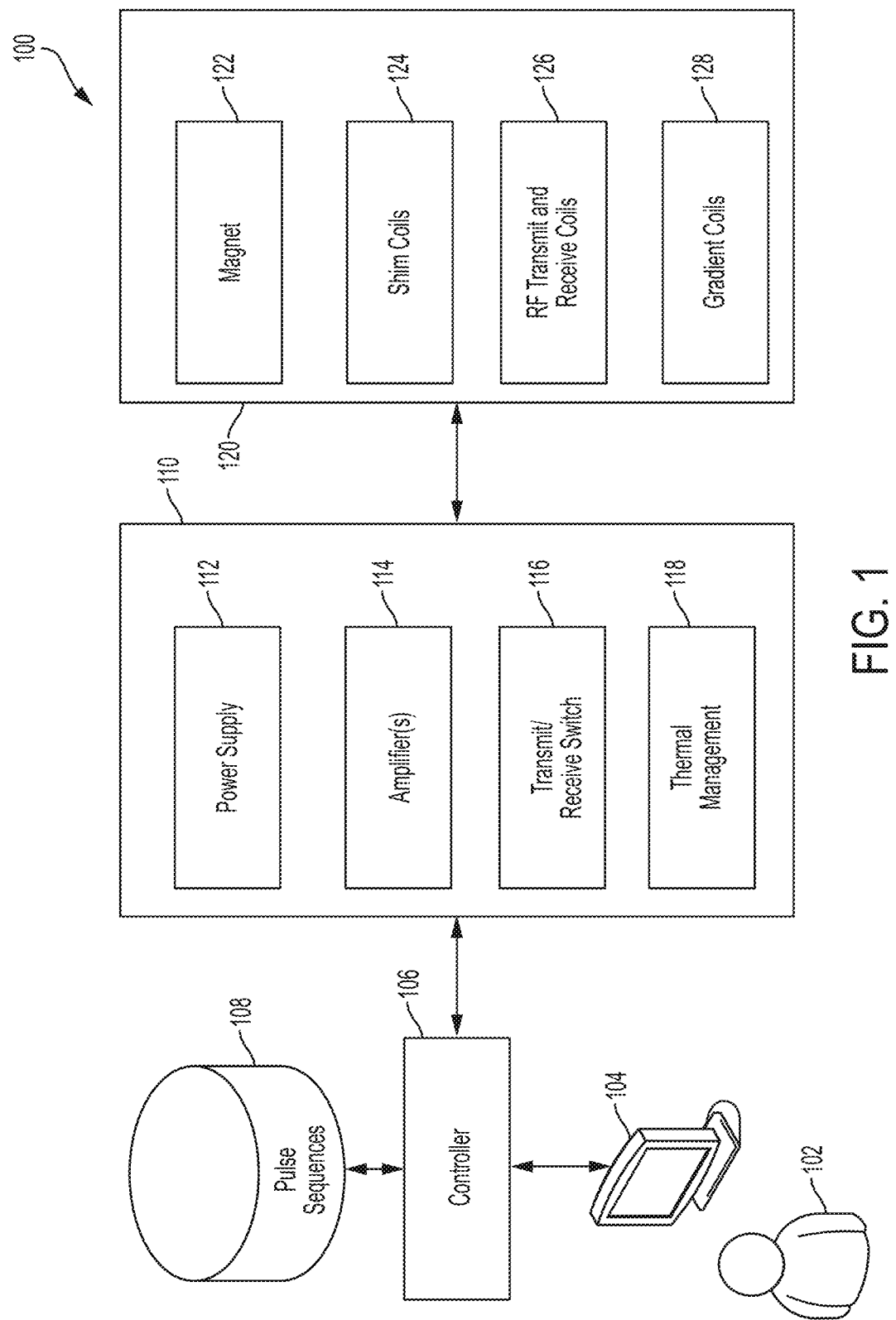
FIG. 1 illustrates exemplary components of a magnetic resonance imaging system, in accordance with some embodiments of the technology described herein.

The MRI scanner market is overwhelmingly dominated by high-field systems, and particularly for medical or clinical MRI applications. As described above, the general trend in medical imaging has been to produce MRI scanners with increasingly greater field strengths, with the vast majority of clinical MRI scanners operating at 1.5 T or 3 T, with higher field strengths of 7 T and 9 T used in research settings. As used herein, "high-field" refers generally to MRI systems presently in use in a clinical setting and, more particularly, to MRI systems operating with a main magnetic field (i.e., a $B_0$ field) at or above 1.5 T, though clinical systems operating between 0.5 T and 1.5 T are often also characterized as "high-field." Field strengths between approximately 0.2 T and 0.5 T have been characterized as "mid-field" and, as field strengths in the high-field regime have continued to increase, field strengths in the range between 0.5 T and 1 T have also been characterized as mid-field. By contrast, "low-field" refers generally to MRI systems operating with a $B_0$ field of less than or equal to approximately 0.2 T, though systems having a $B_0$ field of between 0.2 T and approximately 0.3 T have sometimes been characterized as low-field as a consequence of increased field strengths at the high end of the high-field regime. Within the low-field regime, low-field MRI systems operating with a $B_0$ field of less than 0.1 T are referred to herein as "very low-field" and low-field MRI systems operating with a $B_0$ field of less than 10 mT are referred to herein as "ultra-low field."

The inventors have developed techniques enabling portable, low-field, low power and/or lower-cost MRI systems that can improve the wide-scale deployability of MRI technology in a variety of environments beyond the current MRI installments at hospitals and research facilities. As a result, MRI can be deployed in emergency rooms, small clinics, doctor's offices, in mobile units, in the field, etc. and may be brought to the patient (e.g., bedside) to perform a wide variety of imaging procedures and protocols. Some embodiments include very low-field MRI systems (e.g., 0.1 T, 50 mT, 20 mT, etc.) that facilitate portable, low-cost, low-power MRI, significantly increasing the availability of MRI in a clinical setting.

There are numerous challenges to developing a clinical MRI system in the low-field regime. As used herein, the term clinical MRI system refers to an MRI system that produces clinically useful images, which refers to an images having sufficient resolution and adequate acquisition times to be useful to a physician or clinician for its intended purpose given a particular imaging application. As such, the resolutions/acquisition times of clinically useful images will depend on the purpose for which the images are being obtained. Among the numerous challenges in obtaining clinically useful images in the low-field regime is the relatively low SNR. Specifically, the relationship between SNR and $B_0$ field strength is approximately $B_0^{5/4}$ at field strength above 0.2 T and approximately $B_0^{3/2}$ at field strengths below 0.1 T. As such, the SNR drops substantially with decreases in field strength with even more significant drops in SNR experienced at very low field strength. This substantial drop in SNR resulting from reducing the field strength is a significant factor that has prevented development of clinical MRI systems in the very low-field regime. In particular, the challenge of the low SNR at very low field strengths has prevented the development of a clinical MRI system operating in the very low-field regime. As a result, clinical MRI systems that seek to operate at lower field strengths have conventionally achieved field strengths of approximately the 0.2 T range and above. These MRI systems are still large, heavy and costly, generally requiring fixed dedicated spaces (or shielded tents) and dedicated power sources.

The inventors have developed low-field and very low-field MRI systems capable of producing clinically useful images, allowing for the development of portable, low cost and easy to use MRI systems not achievable using state of the art technology. According to some embodiments, an MRI system can be transported to the patient to provide a wide variety of diagnostic, surgical, monitoring and/or therapeutic procedures, generally, whenever and wherever needed.

In developing low-field and very-low filed MRI systems, the inventors have addressed the relatively low SNR characteristic of the low-field regime, in part, by improving the homogeneity of the $B_0$ field produced by the $B_0$ magnet.

Figure 2:
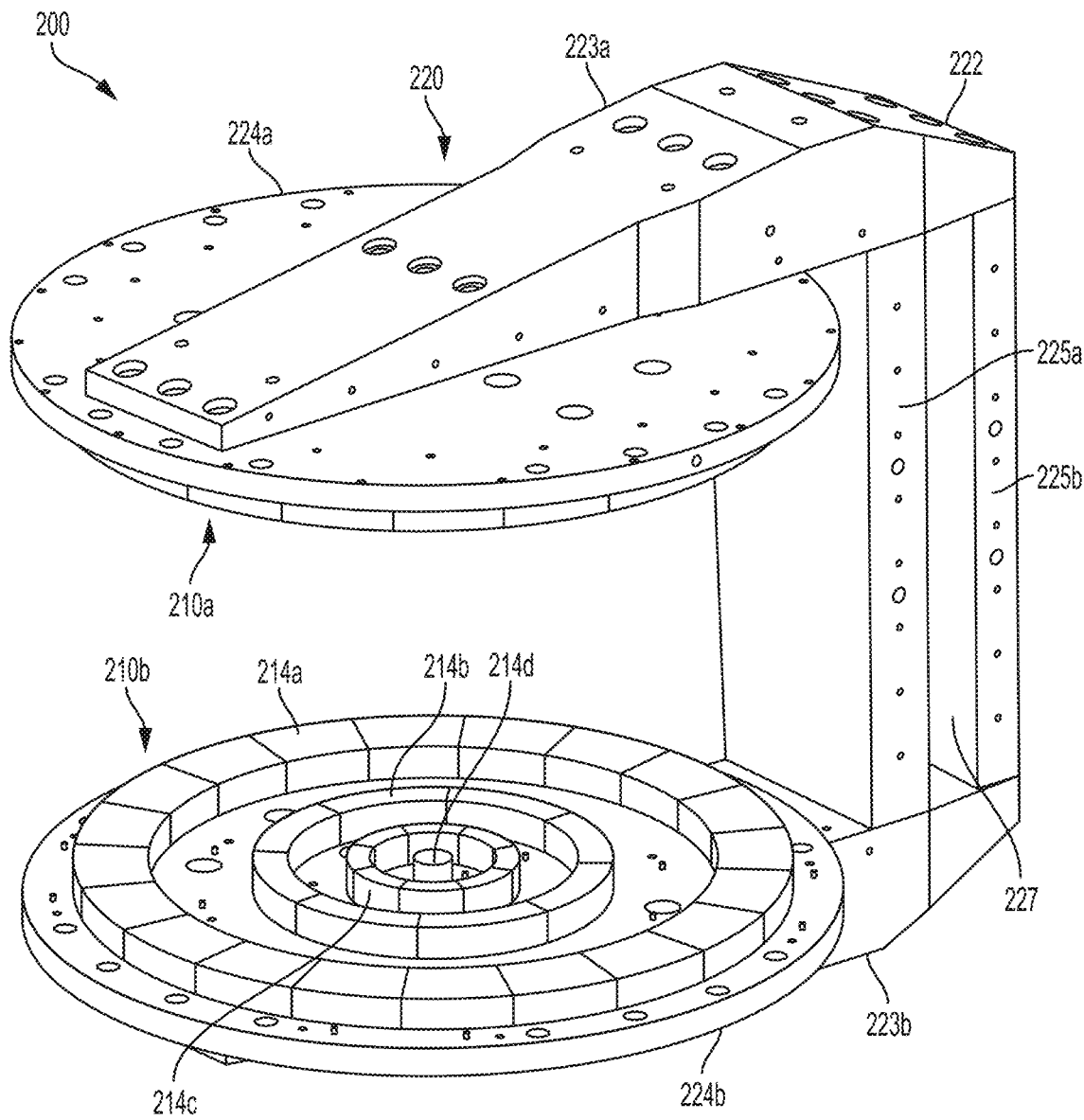
FIG. 2 illustrates a $B_0$ magnet comprising a plurality of concentric permanent magnet rings each of the rings comprising permanent magnet segments, in accordance with some embodiments of the technology described herein.

In some embodiments, the low-field and very-low field MRI systems developed by the inventors include a permanent $B_0$ magnet to produce a $B_0$ magnetic field. And, for example as shown in FIG. 2, the permanent $B_0$ magnet may include one or more sets of concentric permanent magnet rings, in some embodiments. The inventors have recognized that, in such embodiments, the homogeneity of the $B_0$ magnetic field produced by the $B_0$ magnet may be increased by varying the heights of the permanent magnet rings instead of keeping them the same height. In particular, the inventors have recognized that the heights of the permanent magnet rings may be selected such that, for the same field of view in the imaging region provided between a pair of permanent magnets in a bi-planar geometry, the homogeneity of the magnetic field in the field of view is increased. For a fixed field of view, suitably varying permanent magnet ring heights may increase magnetic field homogeneity by an order of magnitude (e.g., by a factor of two, by a factor of three, by a factor of 5, by a factor of 10, by a factor of 20, etc.) relative to a configuration in which the permanent magnet ring heights are equal. As an illustrative non-limiting example, for a spherical field of view having a diameter of 20 cm, the homogeneity of the $B_0$ field in the field of view may be in the range of 500-1000 ppm when the rings have uniform height, but may be 250-500 ppm when the rings have varying heights.

The inventors have also recognized that the size of the field of view (of a given homogeneity) may be increased by varying the heights of the permanent magnet rings instead of keeping them the same height. In particular, the inventors have recognized that the heights of the permanent magnet rings may be selected such that the volume of the field of view, in the imaging region provided between a pair of permanent magnets in a bi-planar geometry, may be increased relative to the volume of a field of view of the same homogeneity that could be obtained using permanent magnet rings having equal heights. As an illustrative non-limiting example, for a fixed level of magnetic field homogeneity in the range of 500-1000 ppm, the volume of the field of view may be increased by at least 10% by varying permanent magnet ring heights instead of keeping the ring heights identical.

Using varying permanent magnet ring heights to increase the homogeneity of the magnetic field (and/or to increase the size of the field of view) is different from and improves upon conventional techniques for improving magnetic field homogeneity. Conventional techniques for improving magnetic field homogeneity involve adding one or more ferromagnetic pieces of metal (sometimes termed "pole pieces") to focus the magnetic flux produced by the magnets in an effort to improve magnetic field uniformity. However, this approach would add significant weight to the magnet assembly due to the additional pole piece metal. The approach developed by the inventors does not involve introducing new ferromagnetic material to the assembly. Instead, the permanent magnet itself is modified—through variation of the permanent ring heights—to increase magnetic field homogeneity.

In some embodiments, the heights of permanent magnet rings may be varied by making each of the permanent magnet rings have a different respective height. In some embodiments, a pair of heights may differ from one another by at least by at least 1%, 5%, 10%, by at least 15%, by at least 20%, by at least 25%, by at least 50%, or by any other suitable amount in the range of 1-100%. For example, as shown in FIGS. 7A-L, a permanent magnet may include four rings having heights of 22 mm, 26 mm, 30 mm, and 34 mm, respectively. It should be appreciated, however, in some embodiments, some and not all permanent magnet rings have different respective heights. For example, in some embodiments, two of the permanent magnet rings may have the same height, but two of the permanent magnet rings may have different heights.

Accordingly, some embodiments include an apparatus for providing a $B_0$ magnetic field for a magnetic resonance imaging system. The apparatus may include a first $B_0$ magnet configured to produce a first magnetic field to contribute to the $B_0$ magnetic field for the magnetic resonance imaging system. The first $B_0$ magnet may include multiple permanent magnet rings at least two of which have different heights. In some embodiments, all of the permanent magnet rings in the first $B_0$ magnet may have different respective heights.

In some embodiments, the first $B_0$ magnet may be one of multiple $B_0$ magnets that each produces a respective magnetic field to contribute to the $B_0$ magnetic field for the MRI system. For example, the first $B_0$ magnet may be one of the two permanent magnets in a bi-planar geometry that each generate a respective magnetic field and that together with a yoke form (e.g., as shown in FIG. 2) at least a part of an apparatus for providing a $B_0$ magnetic field for an MRI system.

Accordingly, in some embodiments, the apparatus for providing a $B_0$ magnetic field for a magnetic resonance imaging system also includes a second $B_0$ magnet configured to produce a second magnetic field to contribute to the $B_0$ magnetic field for the MRI system. The second $B_0$ magnet includes multiple permanent magnet rings, at least two of which have different heights. In some embodiments, all of the permanent magnet rings in the second $B_0$ magnet may have different respective heights.

In some embodiments, the first and second $B_0$ magnets may be arranged relative to one another so that an imaging region is provided between them. In some embodiments, the different heights of the permanent magnet rings in the first and second $B_0$ magnets may be selected to obtain a more homogeneous magnetic field, for a fixed field of view within the imaging region, than would be obtained if the heights of the permanent magnet rings were equal. For example, for a spherical field of view having a diameter in a range of 17-23 cm (e.g., 20 cm), the heights of the permanent magnet rings in the first and second $B_0$ magnets may be selected to obtain a magnetic field having a level of homogeneity that is at least a factor of two (or three or four or five, etc.) smaller than the level of homogeneity in the spherical field of view that would be obtained if the heights of the permanent magnet rings were the same.

In some embodiments, the different heights of the permanent magnet rings in the first and second $B_0$ magnets may be selected to obtain, for a given level of magnetic field homogeneity (e.g., a level in the range of 500-1000 ppm such as, for example 700 ppm) a field of view having a volume that is greater than (e.g., by at least 5%, at least 10%, at least 15%, at least 25%, at least 30%, at least 50%, etc.) the volume of the field of view with the same given level of magnetic field homogeneity that could be achieved using permanent magnet rings with equal heights. The level of homogeneity may be measured in deviations of parts per million (ppm). The smaller the level of homogeneity, the more homogeneous the magnetic field. Similarly, the greater the level of homogeneity, the less homogeneous the magnetic field.

In some embodiments, the permanent magnet rings in the first $B_0$ magnet are concentric about a common center. In some embodiments, the heights of the permanent magnet rings monotonically increase from the innermost ring to the outermost ring. For example, the first plurality of rings may have first, second, third, and fourth rings arranged in that order with the first ring being the innermost ring and the fourth ring being the outermost ring relative to the common center. In this example, the height of the fourth ring may be the largest, the height of the third ring may be the second largest, the height of the second ring may be the third largest, and the height of the first ring (which may be a disk—not having a hole in the center) is the smallest. It should be appreciated that the number of permanent magnet rings in the first $B_0$ magnet is not limited to being four rings and may be any suitable number of rings (e.g., two, three, five, six, seven, eight, nine, ten, eleven, twelve, thirteen, fourteen, and fifteen).

In some embodiments, each of the permanent magnet rings may include multiple permanent segments. In some embodiments, multiple (e.g., all) of the segments of a particular permanent magnet ring may have the same height. In some embodiments, permanent magnet segments of a permanent magnet ring may include circular arc segments. In some embodiments, permanent magnet segments of a permanent magnet ring may include rectangular blocks. In some embodiments, permanent magnet segments of a permanent magnet ring may include trapezoidal blocks.

In some embodiments, the permanent magnet rings in the second $B_0$ magnet may be designed to have the same heights as the permanent magnet rings in the first $B_0$ magnet. In this way, each permanent magnet ring in the first $B_0$ magnet has a corresponding permanent magnet ring in the second $B_0$ magnet, and each pair of corresponding permanent magnet rings have permanent magnet segments of the same height.

In some embodiments, the first and second $B_0$ magnets contribute to the $B_0$ magnetic field for the MRI system, and the $B_0$ magnetic field has a field strength of less than or equal to approximately 0.2 T and greater than or equal to approximately 0.1 T.

In some embodiments, the first and second $B_0$ magnets contribute to the $B_0$ magnetic field for the MRI system, and the $B_0$ magnetic field has a field strength of less than or equal to approximately 0.1 T and greater than or equal to approximately 50 mT.

In some embodiments, the first and second $B_0$ magnets contribute to the $B_0$ magnetic field for the MRI system, and the $B_0$ magnetic field has a field strength of less than or equal to approximately 50 mT and greater than or equal to approximately 20 mT.

It should be appreciated that the techniques described herein may be implemented in any of numerous ways, as the techniques are not limited to any particular manner of implementation. Examples of details of implementation are provided herein solely for illustrative purposes. Furthermore, the techniques disclosed herein may be used individually or in any suitable combination, as aspects of the technology described herein are not limited to the use of any particular technique or combination of techniques.

FIG. 1 is a block diagram of typical components of a MRI system 100. In the illustrative example of FIG. 1, MRI system 100 comprises computing device 104, controller 106, pulse sequences store 108, power management system 110, and magnetics components 120. It should be appreciated that system 100 is illustrative and that a MRI system may have one or more other components of any suitable type in addition to or instead of the components illustrated in FIG. 1. However, a MRI system will generally include these high level components, though the implementation of these components for a particular MRI system may differ vastly.

As illustrated in FIG. 1, magnetics components 120 comprise $B_0$ magnet 122, shim coils 124, RF transmit and receive coils 126, and gradient coils 128. Magnet 122 may be used to generate the main magnetic field $B_0$. Magnet 122 may be any suitable type or combination of magnetics components that can generate a desired main magnetic $B_0$ field. As described above, in the high field regime, the $B_0$ magnet is typically formed using superconducting material generally provided in a solenoid geometry, requiring cryogenic cooling systems to keep the $B_0$ magnet in a superconducting state. Thus, high-field $B_0$ magnets are expensive, complicated and consume large amounts of power (e.g., cryogenic cooling systems require significant power to maintain the extremely low temperatures needed to keep the $B_0$ magnet in a superconducting state), require large dedicated spaces, and specialized, dedicated power connections (e.g., a dedicated three-phase power connection to the power grid). Conventional low-field $B_0$ magnets (e.g., $B_0$ magnets operating at 0.2 T) are also often implemented using superconducting material and therefore have these same general requirements. Other conventional low-field $B_0$ magnets are implemented using permanent magnets, which to produce the field strengths to which conventional low-field systems are limited (e.g., between 0.2 T and 0.3 T due to the inability to acquire useful images at lower field strengths), need to be very large magnets weighing 5-20 tons. Thus, the $B_0$ magnet of conventional MRI systems alone prevents both portability and affordability.

Gradient coils 128 may be arranged to provide gradient fields and, for example, may be arranged to generate gradients in the $B_0$ field in three substantially orthogonal directions (X, Y, Z). Gradient coils 128 may be configured to encode emitted MR signals by systematically varying the $B_0$ field (the $B_0$ field generated by magnet 122 and/or shim coils 124) to encode the spatial location of received MR signals as a function of frequency or phase. For example, gradient coils 128 may be configured to vary frequency or phase as a linear function of spatial location along a particular direction, although more complex spatial encoding profiles may also be provided by using nonlinear gradient coils. For example, a first gradient coil may be configured to selectively vary the $B_0$ field in a first (X) direction to perform frequency encoding in that direction, a second gradient coil may be configured to selectively vary the $B_0$ field in a second (Y) direction substantially orthogonal to the first direction to perform phase encoding, and a third gradient coil may be configured to selectively vary the $B_0$ field in a third (Z) direction substantially orthogonal to the first and second directions to enable slice selection for volumetric imaging applications. As described above, conventional gradient coils also consume significant power, typically operated by large, expensive gradient power sources.

MRI is performed by exciting and detecting emitted MR signals using transmit and receive coils, respectively (often referred to as radio frequency (RF) coils). Transmit/receive coils may include separate coils for transmitting and receiving, multiple coils for transmitting and/or receiving, or the same coils for transmitting and receiving. Thus, a transmit/receive component may include one or more coils for transmitting, one or more coils for receiving and/or one or more coils for transmitting and receiving. Transmit/receive coils are also often referred to as Tx/Rx or Tx/Rx coils to generically refer to the various configurations for the transmit and receive magnetics component of an MRI system. These terms are used interchangeably herein. In FIG. 1, RF transmit and receive coils 126 comprise one or more transmit coils that may be used to generate RF pulses to induce an oscillating magnetic field Bi. The transmit coil(s) may be configured to generate any suitable types of RF pulses.

Power management system 110 includes electronics to provide operating power to one or more components of the low-field MRI system 100. For example, power management system 110 may include one or more power supplies, gradient power components, transmit coil components, and/or any other suitable power electronics needed to provide suitable operating power to energize and operate components of MRI system 100. As illustrated in FIG. 1, power management system 110 comprises power supply 112, power component(s) 114, transmit/receive switch 116, and thermal management components 118 (e.g., cryogenic cooling equipment for superconducting magnets). Power supply 112 includes electronics to provide operating power to magnetic components 120 of the MRI system 100. For example, power supply 112 may include electronics to provide operating power to one or more $B_0$ coils (e.g., $B_0$ magnet 122) to produce the main magnetic field for the low-field MRI system. Transmit/receive switch 116 may be used to select whether RF transmit coils or RF receive coils are being operated.

Power component(s) 114 may include one or more RF receive (Rx) pre-amplifiers that amplify MR signals detected by one or more RF receive coils (e.g., coils 126), one or more RF transmit (Tx) power components configured to provide power to one or more RF transmit coils (e.g., coils 126), one or more gradient power components configured to provide power to one or more gradient coils (e.g., gradient coils 128), and one or more shim power components configured to provide power to one or more shim coils (e.g., shim coils 124).

In conventional MRI systems, the power components are large, expensive and consume significant power. Typically, the power electronics occupy a room separate from the MRI scanner itself. The power electronics not only require substantial space, but are expensive complex devices that consume substantial power and require wall mounted racks to be supported. Thus, the power electronics of conventional MRI systems also prevent portability and affordability of MRI.

As illustrated in FIG. 1, MRI system 100 includes controller 106 (also referred to as a console) having control electronics to send instructions to and receive information from power management system 110. Controller 106 may be configured to implement one or more pulse sequences, which are used to determine the instructions sent to power management system 110 to operate the magnetic components 120 in a desired sequence (e.g., parameters for operating the RF transmit and receive coils 126, parameters for operating gradient coils 128, etc.). As illustrated in FIG. 1, controller 106 also interacts with computing device 104 programmed to process received MR data. For example, computing device 104 may process received MR data to generate one or more MR images using any suitable image reconstruction process(es). Controller 106 may provide information about one or more pulse sequences to computing device 104 for the processing of data by the computing device. For example, controller 106 may provide information about one or more pulse sequences to computing device 104 and the computing device may perform an image reconstruction process based, at least in part, on the provided information. In conventional MRI systems, computing device 104 typically includes one or more high performance work-stations configured to perform computationally expensive processing on MR data relatively rapidly. Such computing devices are relatively expensive equipment on their own.

A further aspect of portability involves the power consumption of the MRI system. As also described above, current clinical MRI systems consume large amounts of power (e.g., ranging from 20 kW to 40 kW average power consumption during operation), thus requiring dedicated power connections (e.g., dedicated three-phase power connections to the grid capable of delivering the required power). The requirement of a dedicated power connection is a further obstacle to operating an MRI system in a variety of locations other than expensive dedicated rooms specially fitted with the appropriate power connections. The inventors have developed low power MRI systems capable of operating using mains electricity such as a standard wall outlet (e.g., 120V/20 A connection in the U.S.) or common large appliance outlets (e.g., 220-240V/30 A), allowing the device to be operated anywhere common power outlets are provided. The ability to "plug into the wall" facilitates both portable/transportable MRI as well as fixed MRI system installations without requiring special, dedicated power such as a three-phase power connection.

Figure 12A:
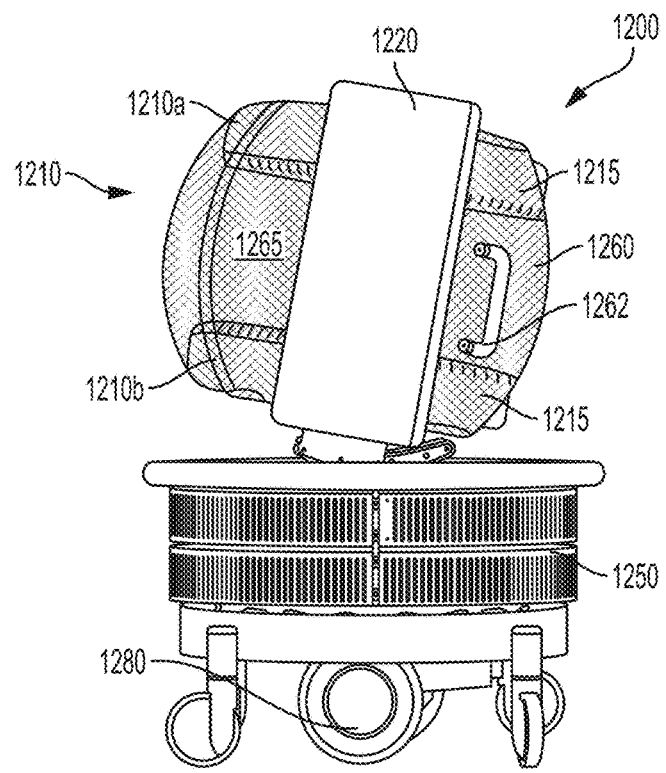
FIGS. 12A and 12B illustrate views of a portable MRI system, in accordance with some embodiments of the technology described herein.
Figure 12B:
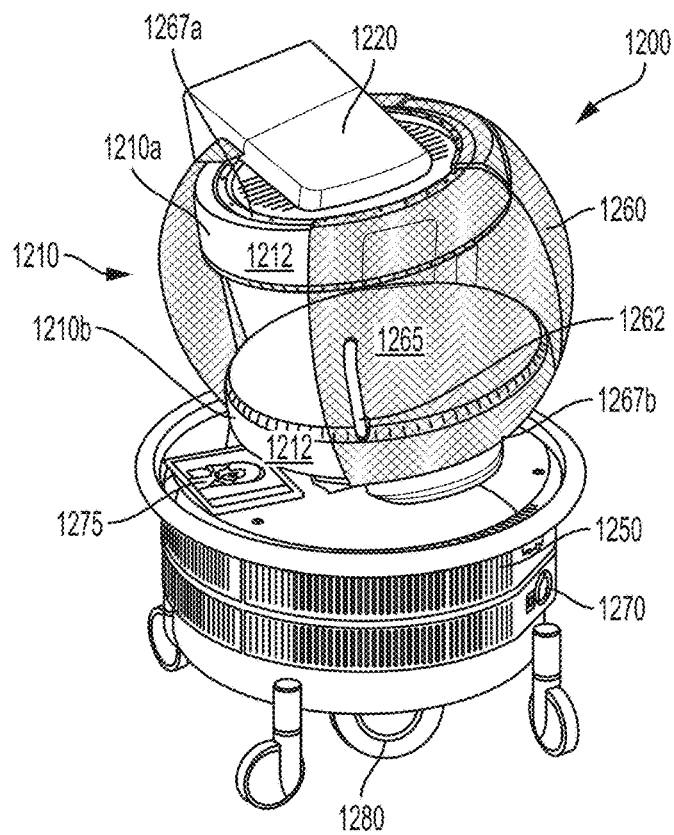

According to some embodiments, a portable MRI system (e.g., any of the portable MRI systems illustrated in FIGS. 10, 12 and 13 below) is configured to operate using mains electricity (e.g., single-phase electricity provided at standard wall outlets) via a power connection 1270 (see e.g., FIG. 12B). According to some embodiments, a portable MRI system comprises a power connection configured to connect to a single-phase outlet providing approximately between 110 and 120 volts and rated at 15, 20 or 30 amperes, and wherein the power system is capable of providing the power to operate the portable MRI system from power provided by the single-phase outlet. According to some embodiments, a portable MRI system comprises a power connection configured to connect to a single-phase outlet providing approximately between 220 and 240 volts and rated at 15, 20 or 30 amperes, and wherein the power system is capable of providing the power to operate the magnetic resonance imaging system from power provided by the single-phase outlet. According to some embodiments, a portable MRI system is configured using the low power techniques described herein to use an average of less than 3 kilowatts during image acquisition. According to some embodiments, a portable MRI system is configured using the low power techniques described herein to use an average of less than 2 kilowatts during image acquisition. According to some embodiments, a portable MRI system is configured using the low power techniques described herein to use an average of less than 1 kilowatt during image acquisition. For example, a low power MRI system employing a permanent $B_0$ magnet and low power components described herein may operate at 1 kilowatt or less, such as at 750 watts or less.

As described above, a significant contributor to the size, cost and power consumption of conventional MRI systems are the power electronics for powering the magnetics components of the MRI system. The power electronics for conventional MRI systems often require a separate room, are expensive and consume significant power to operate the corresponding magnetics components. In particular, the gradient coils and thermal management systems utilized to cool the gradient coils alone generally require dedicated power connections and prohibit operation from standard wall outlets. The inventors have developed low power, low noise gradient power sources capable of powering the gradient coils of an MRI system that can, in accordance with some embodiments, be housed in the same portable, cartable or otherwise transportable apparatus as the magnetics components of the MRI system. According to some embodiments, the power electronics for powering the gradient coils of an MRI system consume less than 50 W when the system is idle and between 100-200 W when the MRI system is operating (i.e., during image acquisition). The inventors have developed power electronics (e.g., low power, low noise power electronics) to operate a portable low field MRI system that all fit within the footprint of the portable MRI scanner. According to some embodiments, innovative mechanical design has enabled the development of an MRI scanner that is maneuverable within the confines of a variety of clinical environments in which the system is needed.

At the core of developing a low power, low cost and/or portable MRI system is the reduction of the field strength of the $B_0$ magnet, which can facilitate a reduction in size, weight, expense and power consumption. However, as described above, reducing the field strength has a corresponding and significant reduction in SNR. This significant reduction in SNR has prevented clinical MRI systems from reducing the field strength below the current floor of approximately 0.2 T, which systems remain large, heavy, expensive fixed installations requiring specialized and dedicated spaces. While some systems have been developed that operate between 0.1 T and 0.2 T, these systems are often specialized devices for scanning extremities such as the hand, arm or knee. The inventors have developed MRI systems operating in the low-field and very-low field capable of acquiring clinically useful images. Some embodiments include highly efficient pulse sequences that facilitate acquiring clinically useful images at lower field strengths than previously achievable. The signal to noise ratio of the MR signal is related to the strength of the main magnetic field $B_0$, and is one of the primary factors driving clinical systems to operate in the high-field regime. Pulse sequences developed by the inventors that facilitate acquisition of clinically useful images are described in U.S. Patent Application Pub. No. US 2016/0131727, filed Nov. 11, 2015 and titled "Pulse Sequences for Low Field Magnetic Resonance," which is herein incorporated by reference in its entirety.

Further techniques developed by the inventors to address the low SNR of low field strength include optimizing the configuration of radio frequency (RF) transmit and/or receive coils to improve the ability of the RF transmit/ receive coils to transmit magnetic fields and detect emitted MR signals. The inventors have appreciated that the low transmit frequencies in the low field regime allow for RF coil designs not possible at higher fields strengths and have developed RF coils with improved sensitivity, thereby increasing the SNR of the MRI system. Exemplary RF coil designs and optimization techniques developed by the inventors are described in U.S. Patent Application Pub. No. 2016/0334479, filed May 12, 2016 and titled "Radio Frequency Coil Methods and Apparatus," which is herein incorporated by reference in its entirety.

A significant contributor to the high cost, size, weight and power consumption of high-field MRI is the $B_0$ magnet itself along with the apparatus required to power the $B_0$ magnet and to perform thermal management thereof. In particular, to produce the field strengths characteristic of high-field MRI, the $B_0$ magnet is typically implemented as an electromagnet configured in a solenoid geometry using superconducting wires that need a cryogenic cooling system to keep the wires in a superconducting state. Not only is the superconducting material itself expensive, but the cryogenic equipment to maintain the superconducting state is also expensive and complex.

The inventors have recognized that the low-field context allows for $B_0$ magnet designs not feasible in the high-field regime. For example, due at least in part to the lower field strengths, superconducting material and the corresponding cryogenic cooling systems can be eliminated. Due in part to the low-field strengths, $B_0$ electromagnets constructed using non-superconducting material (e.g., copper) may be employed in the low-field regime. However, such electromagnets still may consume relatively large amounts of power during operation. For example, operating an electromagnet using a copper conductor to generate a magnetic field of 0.2 T or more requires a dedicated or specialized power connection (e.g., a dedicated three-phase power connection). The inventors have developed MRI systems that can be operated using mains electricity (i.e., standard wall power), allowing the MRI system to be powered at any location having common power connection, such as a standard wall outlet (e.g., 120V/20 A connection in the U.S.) or common large appliance outlets (e.g., 220-240V/30 A). Thus, a low-power MRI system facilitates portability and availability, allowing an MRI system to be operated at locations where it is needed (e.g., the MRI system can be brought to the patient instead of vice versa). In addition, operating from standard wall power eliminates the electronics conventionally needed to convert three-phase power to single-phase power and to smooth out the power provided directly from the grid. Instead, wall power can be directly converted to DC and distributed to power the components of the MRI system.

The primary contributor to the overall power consumption of a low-field MRI system employing a $B_0$ magnet such as an electromagnet is the electromagnet. For example, the electromagnet may consume 80% or more of the power of the overall MRI system. To significantly reduce the power requirements of the MRI system, the inventors have developed $B_0$ magnets that utilize permanent magnets to produce and/or contribute to the $B_0$ electromagnetic field. According to some embodiments, $B_0$ electromagnets are replaced with permanent magnets as the main source of the $B_0$ electromagnetic field. A permanent magnet refers to any object or material that maintains its own persistent magnetic field once magnetized. Materials that can be magnetized to produce a permanent magnet are referred to herein as ferromagnetic and include, as non-limiting examples, iron, nickel, cobalt, neodymium (NdFeB) alloys, samarium cobalt (SmCo) alloys, alnico (AlNiCo) alloys, strontium ferrite, barium ferrite, etc. Permanent magnet material (e.g., magnetizable material that has been driven to saturation by a magnetizing field) retains its magnetic field when the driving field is removed. The amount of magnetization retained by a particular material is referred to as the material's remanence. Thus, once magnetized, a permanent magnet generates a magnetic field corresponding to its remanence, eliminating the need for a power source to produce the magnetic field.

The weight of the $B_0$ magnet is a significant portion of the overall weight of the MRI system which, in turn, impacts the portability of the MRI system. In embodiments that primarily use low carbon and/or silicon steel for the yoke and shimming components, an exemplary $B_0$ magnet may weigh approximately 550 kilograms. According to some embodiments, cobalt steel (CoFe) may be used as the primary material for the yoke (and possibly the shim components), potentially reducing the weight of $B_0$ magnet 200 to approximately 450 Kilograms. However, CoFe is generally more expensive than, for example, low carbon steel, driving up the cost of the system. Accordingly, in some embodiments, select components may be formed using CoFe to balance the tradeoff between cost and weight arising from its use. Using such exemplary $B_0$ magnets a portable, cartable or otherwise transportable MRI system may be constructed, for example, by integrating the $B_0$ magnet within a housing, frame or other body to which castors, wheels or other means of locomotion can be attached to allow the MRI system to be transported to desired locations (e.g., by manually pushing the MRI system and/or including motorized assistance). As a result, an MRI system can be brought to the location in which it is needed, increasing its availability and use as a clinical instrument and making available MRI applications that were previously not possible. According to some embodiments, the total weight of a portable MRI system is less than 1,500 pounds and, preferably, less than 1000 pounds to facilitate maneuverability of the MRI system.

FIG. 2 illustrates a $B_0$ magnet 200, in accordance with some embodiments. In particular, $B_0$ magnet 200 is formed by permanent magnets 210a and 210b arranged in a bi-planar geometry with a yoke 220 coupled thereto to capture electromagnetic flux produced by the permanent magnets and transfer the flux to the opposing permanent magnet to increase the flux density between permanent magnets 210a and 210b. Each of permanent magnets 210a and 210b are formed from a plurality of concentric permanent magnets, as shown by permanent magnet 210b comprising an outer ring of permanent magnets 214a, a middle ring of permanent magnets 214b, an inner ring of permanent magnets 214c, and a permanent magnet disk 214d at the center. Permanent magnet 210a may comprise the same set of permanent magnet elements as permanent magnet 210b. The permanent magnet material used may be selected depending on the design requirements of the system (e.g., NdFeB, SmCo, etc. depending on the properties desired).

The permanent magnet material used may be selected depending on the design requirements of the system. For example, according to some embodiments, the permanent magnets (or some portion thereof) may be made of NdFeB, which produces a magnetic field with a relatively high magnetic field per unit volume of material once magnetized. According to some embodiments, SmCo material is used to form the permanent magnets, or some portion thereof. While NdFeB produces higher field strengths (and in general is less expensive than SmCo), SmCo exhibits less thermal drift and thus provides a more stable magnetic field in the face of temperature fluctuations. Other types of permanent magnet material(s) may be used as well, as the aspects are not limited in this respect. In general, the type or types of permanent magnet material utilized will depend, at least in part, on the field strength, temperature stability, weight, cost and/or ease of use requirements of a given $B_0$ magnet implementation.

The permanent magnet rings are sized and arranged to produce a homogenous field of a desired strength in the central region (field of view) between permanent magnets 210a and 210b. In the exemplary embodiment illustrated in FIG. 2, each permanent magnet ring comprises a plurality of blocks of ferromagnetic material to form the respective ring. The blocks forming each ring may be dimensioned and arranged to produce a desired magnetic field. The inventors have recognized that the blocks may be dimensioned in a number of ways to decrease cost, reduce weight and/or improve the homogeneity of the magnetic field produced, as described herein in connection with the exemplary rings that together form permanent magnets of a $B_0$ magnet, in accordance with some embodiments.

$B_0$ magnet 200 further comprises yoke 220 configured and arranged to capture magnetic flux generated by permanent magnets 210a and 210b and direct it to the opposing side of the $B_0$ magnet to increase the flux density in between permanent magnets 210a and 210b, increasing the field strength within the field of view of the $B_0$ magnet. By capturing magnetic flux and directing it to the region between permanent magnets 210a and 210b, less permanent magnet material can be used to achieve a desired field strength, thus reducing the size, weight and cost of the $B_0$ magnet. Alternatively, for given permanent magnets, the field strength can be increased, thus improving the SNR of the system without having to use increased amounts of permanent magnet material. For exemplary $B_0$ magnet 200, yoke 220 comprises a frame 222 and plates 224a and 224b. In a manner similar to that described above in connection with yoke 220, plates 324a and 324b capture magnetic flux generated by permanent magnets 210a and 210b and direct it to frame 222 to be circulated via the magnetic return path of the yoke to increase the flux density in the field of view of the $B_0$ magnet. Yoke 220 may be constructed of any desired ferromagnetic material, for example, low carbon steel, CoFe and/or silicon steel, etc. to provide the desired magnetic properties for the yoke. According to some embodiments, plates 224a and 224b (and/or frame 222 or portions thereof) may be constructed of silicon steel or the like in areas where the gradient coils could most prevalently induce eddy currents.

Exemplary frame 222 comprises arms 223a and 223b that attach to plates 224a and 224b, respectively, and supports 225a and 225b providing the magnetic return path for the flux generated by the permanent magnets. The arms are generally designed to reduce the amount of material needed to support the permanent magnets while providing sufficient cross-section for the return path for the magnetic flux generated by the permanent magnets. Arms 223a and 223b have two supports within a magnetic return path for the $B_0$ field produced by the $B_0$ magnet. Supports 225a and 225b are produced with a gap 227 formed between, providing a measure of stability to the frame and/or lightness to the structure while providing sufficient cross-section for the magnetic flux generated by the permanent magnets. For example, the cross-section needed for the return path of the magnetic flux can be divided between the two support structures, thus providing a sufficient return path while increasing the structural integrity of the frame. It should be appreciated that additional supports may be added to the structure, as the technique is not limited for use with only two supports and any particular number of multiple support structures.

Figure 3:
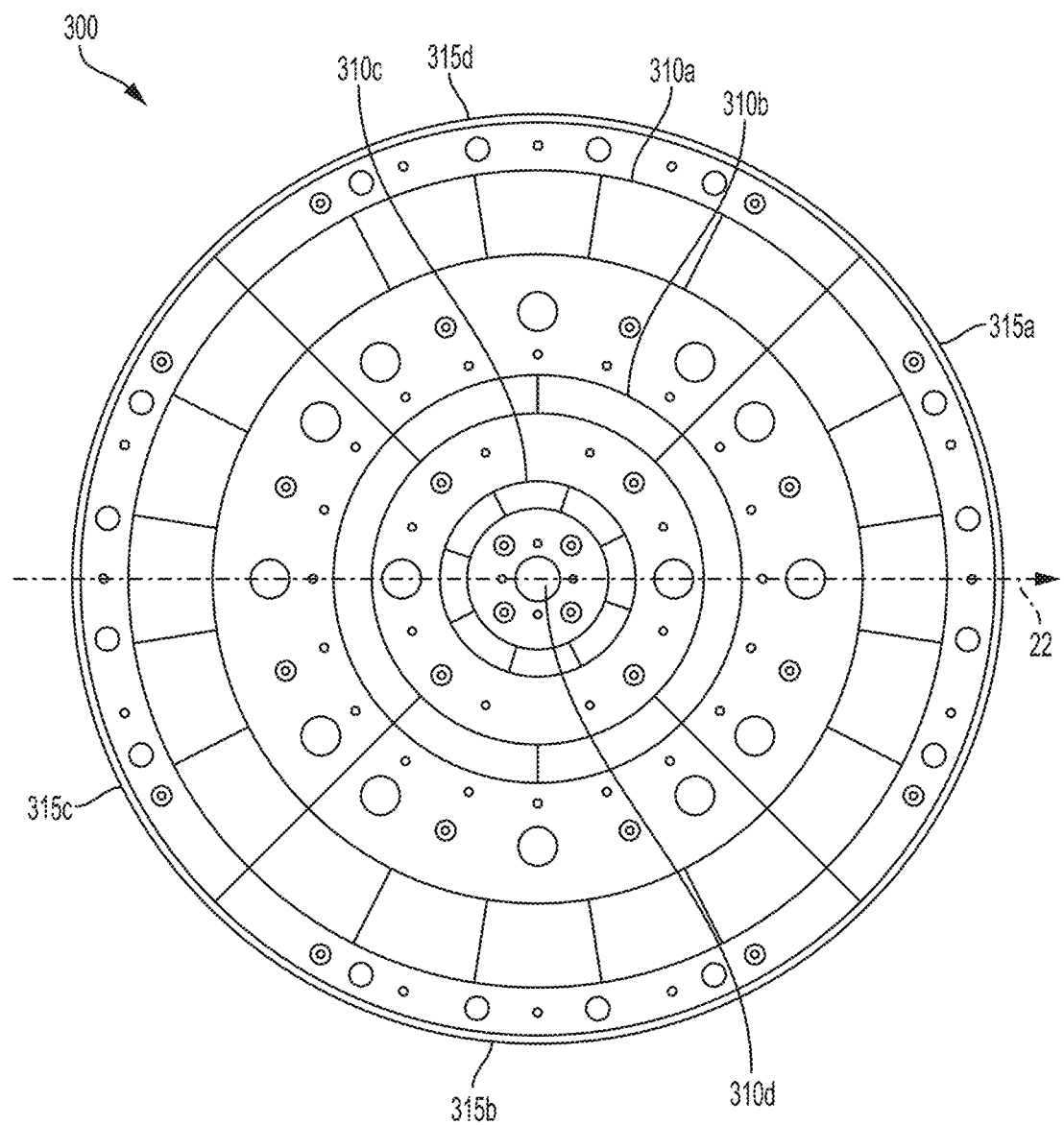
FIG. 3 illustrates a top view of an exemplary configuration of permanent magnet rings forming, in part, the $B_0$ magnet illustrated in FIG. 2, in accordance with some embodiments of the technology described herein.

FIG. 3 illustrates a top-down view of a permanent magnet 310, which may, for example, be used as the design for permanent magnets 210a and 210b of $B_0$ magnet 200 illustrated in FIG. 2. Permanent magnet 310 comprises concentric rings 310a, 310b, and 310c, each constructed of a plurality of stacks of ferromagnetic blocks, and a ferromagnetic disk 310d at the center. The direction of the frame of the yoke to which permanent magnet is attached is indicated by arrow 22. In embodiments in which the yoke is not symmetric (e.g., yoke 220), the yoke will cause the magnetic field produced by the permanent magnets for which it captures and focuses magnetic flux to be asymmetric as well, negatively impacting the uniformity of the $B_0$ magnetic field.

According to some embodiments, the block dimensions are varied to compensate for the effects of the yoke on the magnetic field produced by the permanent magnet. For example, dimensions of blocks in the four regions 315a, 315b, 315c and 315d labeled in FIG. 3 may be varied depending on which region the respective block is located. In particular, the height of the blocks (e.g., the dimension of the block normal to the plane of the circular magnet 310) may be greater in region 315c farthest away from the frame than corresponding blocks in region 315a closest to the frame. Block height can be varied in one or more rings or portions thereof, as the technique of compensating for the effects of the yoke are not limited to varying any particular block, set of blocks and/or any particular dimension. One example of varying block dimension to compensate for yoke effects are described in further detail below. According to some embodiments, the heights of blocks are varied depending on the permanent magnet ring in which the block is located. For example, the heights of the blocks in each ring may be varied so that each permanent magnet ring has a different height. The inventors have appreciated that by doing so, the field of view may be increased (i.e., the MRI device may be configured with a larger imaging region). One example of varying the heights of the permanent magnet rings is described in further detail in connection with FIGS. 5-7 below.

According to some embodiments, the material used for portions of yoke 220 (i.e., frame 222 and/or plates 224a, 224b) is steel, for example, a low-carbon steel, silicon steel, cobalt steel, etc. According to some embodiments, gradient coils (not shown in FIGS. 2, 3) of the MRI system are arranged in relatively close proximity to plates 224a, 224b inducing eddy currents in the plates. To mitigate, plates 224a, 224b and/or frame 222 may be constructed of silicon steel, which is generally more resistant to eddy current production than, for example, low-carbon steel. It should be appreciated that yoke 220 may be constructed using any ferromagnetic material with sufficient magnetic permeability and the individual parts (e.g., frame 222 and plates 224a, 224b) may be constructed of the same or different ferromagnetic material, as the techniques of increasing flux density is not limited for use with any particular type of material or combination of materials. Furthermore, it should be appreciated that yoke 220 can be formed using different geometries and arrangements.

It should be appreciated that the yoke 220 may be made of any suitable material and may be dimensioned to provide desired magnetic flux capture while satisfying other design constraints such as weight, cost, magnetic properties, etc. As an example, the frame of the yoke (e.g., frame 222) may be formed of a low-carbon steel of less than 0.2% carbon or silicon steel, with the long beam(s) having a length of approximately 38 inches, a width of approximately 8 inches, and a thickness (depth) of approximately 2 inches, and the short beam(s) having a length of approximately 19 inches, a width of approximately 8 inches and a thickness (depth) of approximately 2 inches. The plates (e.g., plates 224a and 224b) may be formed from a low-carbon steel of less than 0.2% carbon or silicon steel and have a diameter of approximately 30-35 inches (e.g., approximately 32 inches). However, the above provided dimensions and materials are merely exemplary of a suitable embodiment of a yoke that can be used to capture magnetic flux generated by an electromagnet.

It should be appreciated that the permanent magnet illustrated in FIG. 2 can be manufactured using any number and arrangement of permanent magnet blocks and are not limited to the number, arrangement, dimensions or materials illustrated herein. The configuration of the permanent magnets will depend, at least in part, on the design characteristics of the $B_0$ magnet, including, but not limited to, the field strength, field of view, portability and/or cost desired for the MRI system in which the $B_0$ magnet is intended to operate. For example, the permanent magnet blocks may be dimensioned to produce a magnetic field ranging from 20 mT to 0.1 T, depending on the field strength desired. However, it should be appreciated that other low-field strengths (e.g., up to approximately 0.2 T) may be produced by increasing the dimensions of the permanent magnet, though such increases will also increase the size, weight and cost of the $B_0$ magnet.

In some embodiments, the height or depth of the blocks used in the different quadrants may be varied to compensate for effects on the $B_0$ magnetic field resulting from an asymmetric yoke. For example, in the configuration illustrated in FIG. 2, the position of frame 222 (in particular, legs 225a and 225b) to the permanent magnets 210a and 210b results in magnetic flux being drawn away from regions proximate the frame (e.g., quadrant 215a), reducing the flux density in these regions. To address the resulting non-uniformity in the magnetic field, the height or depth of the blocks in affected regions may be varied (e.g., increased) to generate additional magnetic flux to compensate for the reduction in magnetic flux density caused by the yoke, thereby improving the homogeneity of the $B_0$ magnetic field within the field of view of the $B_0$ magnet.

The inventors have appreciated that the arrangement, dimensions and materials used for the permanent magnet blocks may be chosen to minimize the Lorentz forces produced by the $B_0$ coil during operation of the gradient coils. This technique can be used to reduce vibration and acoustic noise during the operation of the MRI system. According to some embodiments, the design of the permanent magnet blocks are chosen to reduce magnetic field components perpendicular to the $B_0$ field, i.e., parallel to the plane of the gradient coils. According to some embodiments, the outer ring of permanent magnet blocks are designed to reduce the magnetic field components responsible for vibration of the gradient coils during operation in areas outside the field of view of the MRI system, thereby reducing vibration and acoustic noise generated during operation of the MRI system.

As described herein, in some embodiments, a permanent $B_0$ magnet may be formed by a pair of permanent magnets in a bi-planar geometry, so that an imaging region is formed there between, and a yoke that captures electromagnetic flux produced by the pair of permanent magnets and directs it to increase the magnetic flux density within the imaging region. Each of the pair of permanent magnets may include multiple concentric permanent magnet rings.

Figure 4A:
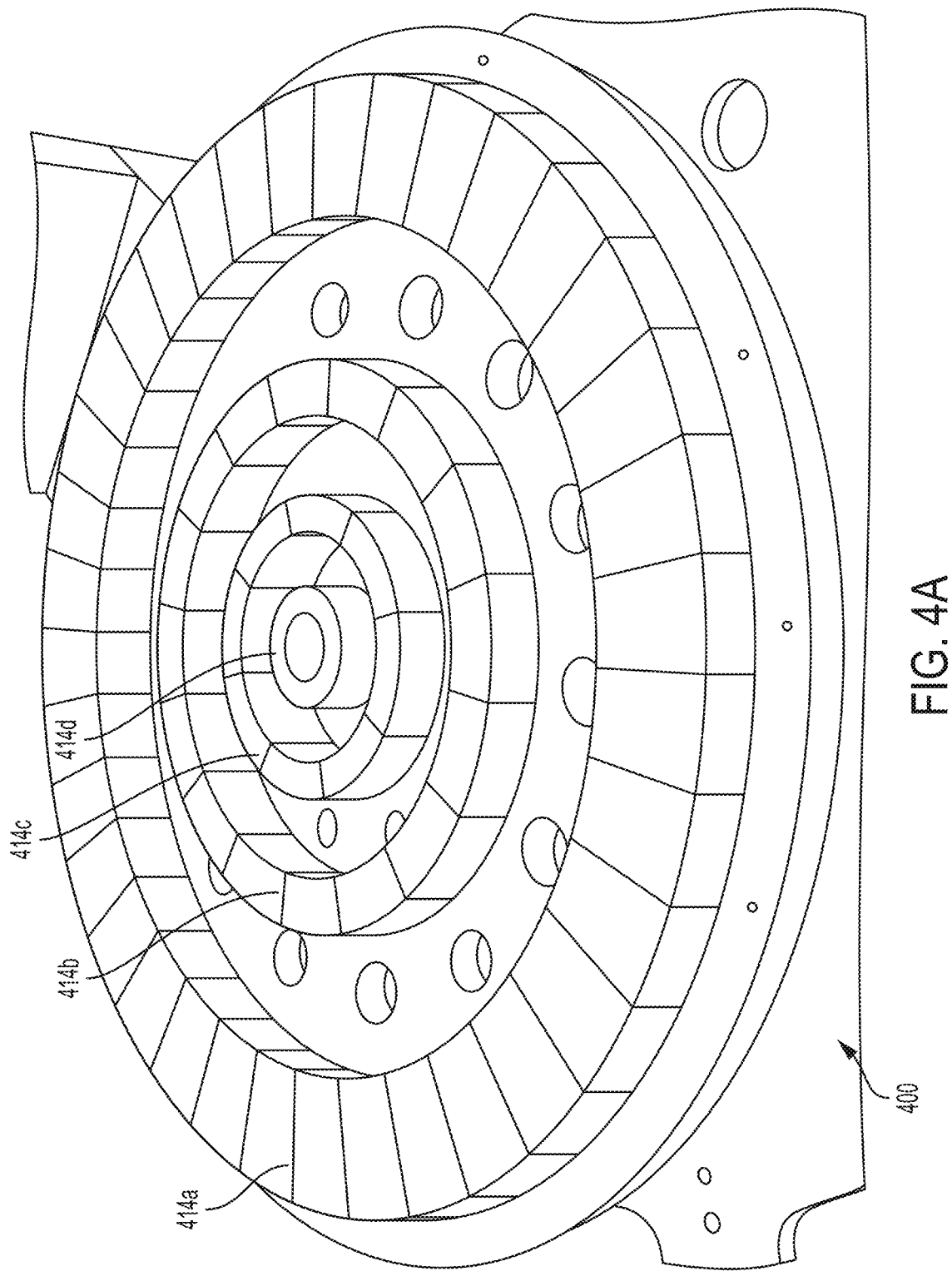
FIG. 4A illustrates a permanent $B_0$ magnet having a plurality of permanent magnet rings having uniform heights, in accordance with some embodiments of the technology described herein.
Figure 4B:
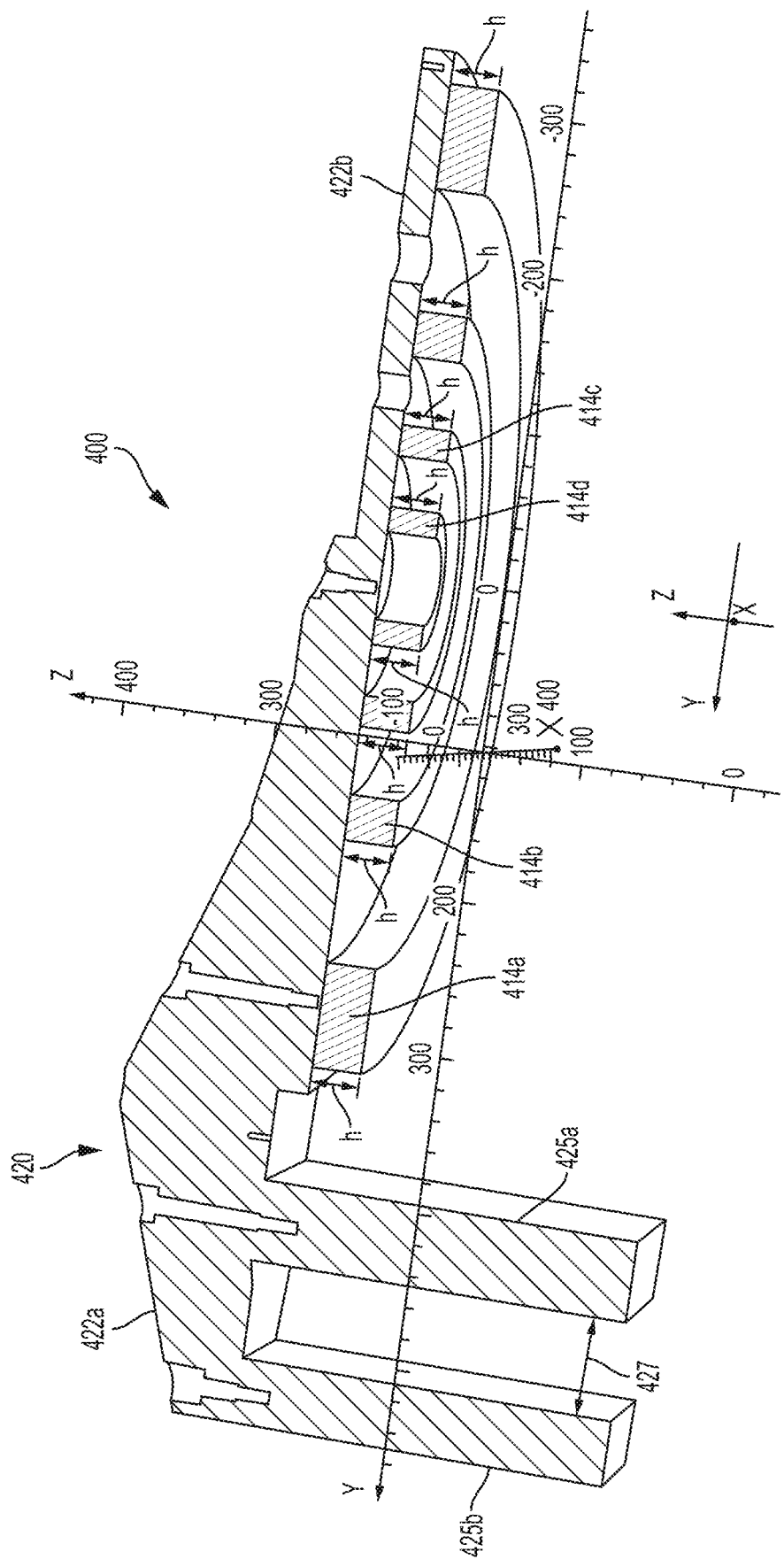
FIG. 4B illustrates a cross-section side view of a permanent $B_0$ magnet and yoke, the B0 magnet having a plurality of permanent magnet rings having uniform heights, in accordance with some embodiments of the technology described herein.

In some embodiments, the heights of the permanent magnet rings on each of the permanent magnets may be uniform—with each permanent magnet ring having the same (or substantially the same) height as the other permanent magnet rings. For example, FIG. 4A illustrates a permanent $B_0$ magnet 400 comprising a plurality of permanent magnet rings 414a, 414b, 414c, and 414d. As shown in FIG. 4B, the heights of the permanent rings 414a, 414b, 414c and 414d are the same—each of the permanent magnet rings 414a-d has the same height of "h." The flux produced by the permanent magnet rings may be directed by the yoke 420, which includes frame 422a, supports 425a and 425b separated by a gap 427, and plate 422b to which the permanent rings 414a-d are attached. In this illustrative example, the height of the permanent magnet rings is measured in a direction orthogonal to the plane parallel to the plate 422b (indicated by axis "Z" in the axes shown in FIG. 4B).

Figure 5:
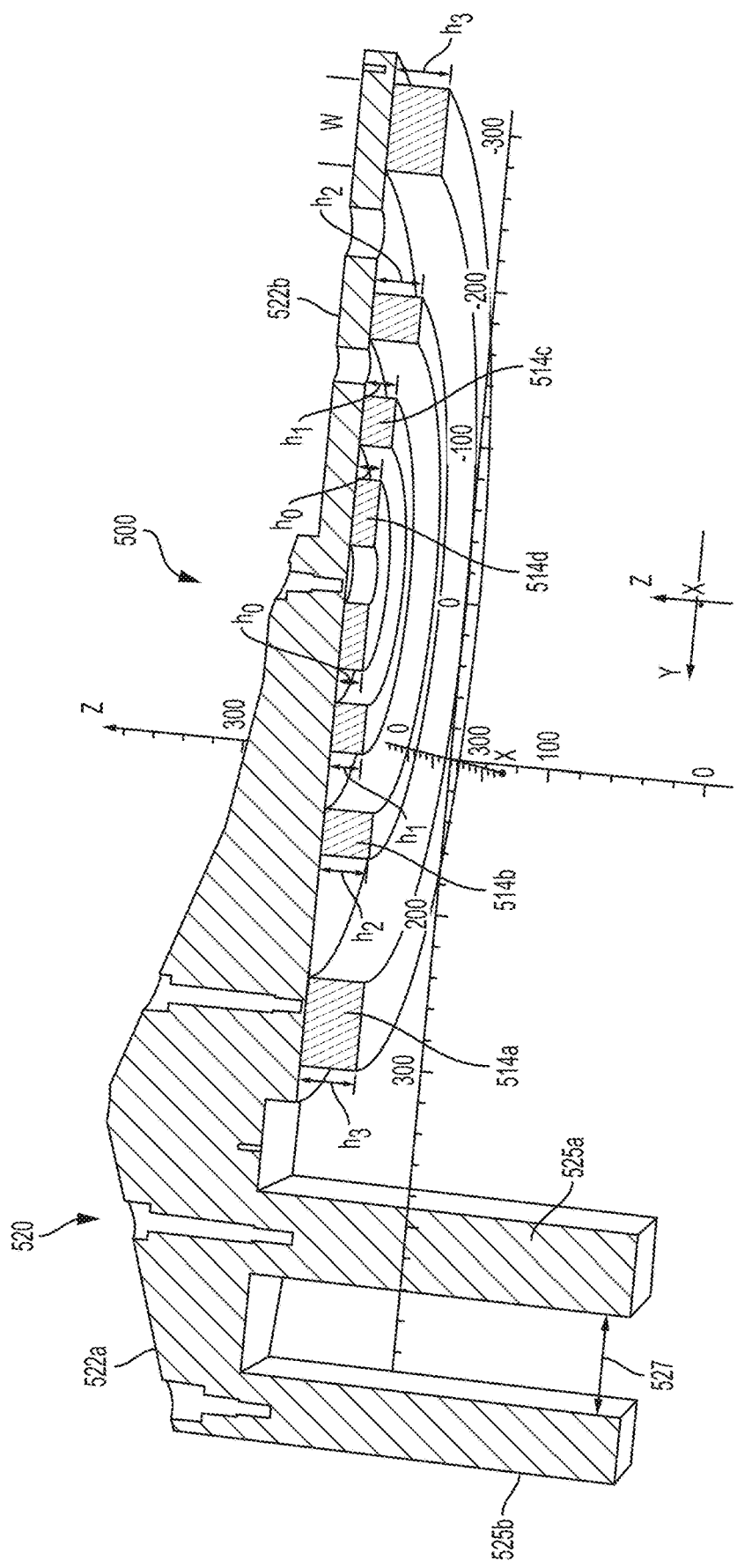
FIG. 5 illustrates a cross-section side view of a permanent $B_0$ magnet and yoke, wherein heights of the permanent magnet rings forming the permanent $B_0$ magnet are varied, in accordance with some embodiments of the technology described herein.

FIG. 5 illustrates a cross-section side view of a permanent $B_0$ magnet and yoke, with the heights of the permanent magnet rings forming the permanent $B_0$ magnet being varied, in accordance with some embodiments of the technology described herein. Unlike the illustration in FIG. 4B, the permanent magnet rings of the permanent $B_0$ magnet 500 shown in FIG. 5 have different respective heights.

Specifically, in the embodiment illustrated in FIG. 5, the permanent $B_0$ magnet 500 includes four permanent magnet rings 514a, 514b, 514c, and 514d. As shown in FIG. 5, permanent magnet ring 514a has a height of $h_3$, permanent magnet ring 514b has a height of $h_2$, permanent magnet ring 514c has a height of $h_1$ and permanent magnet ring 514d has a height of $h_0$. In the exemplary embodiment illustrated in FIG. 5, the heights of the permanent magnet rings are the smallest at the center (e.g., height $h_0$ of permanent magnet ring 514d is smallest), with height increasing for each radially subsequent permanent magnet ring of the $B_0$ magnet. The flux produced by the permanent magnet rings may be directed by the yoke 520, which includes frame 522a, supports 525a and 525b separated by a gap 527, and plate 522b to which the permanent rings 514a-d are attached. In this illustrative example, the height of the permanent magnet rings is measured in a direction orthogonal to the plane parallel to the plate 522b (indicated by axis "Z" in the axes shown in FIG. 4B).

As described above, the heights h0, h1, h2, and h3 may differ from one another by at least a threshold percentage and, for example, may differ from one another by at least 1%, 5%, 10%, by at least 15%, by at least 20%, by at least 25%, by at least 50%, or by any other suitable amount in the range of 1-100%. For example, as shown in FIGS. 7A-L, a permanent magnet may include four rings having heights of 22 mm, 26 mm, 30 mm, and 34 mm, respectively.

In the illustrative embodiment of FIG. 5, each of the permanent magnet rings 514a-d may be composed of multiple permanent magnet segments. In some embodiments, each of one or more (e.g., all) of permanent magnet rings 514a-d may be composed of circular arc permanent magnet segments. In some embodiments, each of one or more (e.g., all) of permanent magnet rings 514a-d may be composed of rectangular permanent magnet blocks.

Although in the illustrative embodiment of FIG. 5, the heights of the rings increase with each ring's radius, it should be appreciated that other configurations may be used and the heights of the permanent magnet rings may be varied in different ways, as the aspects of the technology described herein are not limited in this respect. For example, in some embodiments, at least two of the rings may have the same height while at least two of the permanent magnet rings may have different respective heights. Furthermore, the width of each permanent magnet ring (see e.g., the width w labeled in FIG. 5) may be varied as well to achieve a $B_0$ magnetic field of a desired field strength, homogeneity and/or field of view. Also, although four permanent magnet rings are illustrated in FIG. 5, a permanent $B_0$ magnet may have any other suitable number of permanent magnet rings (e.g., any number in the range of 2-15 rings), as aspects of the technology described herein are not limited in this respect.

FIGS. 6A, 6B, and 6C illustrate a cross-section side view, a top view, and an isometric view of an illustrative permanent $B_0$ magnet 600, respectively, in accordance with some embodiments of the technology described herein. As shown in FIG. 6B, permanent magnet 600 includes four permanent magnet rings 602, 604, 606, and 608 concentric about a common center 605. Ring 602 is the innermost permanent magnet ring. Ring 604 is the second closest permanent magnet ring to the common center. Ring 606 is the third closest permanent magnet ring to the common center. Ring 608 is the outermost permanent magnet ring. Although permanent magnet ring 602 has a center hole, in other embodiments, permanent magnet ring 602 could be replaced by a solid disk without a center hole.

FIGS. 7A-L illustrate each of the permanent magnet rings 602, 604, 606, and 608 in greater detail. Example dimensions are provided for each of these permanent magnet rings. It should be appreciated that these dimensions are non-limiting examples, as permanent magnet rings may have dimensions other than those illustrated in FIGS. 7A-L.

FIGS. 7A, 7B, and 7C respectively illustrate a cross-section side view, a top view, and an isometric view of the innermost ring 602 of the four-ring permanent $B_0$ magnet shown in FIGS. 6A-C, in accordance with some embodiments of the technology described herein. As shown in FIG. 7B, permanent magnet ring 602 has an inner diameter of 44.6 mm and an outer diameter of 93.40 mm, which implies a width of 48.8 mm. As shown in FIG. 7A, permanent magnet ring 602 has a height of 22 mm.

Figure 7F:
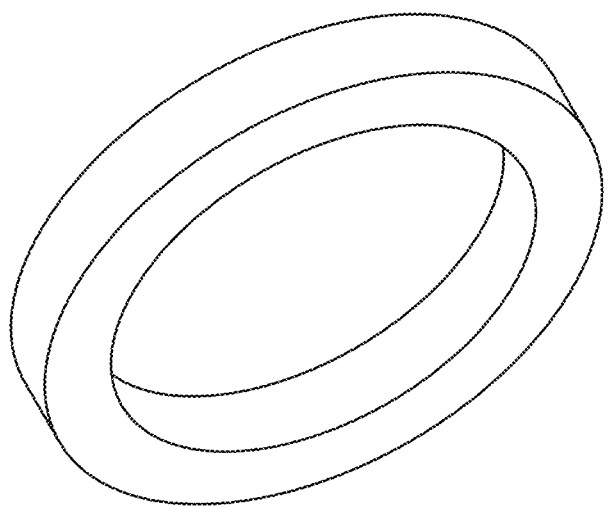
FIGS. 7D-F respectively illustrate a cross-section side view, a top view, and an isometric view of a ring second closest to the center of the four-ring permanent $B_0$ magnet shown in FIGS. 6A-C, in accordance with some embodiments of the technology described herein.
Figure 7E:
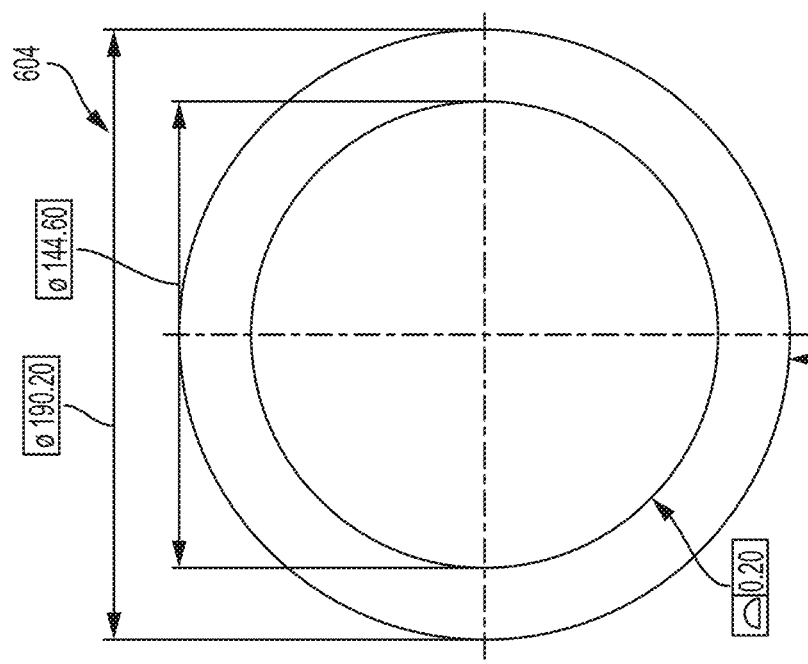
Figure 7D:
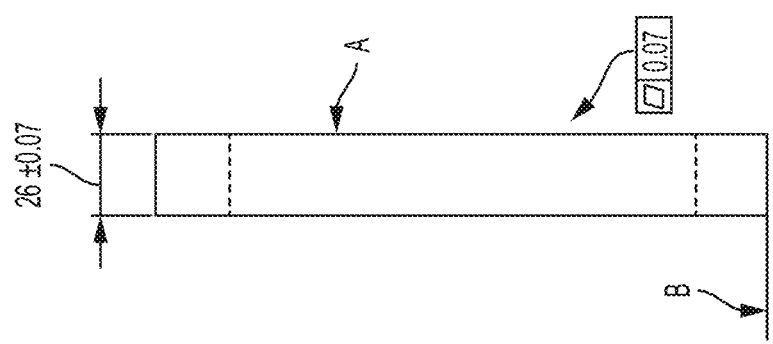

FIGS. 7D, 7E, and 7F respectively illustrate a cross-section side view, a top view, and an isometric view of permanent magnet ring 604 of the four-ring permanent $B_0$ magnet 600 shown in FIGS. 6A-C, in accordance with some embodiments of the technology described herein. As shown in FIG. 7E, permanent magnet 604 has an inner diameter of 144.6 mm and an outer diameter of 190.2 mm, which implies a width of 45.6 mm. As shown in FIG. 7D, permanent magnet ring 604 has a height of 26 mm.

Figure 7I:
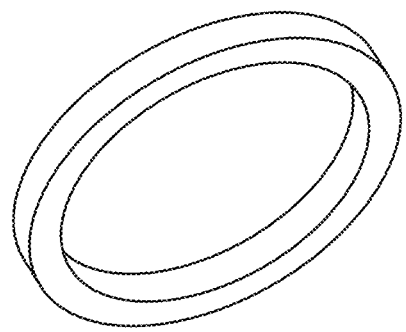
FIGS. 7G-I respectively illustrate a cross-section side view, a top view, and an isometric view of a ring third closest to the center of the four-ring permanent $B_0$ magnet shown in FIGS. 6A-C, in accordance with some embodiments of the technology described herein.
Figure 7H:
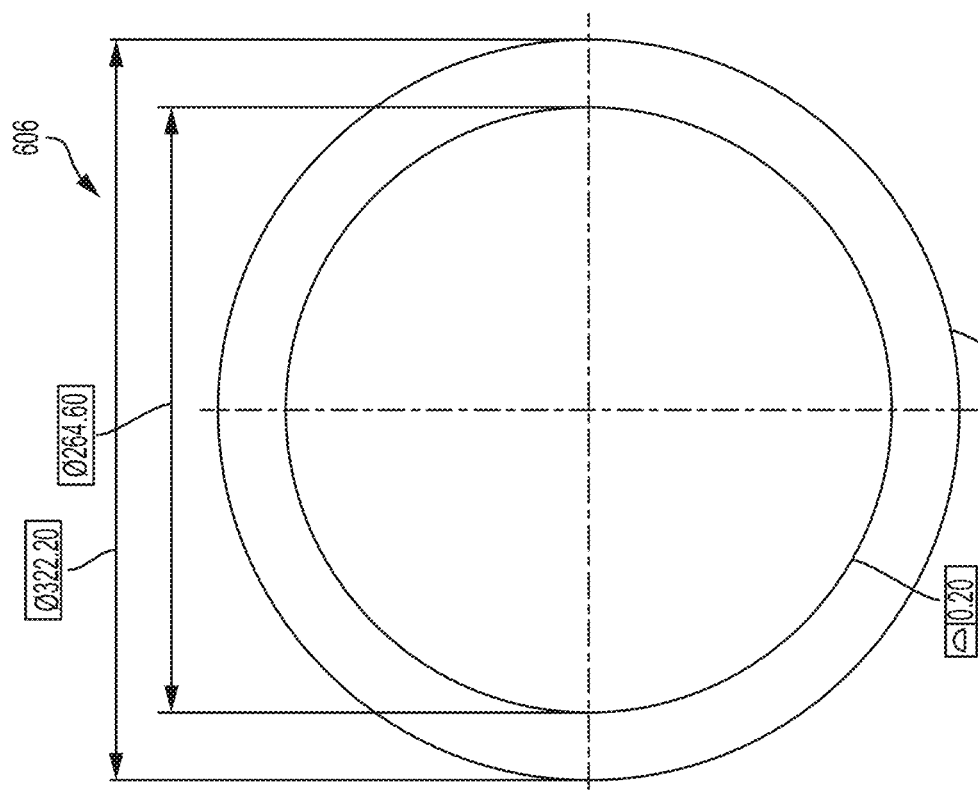
Figure 7G:
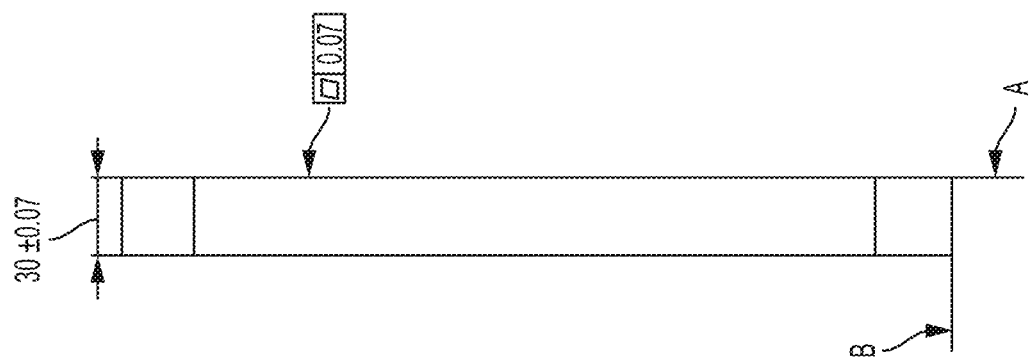

FIGS. 7G, 7H, and 7I respectively illustrate a cross-section side view, a top view, and an isometric view of permanent magnet ring 606 of the four-ring permanent $B_0$ magnet 600 shown in FIGS. 6A-C, in accordance with some embodiments of the technology described herein. As shown in FIG. 7H, permanent magnet 606 has an inner diameter of 264.6 mm and an outer diameter of 322.2 mm, which implies a width of 57.6 mm. As shown in FIG. 7G, permanent magnet ring 606 has a height of 30 mm.

Figure 7L:
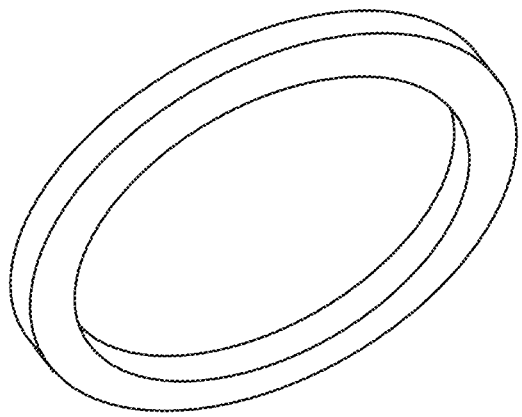
FIGS. 7J-L respectively illustrate a cross-section side view, a top view, and an isometric view of an outermost ring of the four-ring permanent $B_0$ magnet shown in FIGS. 6A-C, in accordance with some embodiments of the technology described herein.
Figure 7K:
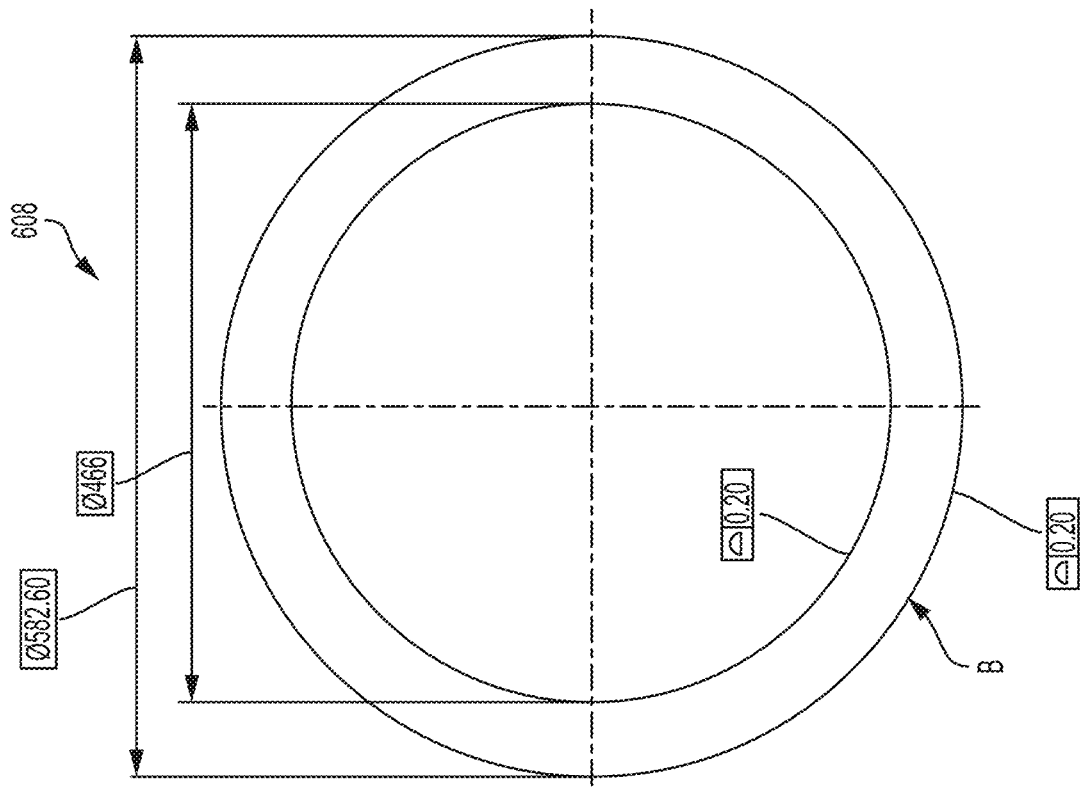
Figure 7J:
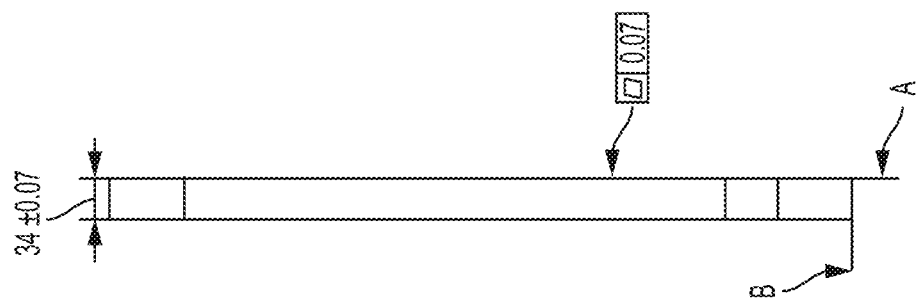

FIGS. 7J, 7K, and 7L respectively illustrate a cross-section side view, a top view, and an isometric view of permanent magnet ring 608 of the four-ring permanent $B_0$ magnet 600 shown in FIGS. 6A-C, in accordance with some embodiments of the technology described herein. As shown in FIG. 7J, permanent magnet 608 has an inner diameter of 466 mm and an outer diameter of 582.6 mm, which implies a width of 116.6 mm. As shown in FIG. 7L, permanent magnet ring 608 has a height of 34 mm.

As may be appreciated from the foregoing example embodiment illustrated in FIGS. 6A-C and FIGS. 7A-L, in some embodiments, permanent magnet rings of a permanent magnet may each have a different respective height and width. However, as previously described, this is not a requirement as two or more of the permanent magnet rings may have a same width and/or height in some embodiments.

As described herein, in some embodiments, a permanent $B_0$ magnet may be formed by a pair of permanent magnets in a bi-planar geometry, so that an imaging region is formed there between, and a yoke that captures electromagnetic flux produced by the pair of permanent magnets and directs it to increase the magnetic flux density within the imaging region.

The inventors have recognized that, in some embodiments, during operation of the permanent magnet, the yoke may become magnetically saturated. In turn, magnetic saturation of the yoke may cause it to have non-uniform permeability. As one illustrative example, with reference to FIG. 2, magnetic saturation induced in the plates 224a and 224b by the permanent magnets may result in the plates 224a and 224b having non-uniform permeability. The inventors have appreciated that non-uniform permeability of the plates may result in MRI reconstruction errors due to the interplay between the gradient coils and the yoke. More specifically, operation of the gradient coils generates magnetic fields in the yoke. Non-uniform permeability of the yoke further results in the superimposition of a time-dependent uniform magnetic field (whose presence or absence depends on gradient coil operation) to the $B_0$ field created by the yoke and the permanent magnets, which causes reconstruction errors.

Accordingly, the inventors have developed various techniques for compensating for the magnetic saturation in the yoke thereby reducing the non-uniformity of permeability in the yoke. In some embodiments, ferromagnetic material may be added to the yoke to compensate for its magnetic saturation. For example, in some embodiments, additional ferromagnetic material (e.g., one or more steel plates) may be attached to the yoke and/or the yoke may be manufactured to include the additional ferromagnetic material. As another example, in some embodiments, ferromagnetic material may be removed from the yoke to compensate for magnetic saturation. As one illustrative example with reference to FIG. 2, in some embodiments, ferromagnetic material may be removed from the plates 224a and 224b by drilling one or more holes in the plates and/or by varying their thickness, for example, by thinning the plates toward their outer edges and/or in regions away from where the frame arms 223a and 223b are coupled to the plates).

Accordingly, some embodiments include an apparatus for providing a $B_0$ magnetic field for an MRI system. The apparatus has a first $B_0$ magnet configured to produce a first magnetic field to contribute to the $B_0$ magnetic field, a second $B_0$ magnet configured to produce a second magnetic field to contribute to the $B_0$ magnetic field and arranged relative to the first $B_0$ magnet so that an imaging region is provided between the first and second $B_0$ magnets. The apparatus further includes a yoke configured to capture and direct at least some magnetic flux generated by the first and second $B_0$ magnets to increase the magnetic flux density within the imaging region. The yoke includes: (1) a first plate comprising ferromagnetic material and coupled to the at least one first $B_0$ magnet; (2) a second plate comprising ferromagnetic material and coupled to the at least one second $B_0$ magnet; (3) a frame (e.g., a substantially C-shaped frame having first and second arms to which the first and second plates are respectively attached) comprising ferromagnetic material and coupled to the first plate and the second plate; (4) first additional ferromagnetic material coupled to the first plate to compensate for magnetic saturation induced in the first plate; and (5) second additional ferromagnetic material coupled to the second plate to compensate for magnetic saturation induced in the second plate. In some embodiments, one or more portions of the yoke may be made from low carbon steel, cobalt steel (CoFe), and/or silicon steel.

In some embodiments, the first additional ferromagnetic material may be manufactured separately from the first plate and subsequently attached (e.g., bolted) to the first plate. For example, the first additional ferromagnetic material may be attached to the first plate on a side of the first plate facing away from the second plate. In other embodiments, the first plate may be manufactured jointly with the additional ferromagnetic material so that it includes the additional ferromagnetic material. In yet other embodiments, the first addi- tional ferromagnetic material may be part of the yoke (e.g., the yoke frame) and/or attached to any suitable part(s) of the yoke in order to compensate for the magnetic saturation of the first plate.

In some embodiments, similar to the first additional ferromagnetic material, the second additional ferromagnetic material may be manufactured separately from the second plate and subsequently attached (e.g., bolted) to the second plate. For example, the second additional ferromagnetic material may be attached to the second plate on a side of the second plate facing away from the first plate. In other embodiments, the second plate may be manufactured jointly with the additional ferromagnetic material so that it includes the additional ferromagnetic material. In yet other embodiments, the second additional ferromagnetic material may be part of the yoke (e.g., the yoke frame) and/or attached to any suitable part(s) of the yoke in order to compensate for the magnetic saturation of the second plate.

In some embodiments, non-uniform permeability of the first plate implies that the first plate includes a first region having a first differential permeability (e.g., the region where the first plate is attached to an arm of the yoke's frame) and a second region having a second differential permeability lower than the first differential permeability. In some such embodiments, the first additional ferromagnetic material may be added proximate the first region to compensate for differential permeability differences between the first and second regions.

In some embodiments, the first additional ferromagnetic material comprises one or more ferromagnetic plates. The ferromagnetic plate(s) may be proximate the first arm portion to which the first plate is attached. For example, the first and second additional ferromagnetic material may include two plates proximate the first arm portion, with the first arm portion disposed between the two plates (e.g., as shown in the illustrative embodiment of FIG. 8A with respect to plates 830a and 830b and first arm 823a, which is described further below).

Figure 8A:
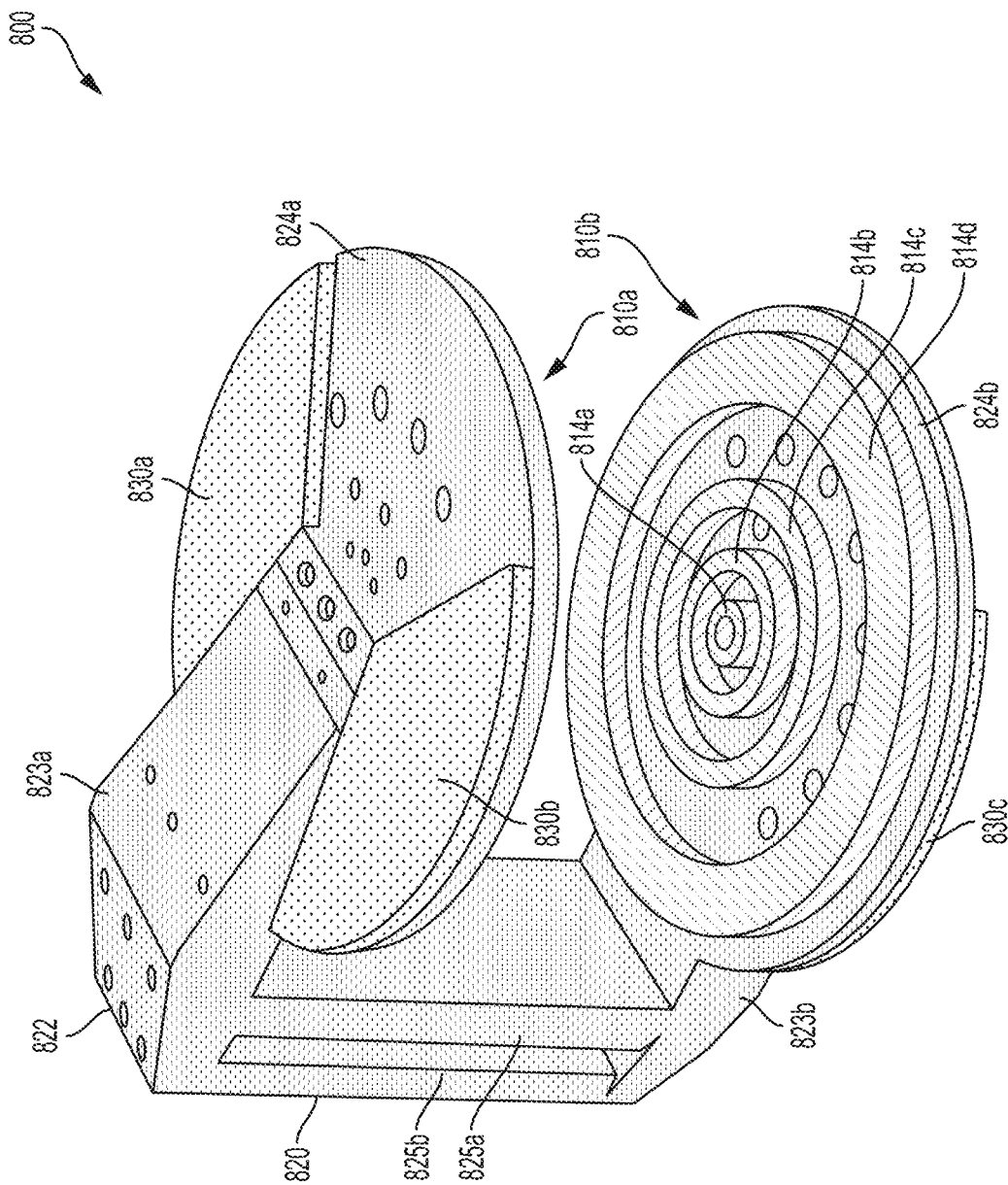
FIG. 8A illustrates an apparatus having first and second $B_0$ magnets each having a respective plurality of permanent magnet rings, and a yoke having first and second plates and first and second additional ferromagnetic material to compensate for magnetic saturation induced in the first and second plates, respectively, in accordance with some embodiments of the technology described herein.

In some embodiments, each of the first and second plates is substantially circular and the additional ferromagnetic material plates have a substantially circular edge. For example, as shown in FIG. 8A, the additional ferromagnetic material plates may be substantially truncated circular sectors.

In some embodiments, the first and second $B_0$ magnets contribute to the $B_0$ magnetic field for the MRI system, the $B_0$ magnetic field having a field strength of less than or equal to approximately 0.2 T and greater than or equal to approximately 0.1 T. In some embodiments, the first and second $B_0$ magnets contribute to the $B_0$ magnetic field for the MRI system, the $B_0$ magnetic field having a field strength of less than or equal to approximately 0.1 T and greater than or equal to approximately 50 mT. In some embodiments, the first and second $B_0$ magnets contribute to the $B_0$ magnetic field for the MRI system, the $B_0$ magnetic field having a field strength of less.

In some embodiments, the first and second $B_0$ magnet may be any suitable type of magnets described herein. For example, in some embodiments, the first $B_0$ magnet may be a permanent magnet and may include multiple permanent magnet rings concentric about a common center. In some embodiments, the permanent magnet rings may have varying widths and/or heights.

In some embodiments, magnetic saturation may be addressed by removing ferromagnetic material from the yoke rather than adding ferromagnetic material to the yoke. For example, ferromagnetic material may be removed by introducing holes into the yoke. Accordingly, some embodiments include an apparatus that provides a $B_0$ magnetic field for an MRI system and includes a first $B_0$ magnet configured to produce a first magnetic field to contribute to the $B_0$ magnetic field and a second $B_0$ magnet configured to produce a second magnetic field to contribute to the $B_0$ magnetic field and arranged relative to the first $B_0$ magnet so that an imaging region is provided between the first and second $B_0$ magnets. The apparatus further includes a yoke configured to capture and direct at least some magnetic flux generated by the first and second $B_0$ magnets to increase the magnetic flux density within the imaging region. The yoke includes: (1) a first plate comprising ferromagnetic material and coupled to the at least one first $B_0$ magnet and a first set of one or more holes (e.g., circular holes or other openings) to compensate for magnetic saturation induced in the first plate; (2) a second plate comprising ferromagnetic material and coupled to the at least one second $B_0$ magnet and a second set of one or more holes to compensate for magnetic saturation induced in the second plate; and (3) a frame comprising ferromagnetic material and coupled to the first plate and the second plate. The first and second sets holes make the permeability in the first and second plates, respectively, substantially more symmetric relative to permeability in the first and second plates that would be present without the holes.

As another example, ferromagnetic material may be removed by thinning one or more portions of the yoke (e.g., one or more plates in the yoke). Accordingly, some embodiments include an apparatus that provides a $B_0$ magnetic field for an MRI system and includes a first $B_0$ magnet configured to produce a first magnetic field to contribute to the $B_0$ magnetic field and a second $B_0$ magnet configured to produce a second magnetic field to contribute to the $B_0$ magnetic field and arranged relative to the first $B_0$ magnet so that an imaging region is provided between the first and second $B_0$ magnets. The apparatus further includes a yoke configured to capture and direct at least some magnetic flux generated by the first and second $B_0$ magnets to increase the magnetic flux density within the imaging region. The yoke includes: (1) a first plate comprising ferromagnetic material and coupled to the at least one first $B_0$ magnet, wherein the first plate has a varying thickness to compensate for magnetic saturation induced in the first plate; (2) a second plate comprising ferromagnetic material and coupled to the at least one second $B_0$ magnet, wherein the second plate has a varying thickness to compensate for magnetic saturation induced in the second plate; and (3) a frame comprising ferromagnetic material and coupled to the first plate and the second plate.

FIG. 8A illustrates a permanent $B_0$ magnet 800, in accordance with some embodiments. In particular, $B_0$ magnet 800 is formed by permanent magnets 810a and 810b arranged in a bi-planar geometry and a yoke 820 that captures electromagnetic flux produced by the permanent magnets 810a and 810b and directs the flux to the opposing permanent magnets to increase the flux density in the imaging region between them. Each of permanent magnets 810a and 810b is formed from a plurality of permanent magnets concentric about a common center. In particular, as visible in FIG. 8A, permanent magnet 810b comprises permanent magnet rings 814a, 814b, 814c, and 814d. Permanent magnet 810a may comprise the same set of permanent magnet elements as permanent magnet 410b. The permanent magnet rings may have varying heights and/or widths. The permanent magnets may be made of any of the material(s) described herein.

In the embodiment illustrated in FIG. 8A, yoke 820 comprises a frame 822 and plates 824a and 824b. Exemplary frame 822 comprises arms 823a and 823b that attach to plates 824a and 824b, respectively, and supports 825a and 825b providing the magnetic return path for the flux generated by the permanent magnets. In a manner similar to that described above in connection with yoke 820, plates 824a and 824b capture magnetic flux generated by permanent magnets 810a and 810b and direct it to frame 822 to be circulated via the magnetic return path of the yoke 820 to increase the flux density in the field of view of the $B_0$ magnet. Yoke 820 may be constructed of any desired ferromagnetic material, for example, low carbon steel, CoFe and/or silicon steel, etc. to provide the desired magnetic properties for the yoke. According to some embodiments, plates 824a and 824b (and/or frame 822 or portions thereof) may be constructed of silicon steel or the like in areas where the gradient coils could most prevalently induce eddy currents.

As shown in FIG. 8A, yoke 820 further includes first additional ferromagnetic material, which includes plates 830a and 830b, coupled to the first plate 824a to compensate for magnetic saturation in the first plate 824a. The plates 830a and 830b are proximate the first arm portion 823a to which the first plate 824a is attached; the first arm portion 823a is between plates 830a and 830b. Yoke 820 also includes second additional ferromagnetic material, which includes at least plate 830c, coupled to the second plate 824b to compensate for magnetic saturation in the second plate 824b. As shown in FIG. 8A, plates 830a and 830b are truncated circular sectors having circular edges. A schematic drawing for plate 830a is shown in FIG. 8B. Though, it should be appreciated that the shape of plates 830 and 830b may be of any other suitable shape, as aspects of the technology described herein are not limited in this respect. The first and second ferromagnetic material may include low carbon steel, cobalt steel (CoFe), silicon steel, and/or any other type of ferromagnetic material(s).

Figure 9A:
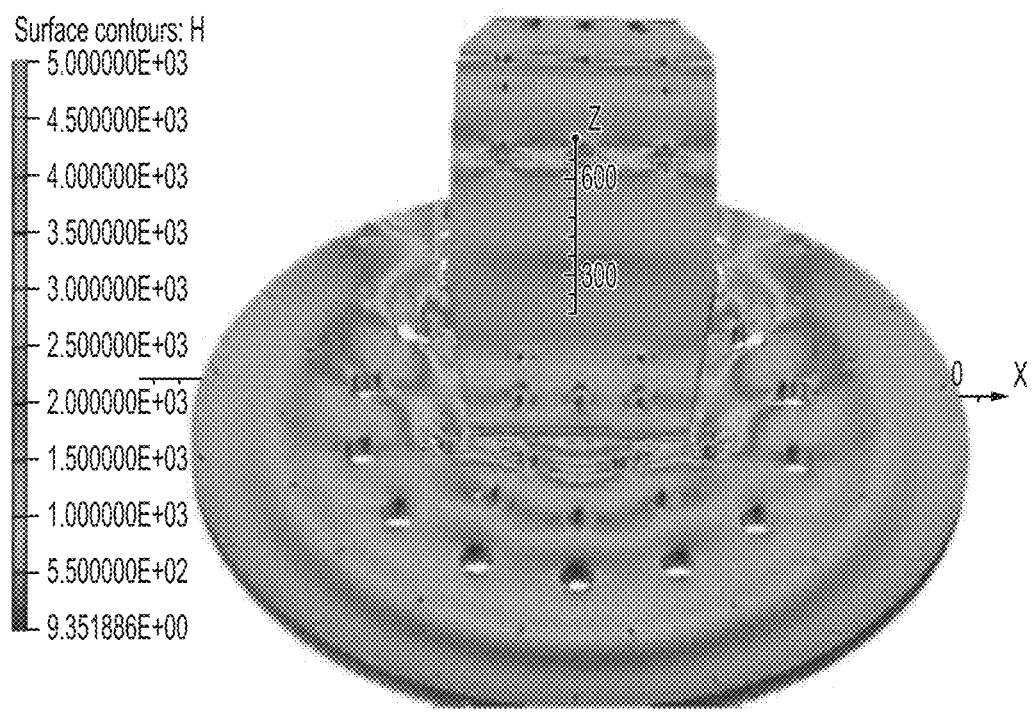
FIGS. 9A-B illustrate the impact of additional ferromagnetic material on magnetic saturation and, consequently, inhomogeneity of permeability, in accordance with some embodiments of the technology described herein.
Figure 9B:
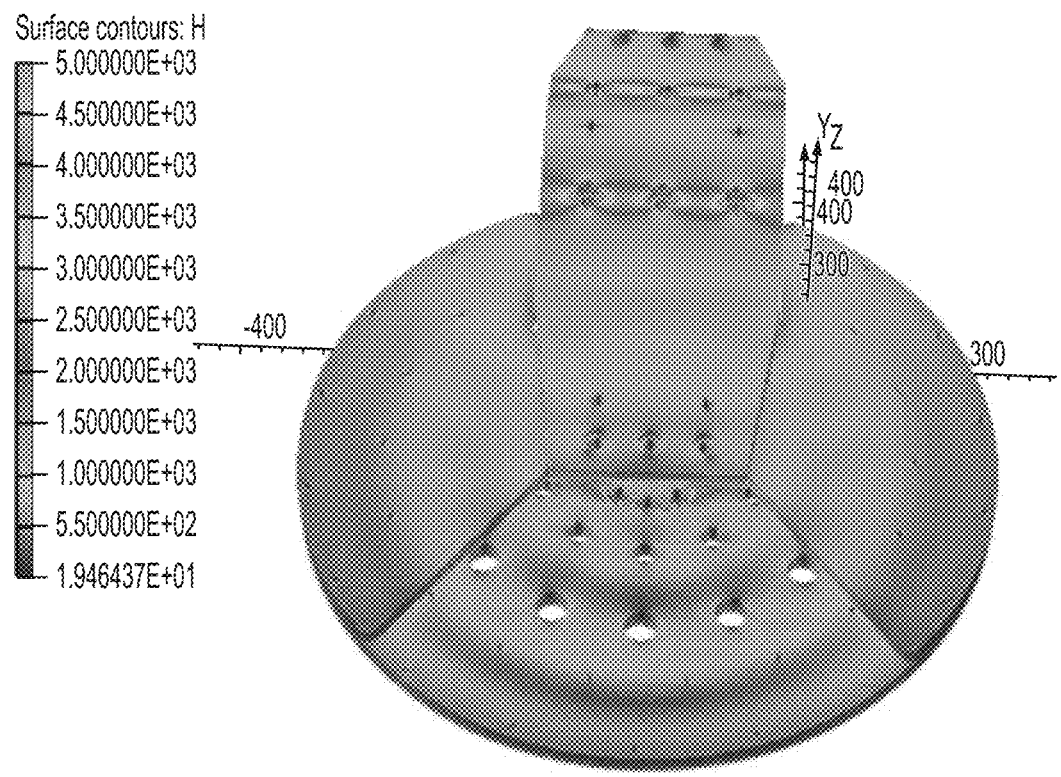

In some embodiments, the additional ferromagnetic material compensates for magnetic saturation in the first and second plates 824a and 824b, which in turn reduces inhomogeneity of permeability in the plates. FIGS. 9A-B illustrate the impact of additional ferromagnetic material on magnetic saturation and, consequently, inhomogeneity of permeability, in accordance with some embodiments. As shown in FIG. 9B, the addition of ferromagnetic plates 830a and 830b reduces permeability inhomogeneities around the region where the first plate 824a is attached to the yoke arm 823a relative to the inhomogeneity of permeability shown in FIG. 9A.

Although in the embodiment illustrated in FIG. 8A, plates 830a and 830b are attached to the first plate 824a, in other embodiments, the plates 830a and 830b may be part of the first plate 824a. In yet other embodiments, the first additional ferromagnetic material may be attached or be a part of first arm 823a. Generally, the first additional ferromagnetic material may be attached to and/or be part of any suitable portion(s) of the yoke 820 so long as the additional ferromagnetic material compensates for the magnetic saturation in the first plate 824a.

As described herein, the inventors have developed low power, portable low-field MRI systems that can be deployed in virtually any environment and that can be brought to the patient who will undergo an imaging procedure. In this way, patients in emergency rooms, intensive care units, operating rooms and a host of other locations can benefit from MRI in circumstances where MRI is conventionally unavailable. Aspects that facilitate portable MRI are described in further detail below.

Figure 10:
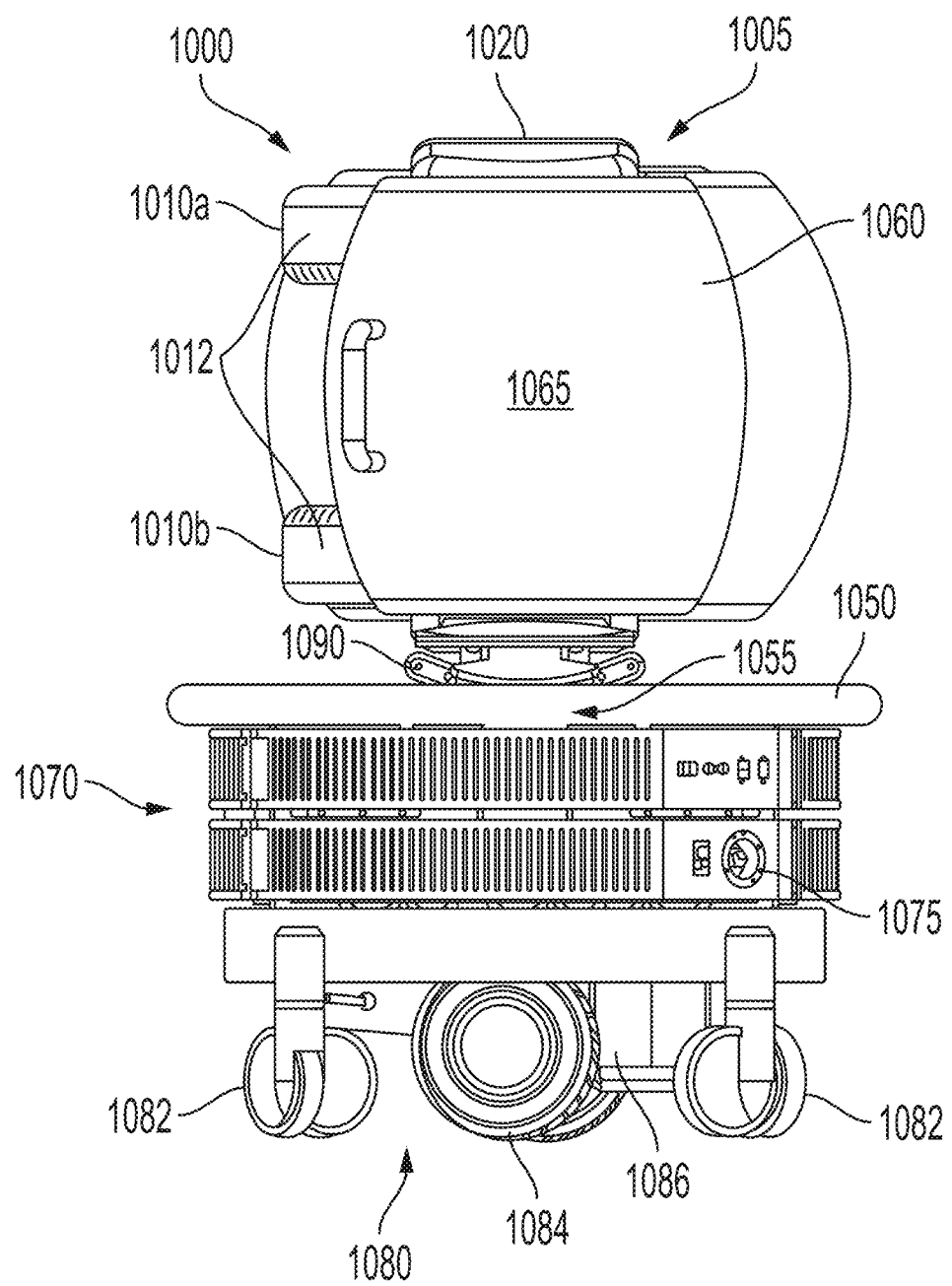
FIG. 10 illustrates a portable low-field MRI system, in accordance with some embodiments of the technology described herein.

FIG. 10 illustrates a low power, portable low-field MRI system, in accordance with some embodiments. Portable MRI system 1000 comprises a $B_0$ magnet 1005 including at least one first permanent magnet 1010a and at least one second permanent magnet 1010b magnetically coupled to one another by a ferromagnetic yoke 1020 configured to capture and channel magnetic flux to increase the magnetic flux density within the imaging region (field of view) of the MRI system. Permanent magnets 1010a and 1010b may be constructed using any suitable technique, including any of the techniques described herein (e.g., using any of the techniques, designs and/or materials described in connection with $B_0$ magnet 200 illustrated in FIG. 2 and described in the accompanying description thereof). Yoke 1020 may also be constructed using any of the techniques described herein (e.g., using any of the techniques, designs and/or materials described in connection with yoke 220 illustrated in FIG. 2 and described in the accompanying description thereof). It should be appreciated that, in some embodiments, $B_0$ magnet 1005 may be formed using electromagnets. $B_0$ magnet 1005 may be encased or enclosed in a housing 1012 along with one or more other magnetics components, such as the system's gradient coils (e.g., x-gradient, y-gradient and z-gradient coils) and/or any shim components (e.g., shim coils or permanent magnetic shims), $B_0$ correction coils, etc.

$B_0$ magnet 1005 may be coupled to or otherwise attached or mounted to base 1050 by a positioning mechanism 1090, such as a goniometric stage, so that the $B_0$ magnet can be tilted (e.g., rotated about its center of mass) to provide an incline to accommodate a patient's anatomy as needed. In FIG. 10, the $B_0$ magnet is shown level without an incline. Positioning mechanism 1090 may be fixed to one or more load bearing structures of base 1050 arranged to support the weight of $B_0$ magnet 1005.

In addition to providing the load bearing structures for supporting the $B_0$ magnet, base 1050 also includes an interior space configured to house the electronics 1070 needed to operate the portable MRI system 1000. For example, base 1050 may house the power components to operate the gradient coils (e.g., X, Y and Z) and the RF transmit/receive coils. The inventors have developed generally low power, low noise and low cost gradient amplifiers configured to suitably power gradient coils in the low-field regime, designed to be relatively low cost, and constructed for mounting within the base of the portable MRI system (i.e., instead of being statically racked in a separate room of a fixed installment as is conventionally done). According to some embodiments, the power electronics for powering the gradient coils of an MRI system consume less than 50 W when the system is idle and between 100-300 W when the MRI system is operating (i.e., during image acquisition). Base 1050 may also house the RF coil amplifiers (i.e., power amplifiers to operate the transmit/receive coils of the system), power supplies, console, power distribution unit and other electronics needed to operate the MRI system, further details of which are described below.

According to some embodiments, the electronics 1070 needed to operate portable MRI system 1000 consume less than 1 kW of power, in some embodiments, less than 750 W of power and, in some embodiments, less than 500 W of power (e.g., MRI systems utilizing a permanent $B_0$ magnet solution). Techniques for facilitating low power operation of an MRI device are described in further detail below. However, systems that consume greater power may also be utilized as well, as the aspects are not limited in this respect. Exemplary portable MRI system 1000 illustrated in FIG. 10 may be powered via a single power connection 1075 configured to connect to a source of mains electricity, such as an outlet providing single-phase power (e.g., a standard or large appliance outlet). Accordingly, the portable MRI system can be plugged into a single available power outlet and operated therefrom, eliminating the need for a dedicated power source (e.g., eliminating the need for a dedicated three-phase power source as well as eliminating the need for further power conversion electronics to convert three phase power to single phase power to be distributed to corresponding components of the MRI system) and increasing the availability of the MRI system and the circumstances and locations in which the portable MRI system may be used.

Portable MRI system 1000 illustrated in FIG. 10 also comprises a conveyance mechanism 1080 that allows the portable MRI system to be transported to different locations. The conveyance mechanism may comprise one or more components configured to facilitate movement of the portable MRI system, for example, to a location at which MRI is needed. According to some embodiments, conveyance mechanism comprises a motor 1086 coupled to drive wheels 1084. In this manner, conveyance mechanism 1080 provides motorized assistance in transporting MRI system 1000 to desired locations. Conveyance mechanism 1080 may also include a plurality of castors 1082 to assist with support and stability as well as facilitating transport.

According to some embodiments, conveyance mechanism 1080 includes motorized assistance controlled using a controller (e.g., a joystick or other controller that can be manipulated by a person) to guide the portable MRI system during transportation to desired locations. According to some embodiments, the conveyance mechanism comprises power assist means configured to detect when force is applied to the MRI system and to, in response, engage the conveyance mechanism to provide motorized assistance in the direction of the detected force. For example, rail 1055 of base 1050 illustrated in FIG. 10 may be configured to detect when force is applied to the rail (e.g., by personnel pushing on the rail) and engage the conveyance mechanism to provide motorized assistance to drive the wheels in the direction of the applied force. As a result, a user can guide the portable MRI system with the assistance of the conveyance mechanism that responds to the direction of force applied by the user. The power assist mechanism may also provide a safety mechanism for collisions. In particular, the force of contact with another object (e.g., a wall, bed or other structure) may also be detected and the conveyance mechanism will react accordingly with a motorized locomotion response away from the object. According to some embodiments, motorized assistance may be eliminated and the portable MRI system may be transported by having personnel move the system to desired locations using manual force.

Portable MRI system 1000 includes slides 1060 that provide electromagnetic shielding to the imaging region of the system. Slides 1060 may be transparent or translucent to preserve the feeling of openness of the MRI system to assist patients who may experience claustrophobia during conventional MRI performed within a closed bore. Slides 1060 may also be perforated to allow air flow to increase the sense of openness and/or to dissipate acoustic noise generated by the MRI system during operation. The slides may have shielding 1065 incorporated therein to block electromagnetic noise from reaching the imaging region. According to some embodiments, slides 1060 may also be formed by a conductive mesh providing shielding 1065 to the imaging region and promoting a sense of openness for the system. Thus, slides 1060 may provide electromagnetic shielding that is moveable to allow a patient to be positioned within the system, permitting adjustment by personnel once a patient is positioned or during acquisition, and/or enabling a surgeon to gain access to the patient, etc. Thus, the moveable shielding facilitates flexibility that allows the portable MRI system to not only be utilized in unshielded rooms, but enables procedures to be performed that are otherwise unavailable.

According to some embodiments, a portable MRI system does not include slides, providing for a substantially open imaging region, facilitating easier placement of a patient within the system, reducing the feeling of claustrophobia and/or improving access to the patient positioned within the MRI system (e.g., allowing a physician or surgeon to access the patient before, during or after an imaging procedure without having to remove the patient from the system). The inventors have developed techniques that facilitate performing MRI with varying levels of electromagnetic shielding, including no or substantially no shielding of the imaging region, including a noise suppression system adapted to suppress electromagnetic noise in the environment. According to some embodiments, portable MRI system 1000 may be equipped with a noise reduction system using one or more of the noise suppression and/or avoidance techniques described herein to, for example, dynamically adapt the noise suppression/cancellation response in concert with the shielding configuration of a given shielding arrangement of the portable MRI system 1000. Thus, portable low field MRI system 1000 can be transported to the patient and/or to a desired location and operated outside specially shielded rooms (e.g., in an emergency room, operating room, NICU, general practitioner's office, clinic) and/or brought bedside directly to the patient wherever located, allowing for MRI to be performed when and where it is needed.

Figure 11A:
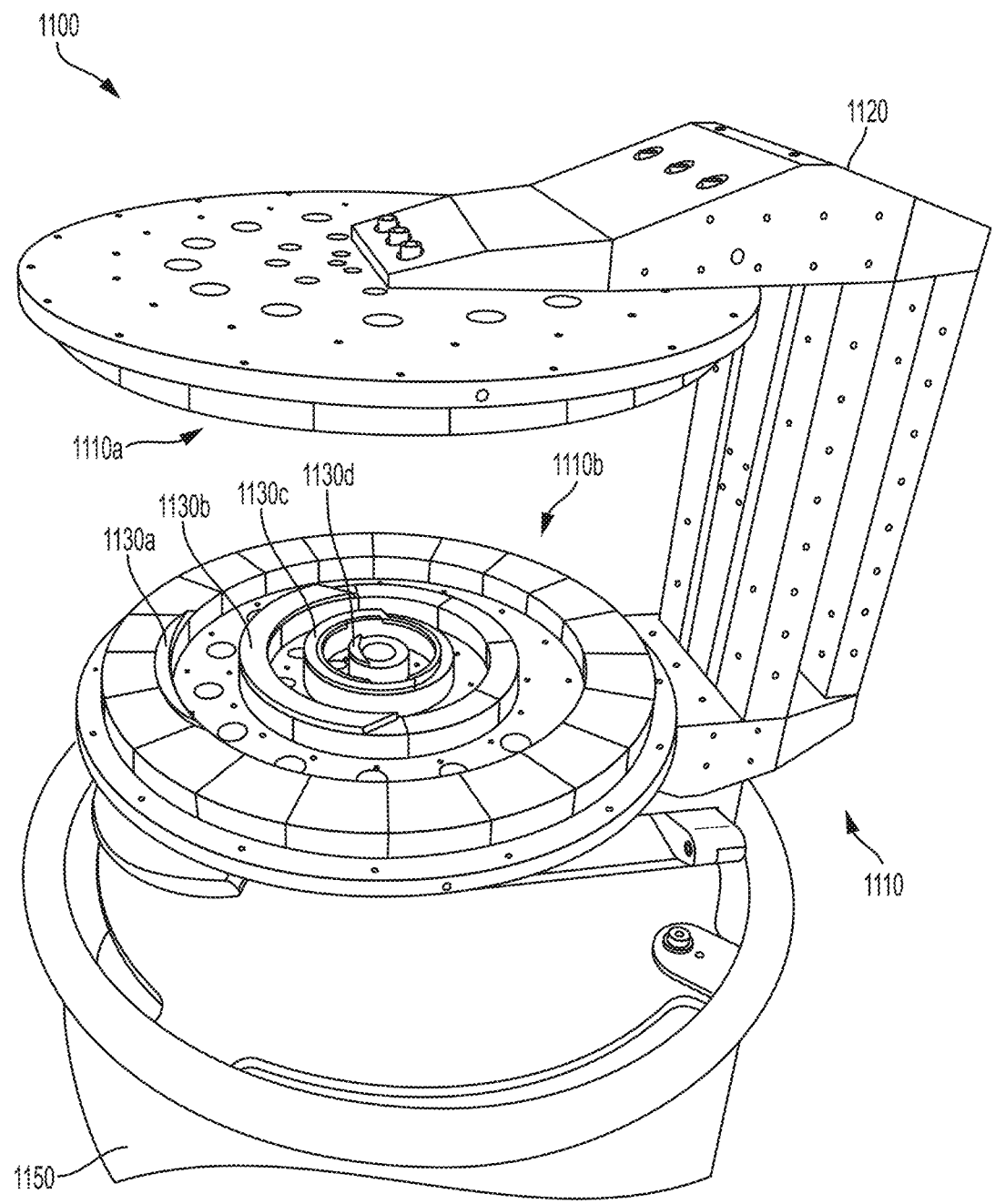
FIG. 11A illustrates permanent magnet shims for a $B_0$ magnet of a portable MRI system, in accordance with some embodiments of the technology described herein.
Figure 11B:
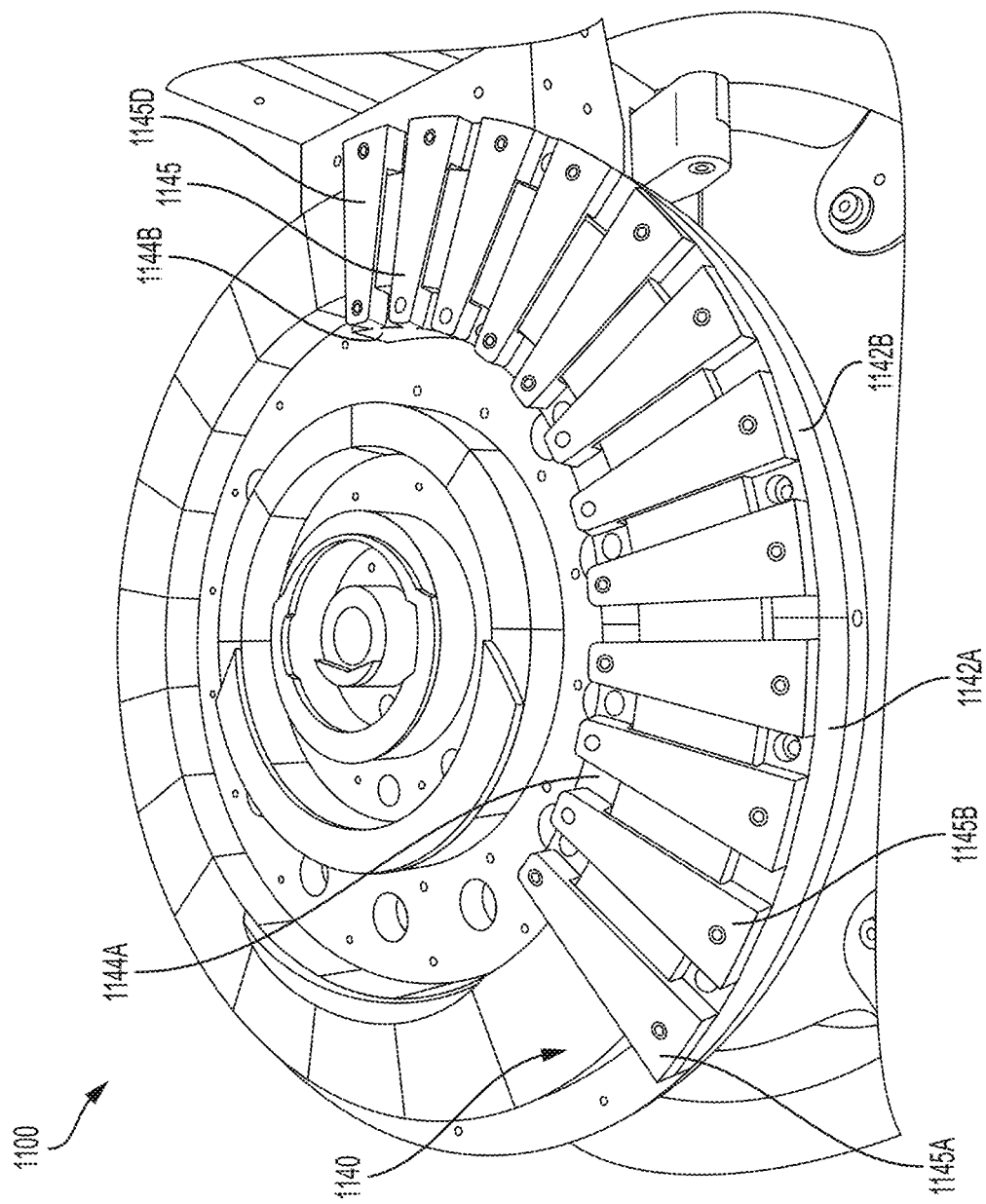
FIGS. 11B and 11C illustrate vibration mounts for gradient coils of a portable MRI system, in accordance with some embodiments of the technology described herein.
Figure 11C:
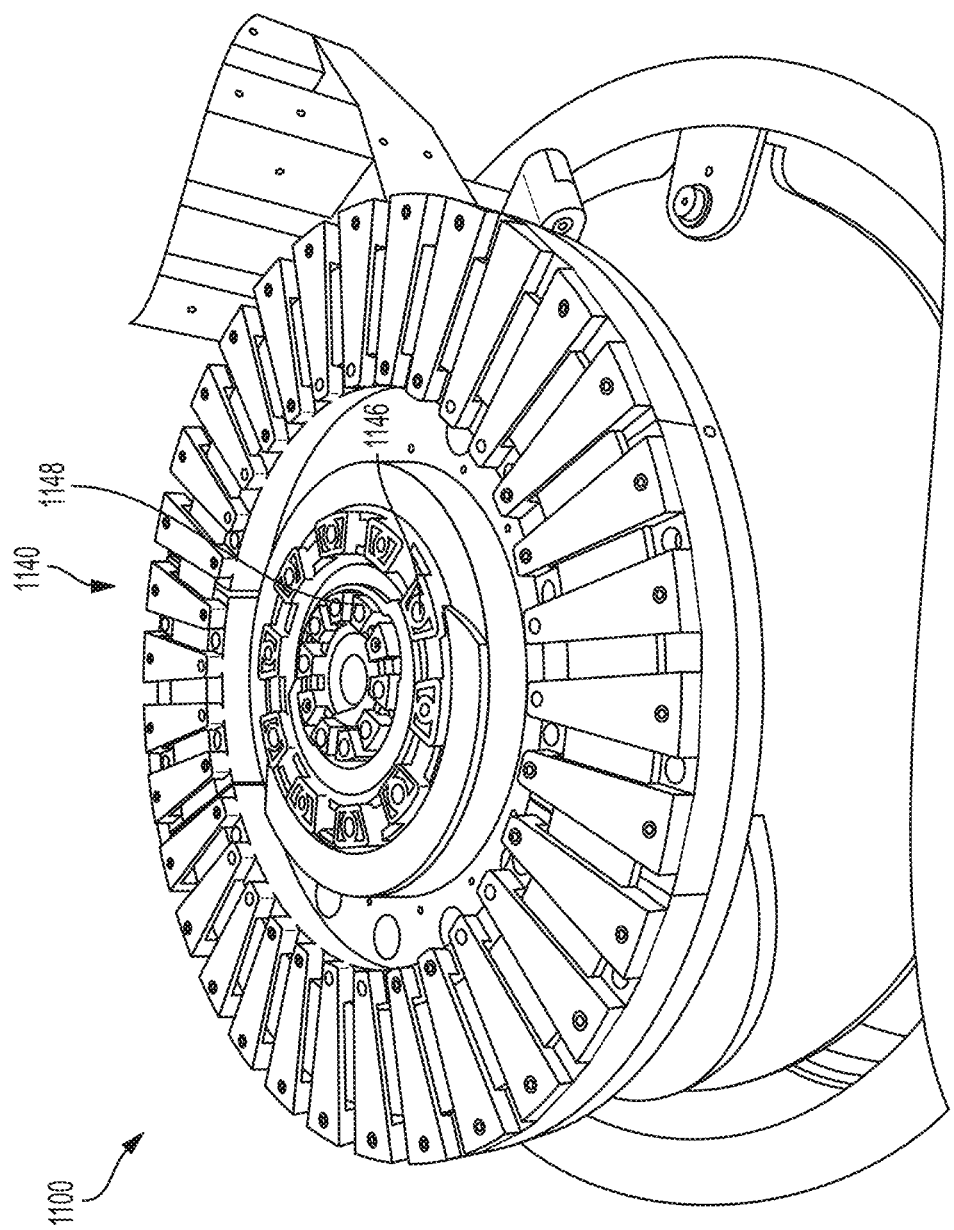
Figure 11D:
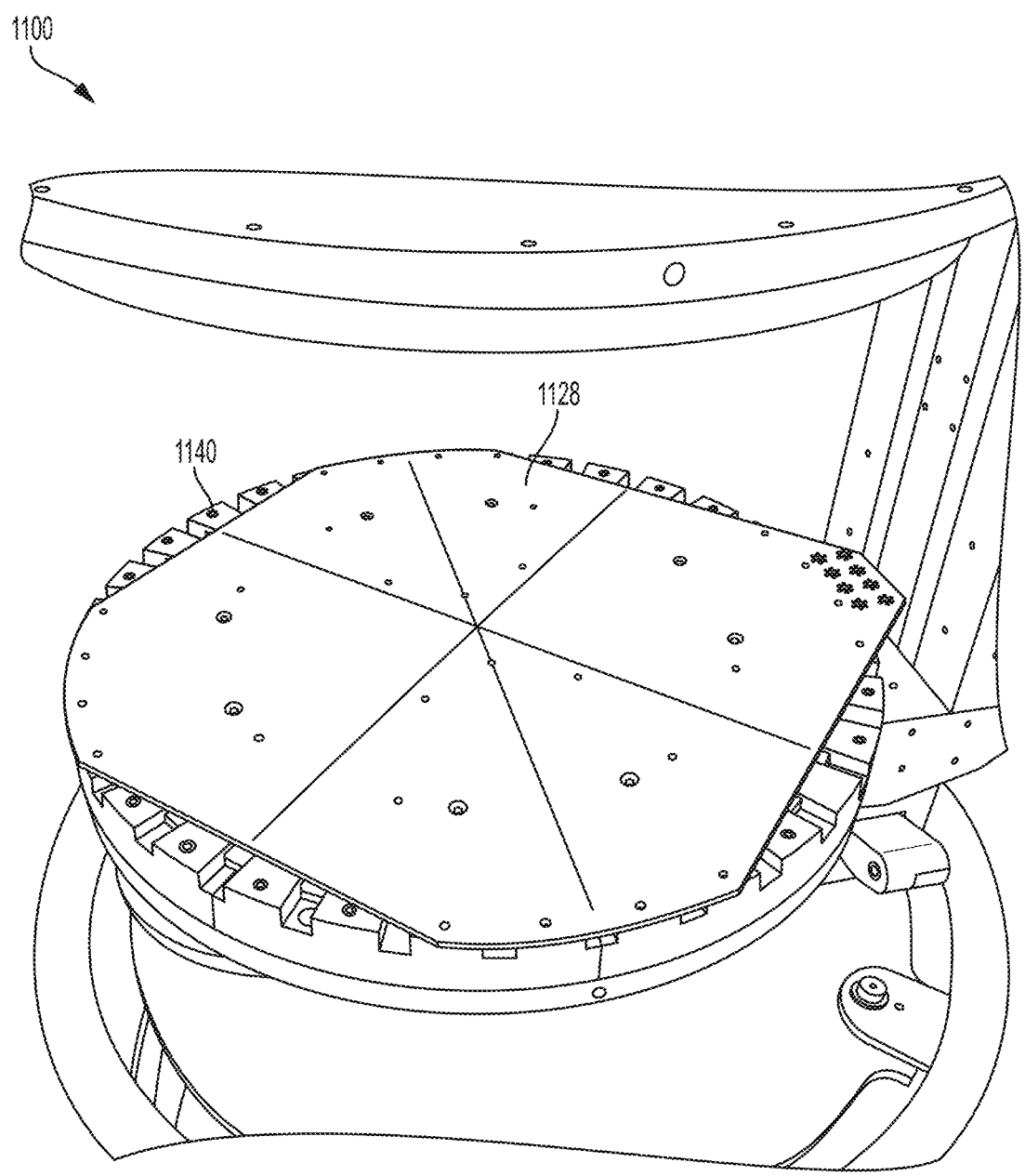
FIG. 11D illustrates a laminate panel comprising gradient coils fastened to the vibration mounts illustrated in FIGS. 11B and 11C, in accordance with some embodiments of the technology described herein.
Figure 11E:
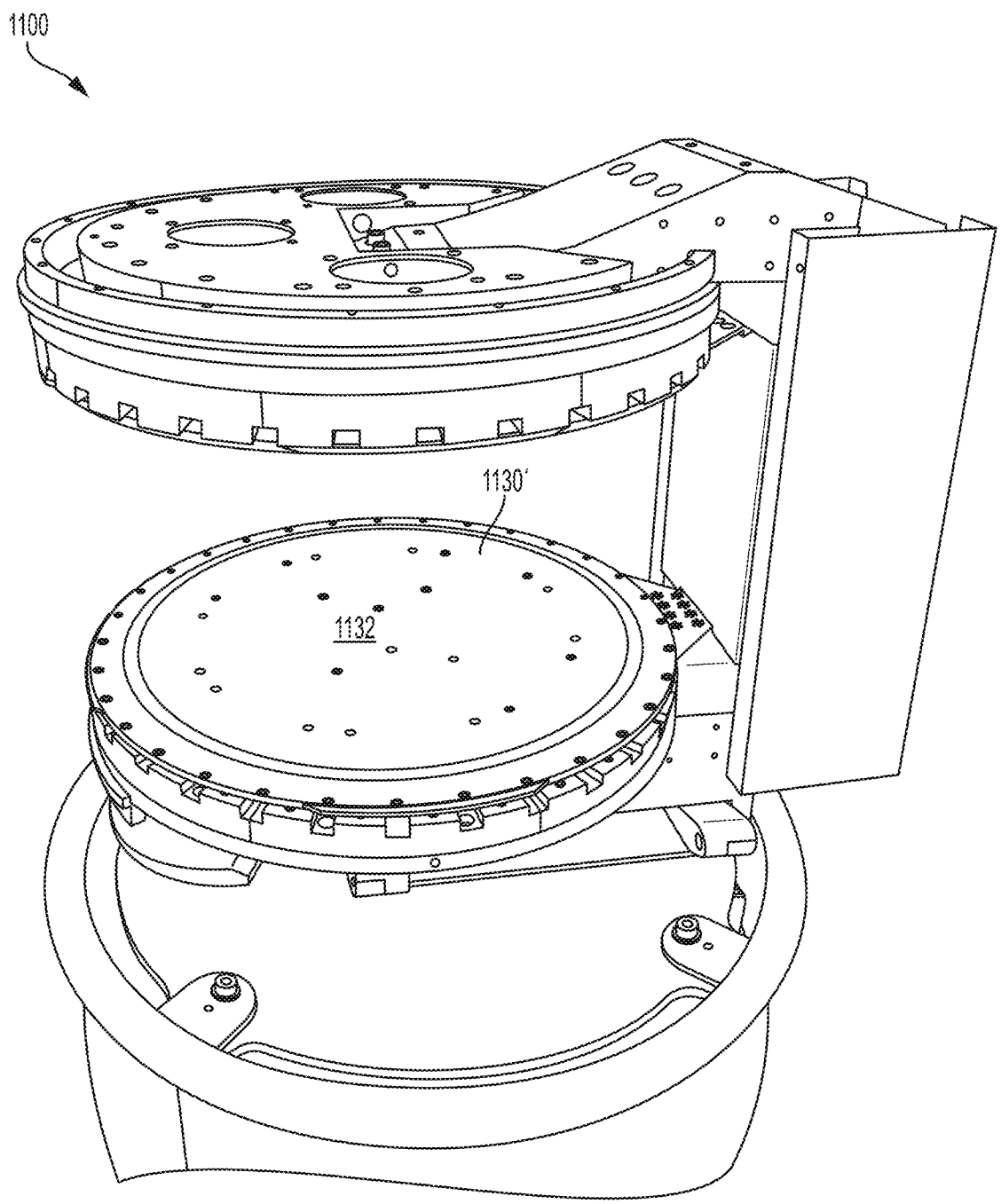
FIG. 11E illustrates exemplary shims for a $B_0$ magnet of a portable MRI system, in accordance with some embodiments of the technology described herein.
Figure 11F:
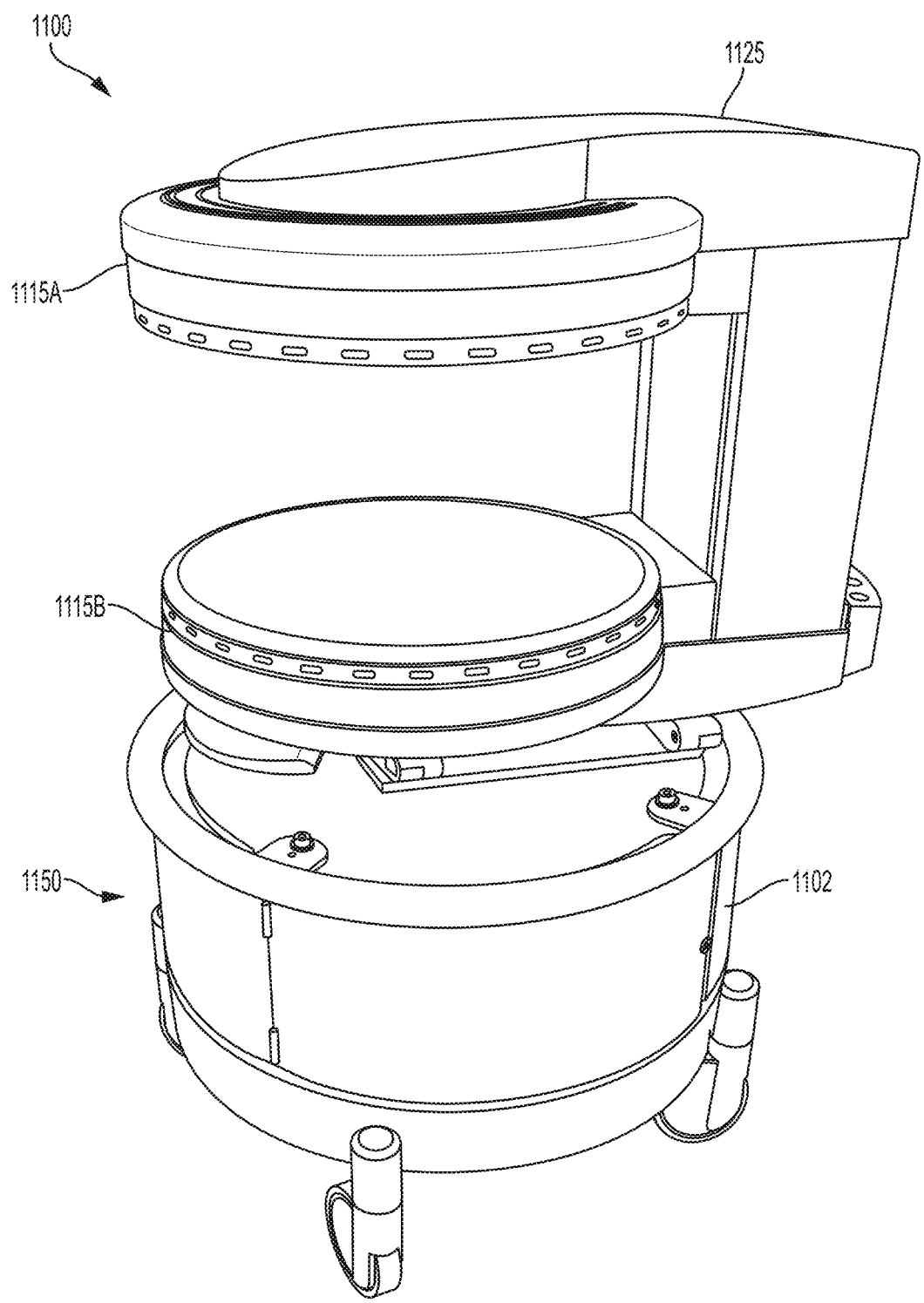
FIG. 11F illustrates a portable MRI system, in accordance with some embodiments of the technology described herein.

FIGS. 11A-F illustrate a number of exemplary steps in constructing a portable MRI system 1100. In FIG. 11A, a $B_0$ magnet 1110 comprising upper permanent magnet 1110a, lower permanent magnet 1110b and yoke 1120 is mounted atop a base 1150, a portion of which is illustrated in FIG. 11A (the full base 1150 is illustrated in FIG. 11F). The upper and lower permanent magnets 1110a and 1110b are formed from a plurality of concentric rings of permanent magnet blocks, for example, similar to the permanent magnets rings described in connection with FIGS. 2-3, though any configuration of permanent magnet rings may be used. $B_0$ magnet 1110 and yoke 1120 may be constructed to be relatively light weight, for example, using the techniques and materials described above in connection with FIGS. 2-7 so that the total weight of the completed portable MRI system 1100, as shown in FIG. 11F, weighs less than 1500 pounds and, more preferably, less than 1000 pounds. Accordingly, portable MRI system 1100 may be transported to different locations by personnel, with or without motor assist capabilities, examples of which are described in further detail below.

$B_0$ magnet 1110 may be configured to produce a $B_0$ magnetic field in the very low field strength regime (e.g., less than or equal to approximately 0.1 T). For example, portable MRI system 1100 may be configured to operate at a magnetic field strength of approximately 64 mT, though any low-field strength may be used. $B_0$ magnetic field strengths in the very low-field regime facilitate a 5-Gauss line (e.g., the perimeter outside of which the fringe magnetic field from the $B_0$ magnet is 5 Gauss or less) that remains close to the portable MRI system. For example, according to some embodiments, the 5-Gauss line has a maximum dimension of less than seven feet and, more preferably, less than 5 feet and, even more preferably, less than 4 feet.

As shown in FIG. 11A, provided on top of one or more of the permanent magnet rings are permanent magnet shims 1130 configured to improve the profile of the $B_0$ magnetic field produced by $B_0$ magnet 1110. As discussed above, one exemplary technique for addressing the relatively low SNR characteristic of the low-field regime is to improve the homogeneity of the $B_0$ field by the $B_0$ magnet. In general, a $B_0$ magnet requires some level of shimming to produce a $B_0$ magnetic field with a profile (e.g., a $B_0$ magnetic field at the desired field strength and/or homogeneity) satisfactory for use in MRI. In particular, production factors such as design, manufacturing tolerances, imprecise production processes, environment, etc., give rise to field variation that produces a $B_0$ field having unsatisfactory profile after assembly/manufacture. For example, after production, exemplary $B_0$ magnets 200 and/or 300 described above may produce a $B_0$ field with an unsatisfactory profile (e.g., inhomogeneity in the $B_0$ field unsuitable for imaging) that needs to be improved or otherwise corrected, typically by shimming, to produce clinically useful images.

Shimming refers to any of various techniques for adjusting, correcting and/or improving a magnetic field, often the $B_0$ magnetic field of a magnetic resonance imaging device. Similarly, a shim refers to something (e.g., an object, component, device, system or combination thereof) that performs shimming (e.g., by producing a magnetic field). Techniques for facilitating more efficient and/or cost effective shimming for a $B_0$ magnet for MRI are described in U.S. Application Pub. No. US 2017/0276749, titled "Methods and Apparatus for Magnetic Field Shimming," and filed on Mar. 22, 2017, which is herein incorporated by reference in its entirety.

Exemplary permanent magnet shims 1130a, 1130b, 1130c and 1130d may be provided, for example, using any of the shimming techniques described in the '500 application. In particular, the configuration or pattern (e.g., shape and size) of permanent magnet shims 1130a-d may be determined by computing a magnetic field correction and determining a magnetic pattern for the permanent magnet shims to provide, at least in part, the magnetic field correction. For example, permanent magnet shims 1130a-d may compensate for effects on the $B_0$ magnetic field resulting from asymmetric yoke 1120. For example, the pattern of the permanent magnet shims 1130a-d may be determined to mitigate and/or substantially eliminate non-uniformity in the $B_0$ magnetic field resulting from the effects of yoke 1120 and/or more compensate for other non-uniformities in the $B_0$ magnetic field resulting from, for example, imperfect manufacturing processes and materials to improve the profile (e.g., strength and/or homogeneity) of the $B_0$ magnet. It should be appreciated that in the embodiment illustrated in FIG. 11A, permanent magnetic 1110a also has permanent magnet shims provided thereon that are not visible in the view illustrated in FIG. 11A.

FIGS. 11B and 11C illustrate a vibration mount for the gradient coils of portable MRI system 1100. As illustrated in FIG. 11B, vibration mount 1140 includes portions positioned over the outer permanent magnet ring and fastened into place. In particular, circular arc segments 1142, of which exemplary circular arc segments 1142A and 1142B are labeled, are affixed to the frame on the outside of the outer permanent magnet ring and corresponding circular arc segments 1144, of which exemplary circular arc segments 1144A and 1144B are labeled, are affixed to the frame on the inside of the outer permanent magnet ring. Slats 1145, of which exemplary slats 1145A-D are labeled, are fastened to the circular arc segments 1142 and 1144 to form a vibration mount on which the gradient coils are mounted, as illustrated in FIG. 11D. As shown in FIG. 11C, additional circular arc segments 1146 and 1148 are arranged between the inner permanent magnet rings to facilitate fastening the gradient coils to vibration mount 1140. FIG. 11C illustrates a completed vibration mount 1140 configured so that the gradient coils (e.g., a laminate panel on which gradient coils are fabricated) can be fastened to the frame of the $B_0$ magnet to provide spacing between the gradient coils and the permanent magnet shims and rings of the $B_0$ magnet 1110, and to provide vibration damping to reduce the acoustic noise and vibration of the gradient coils during operation. It should be appreciated that in the embodiment illustrated in FIGS. 11B-C, a vibration mount is also provided on the upper permanent magnet that is not visible in the view illustrated in FIGS. 11B and 11C.

FIG. 11D illustrates a laminate panel 1128 having gradient coils fabricated thereon fastened to vibration mount 1140. For example, laminate panel 1128 may have one or more x-gradient coils, one or more y-gradient coils and/or one or more z-gradient coils patterned into one or more layers of laminate panel 1128. One or more other magnetics components may also be fabricated on laminate panel 1128, such as one or more shim or correction coils for the $B_0$ magnet 1110. Techniques for fabricating magnetics components on laminate panels is described in U.S. Pat. No. 9,541,616 ('616 patent), titled "Low-Field Magnetic Resonance Imaging Methods and Apparatus," issued Jan. 10, 2017, which is herein incorporated by reference in its entirety. It should be appreciated that in the embodiment illustrated in FIG. 11D, a laminate panel comprising one or more gradient coils (e.g., gradient coils for the X, Y and Z directions) is also fastened to the vibration mount provided on the upper permanent magnet that is not visible in the view illustrate in FIG. 11D to provide the gradient magnetic fields needed for MRI.

FIG. 11E illustrates additional permanent magnet shims 1130' affixed over the laminate panel 1128 illustrated in FIG. 11D. Permanent magnet shim 1130' may provide fine shimming for the $B_0$ magnet. In particular, using any of the techniques described in the '500 application incorporated herein, the magnetic pattern of permanent magnet shim 1130' may be determined by computing a magnetic field correction and determining a magnetic pattern for the permanent magnet shim to provide, at least in part, the magnetic field correction. The patterned permanent magnet shim 1130 may be affixed to a substrate 1132 so that it can be secured to the portable MRI system on top of the laminate panel (e.g., using any of the techniques for patterning described in the '500 application). In this manner, permanent magnet shims 1130 illustrated in FIG. 11A may provide a coarse shimming and permanent magnet shim 1130' may provide a finer shim to improve the profile of the $B_0$ magnetic field produced by $B_0$ magnet 1110 (e.g., to correct for a $B_0$ offset and/or to improve the homogeneity of the $B_0$ magnetic field). It should be appreciated that in the embodiment illustrated in FIG. 11E, another permanent magnet shim may be affixed to the frame over the laminate panel on the upper permanent magnet that is not visible in the view shown in FIG. 11E to correct and/or improve the profile of the $B_0$ magnetic field produced by permanent magnet 1110. The shims provided (e.g., permanent magnet shims 1130, 1130' and/or shim coils fabricated on the laminate panels along with the gradient coils) facilitates a homogeneous $B_0$ magnetic field suitable for obtaining clinically useful images.

FIG. 11F illustrates portable MRI system 1100 with housings or outer coverings over the magnetics components illustrated in FIGS. 11A-E. In particular, housing 1115A and 1115B provide covering for the $B_0$ permanent magnet 1110, permanent magnet shims 1130 and 1130', and laminate panel 1128 comprising the gradient coils for the system for the upper and lower portions of the $B_0$ magnet, respectively. Housing 1125 provides a covering for yoke 1128 and, according to some embodiments, houses preamplifiers and a fan controller that controls the thermal management for the system. The magnetics components of portable MRI system 1100 are supported by base 1150 comprising a housing 1102 for housing the electronic components of the portable MRI system. Portable MRI system 1100 may be sized to facilitate maneuverability of the portable MRI system 1100 so that the system can be brought to the patient. In addition, portable low field MRI system 1100 may be constructed of materials and designed to be light weight, preferably less than 1,500 pounds and, more preferably, less than 1,000 pounds.

Using the techniques described herein, the inventors have developed portable, low power MRI systems capable of being brought to the patient, providing affordable and widely deployable MRI where it is needed. FIGS. 12A and 12B illustrate views of a portable MRI system, in accordance with some embodiments. Portable MRI system 1200 comprises a $B_0$ magnet 1210 formed in part by an upper magnet 1210a and a lower magnet 1210b having a yoke 1220 coupled thereto to increase the flux density within the imaging region. The $B_0$ magnet 1210 may be housed in magnet housing 1212 along with gradient coils 1215 (e.g., any of the gradient coils described in U.S. application Ser. No. 14/845,652, titled "Low Field Magnetic Resonance Imaging Methods and Apparatus" and filed on Sep. 4, 2015, which is herein incorporated by reference in its entirety). According to some embodiments, $B_0$ magnet 1210 comprises an electromagnet. According to some embodiments, $B_0$ magnet 1210 comprises a permanent magnet, for example, a permanent magnet similar to or the same as permanent magnet 200 illustrated in FIG. 2.

Portable MRI system 1200 further comprises a base 1250 housing the electronics needed to operate the MRI system. For example, base 1250 may house electronics including power components configured to operate the MRI system using mains electricity (e.g., via a connection to a standard wall outlet and/or a large appliance outlet). For example, base 1270 may house low power components, such as those described herein, enabling at least in part the portable MRI system to be powered from readily available wall outlets. Accordingly, portable MRI system 1200 can be brought to the patient and plugged into a wall outlet in the vicinity.

Portable MRI system 1200 further comprises moveable slides 1260 that can be opened and closed and positioned in a variety of configurations. Slides 1260 include electromagnetic shielding 1265, which can be made from any suitable conductive or magnetic material, to form a moveable shield to attenuate electromagnetic noise in the operating environment of the portable MRI system to shield the imaging region from at least some electromagnetic noise. As used herein, the term electromagnetic shielding refers to conductive or magnetic material configured to attenuate the electromagnetic field in a spectrum of interest and positioned or arranged to shield a space, object and/or component of interest. In the context of an MRI system, electromagnetic shielding may be used to shield electronic components (e.g., power components, cables, etc.) of the MRI system, to shield the imaging region (e.g., the field of view) of the MRI system, or both.

The degree of attenuation achieved from electromagnetic shielding depends on a number of factors including the type of material used, the material thickness, the frequency spectrum for which electromagnetic shielding is desired or required, the size and shape of apertures in the electromagnetic shielding (e.g., the size of the spaces in a conductive mesh, the size of unshielded portions or gaps in the shielding, etc.) and/or the orientation of apertures relative to an incident electromagnetic field. Thus, electromagnetic shielding refers generally to any conductive or magnetic barrier that acts to attenuate at least some electromagnetic radiation and that is positioned to at least partially shield a given space, object or component by attenuating the at least some electromagnetic radiation.

It should be appreciated that the frequency spectrum for which shielding (attenuation of an electromagnetic field) is desired may differ depending on what is being shielded. For example, electromagnetic shielding for certain electronic components may be configured to attenuate different frequencies than electromagnetic shielding for the imaging region of the MRI system. Regarding the imaging region, the spectrum of interest includes frequencies which influence, impact and/or degrade the ability of the MRI system to excite and detect an MR response. In general, the spectrum of interest for the imaging region of an MRI system correspond to the frequencies about the nominal operating frequency (i.e., the Larmor frequency) at a given $B_0$ magnetic field strength for which the receive system is configured to or capable of detecting. This spectrum is referred to herein as the operating spectrum for the MRI system. Thus, electromagnetic shielding that provides shielding for the operating spectrum refers to conductive or magnetic material arranged or positioned to attenuate frequencies at least within the operating spectrum for at least a portion of an imaging region of the MRI system.

In portable MRI system 1200 illustrated, the moveable shields are thus configurable to provide shielding in different arrangements, which can be adjusted as needed to accommodate a patient, provide access to a patient and/or in accordance with a given imaging protocol. For example, for the imaging procedure illustrated in FIG. 13 (e.g., a brain scan), once the patient has been positioned, slides 1360 can be closed, for example, using handle 1362 to provide electromagnetic shielding 1365 around the imaging region except for the opening that accommodates the patient's upper torso. Accordingly, moveable shields allow the shielding to be configured in arrangements suitable for the imaging procedure and to facilitate positioning the patient appropriately within the imaging region.

To ensure that the moveable shields provide shielding regardless of the arrangements in which the slides are placed, electrical gaskets may be arranged to provide continuous shielding along the periphery of the moveable shield. For example, as shown in FIG. 12B, electrical gaskets 1267a and 1267b may be provided at the interface between slides 1260 and magnet housing to maintain to provide continuous shielding along this interface. According to some embodiments, the electrical gaskets are beryllium fingers or beryllium-copper fingers, or the like (e.g., aluminum gaskets), that maintain electrical connection between shields 1265 and ground during and after slides 1260 are moved to desired positions about the imaging region. According to some embodiments, electrical gaskets 1267c are provided at the interface between slides 1260 so that continuous shielding is provided between slides in arrangements in which the slides are brought together. Accordingly, moveable slides 1260 can provide configurable shielding for the portable MRI system.

Figure 12C:
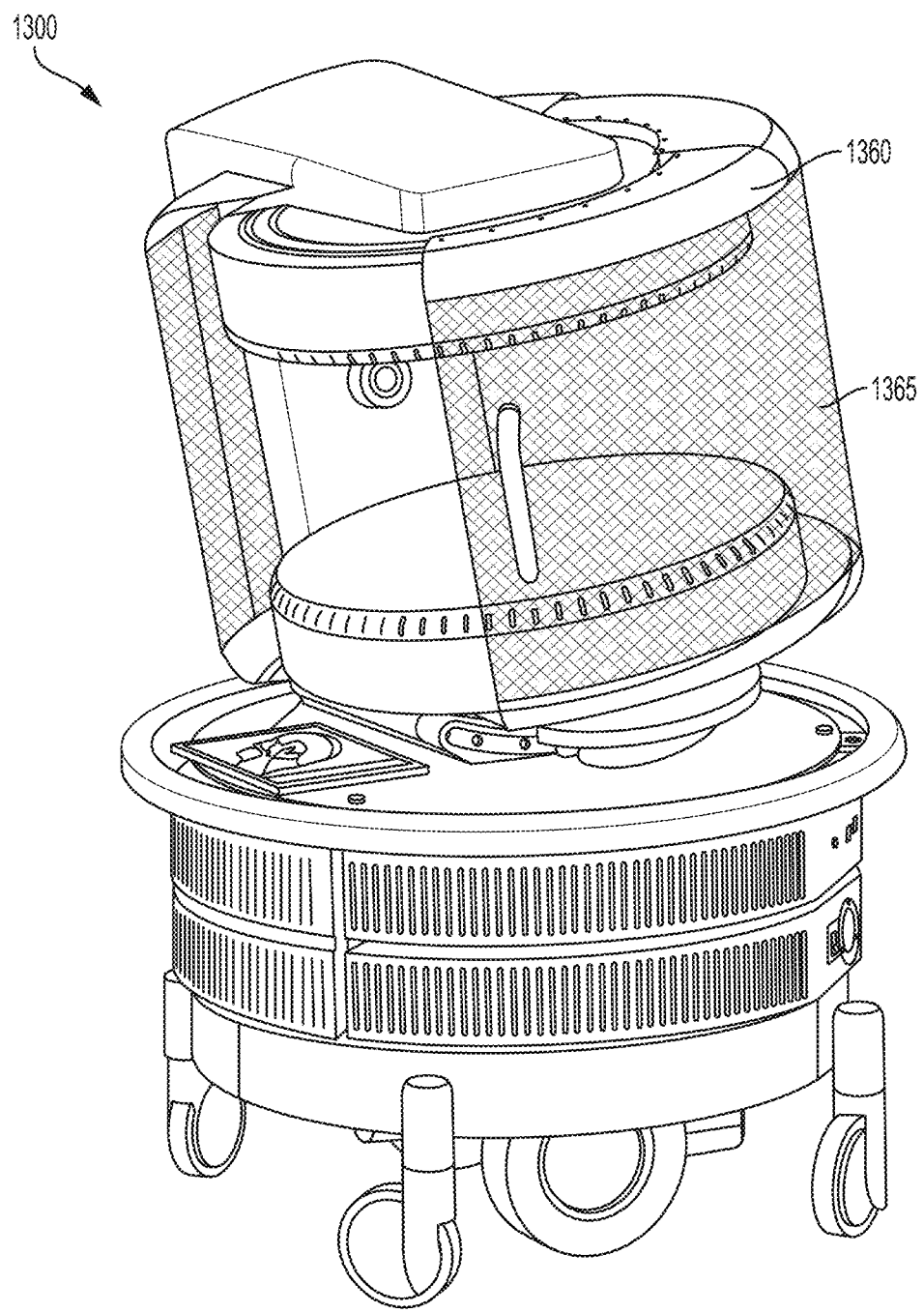
FIG. 12C illustrates another example of a portable MRI system, in accordance with some embodiments of the technology described herein.

FIG. 12C illustrates another example of a portable MRI system, in accordance with some embodiments. Portable MRI system 1300 may be similar in many respects to portable MRI systems illustrated in FIGS. 2, 12A and 12B. However, slides 1360 are constructed differently, as is shielding 3965', resulting in electromagnetic shields that are easier and less expensive to manufacture. As described above, a noise reduction system may be used to allow operation of a portable MRI system in unshielded rooms and with varying degrees of shielding about the imaging region on the system itself, including no, or substantially no, device-level electromagnetic shields for the imaging region. Exemplary shielding designs and noise reduction techniques developed by the inventors are described in U.S. Patent Application Pub. No. 2018/0168527, filed Jan. 24, 2018 and titled "Portable Magnetic Resonance Imaging Methods and Apparatus," which is herein incorporated by reference in its entirety.

Figure 13:
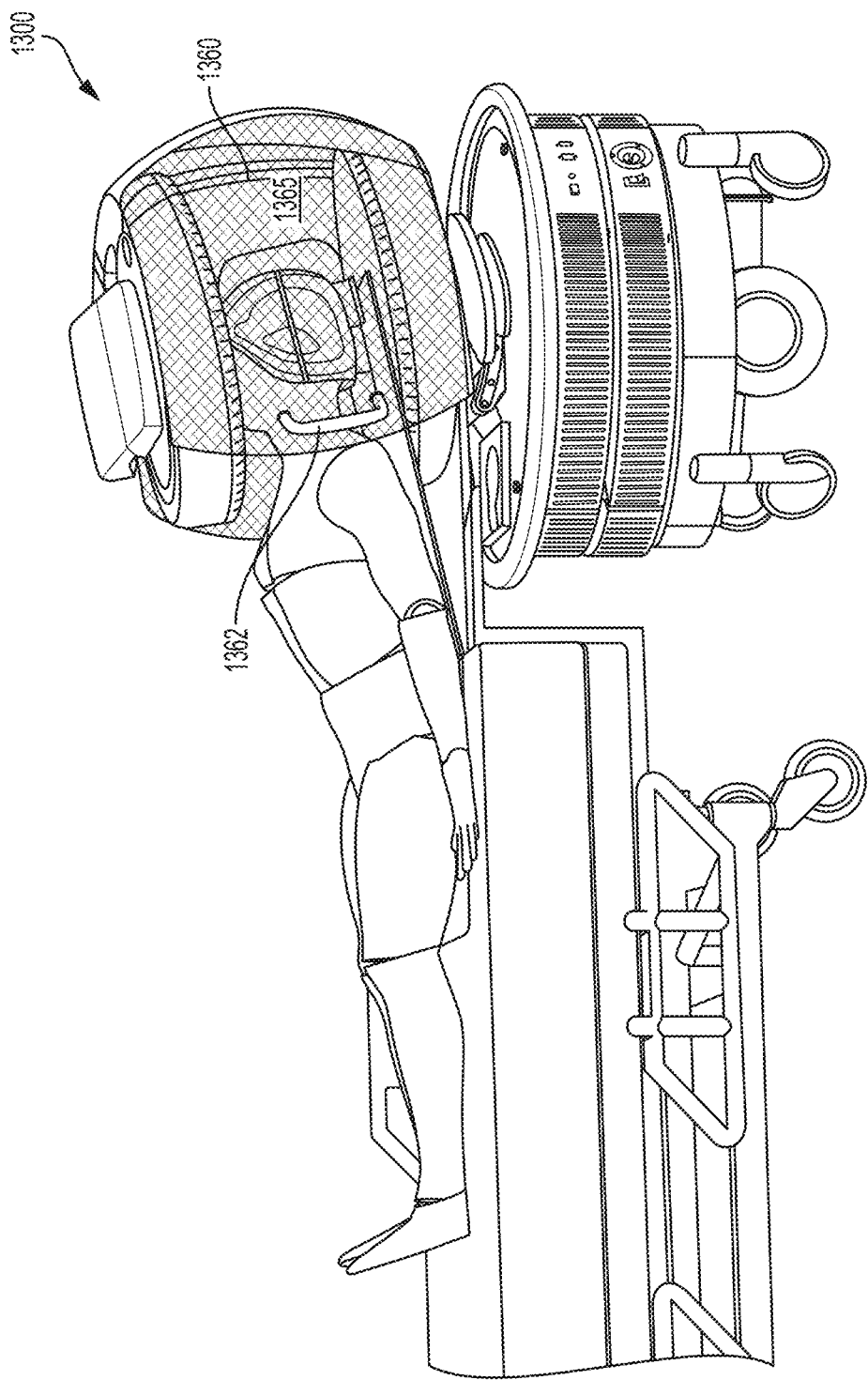
FIG. 13 illustrates a portable MRI system performing a scan of the head, in accordance with some embodiments of the technology described herein.

To facilitate transportation, a motorized component 1280 is provide to allow portable MRI system to be driven from location to location, for example, using a control such as a joystick or other control mechanism provided on or remote from the MRI system. In this manner, portable MRI system 1200 can be transported to the patient and maneuvered to the bedside to perform imaging, as illustrated in FIG. 13. As described above, FIG. 13 illustrates a portable MRI system 1300 that has been transported to a patient's bedside to perform a brain scan.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The invention claimed is:

1. An apparatus for providing a $B_0$ magnetic field for a magnetic resonance imaging system, the apparatus comprising:
at least one first $B_0$ magnet configured to produce a first magnetic field to contribute to the $B_0$ magnetic field for the magnetic resonance imaging system, the at least one first $B_0$ magnet comprising a first plurality of permanent magnet rings including three concentric rings at least two of which have respective different heights, wherein neighboring rings among the three concentric rings are separated from each other by a respective gap;
at least one second $B_0$ magnet configured to produce a second magnetic field to contribute to the $B_0$ magnetic field for the magnetic resonance imaging system, the at least one first $B_0$ magnet comprising a second plurality of permanent magnet rings including three concentric rings at least two of which have respective different heights; and
a yoke configured to capture and direct at least some magnetic flux generated by the at least one first $B_0$ magnet to increase a magnetic flux density within an imaging region, the yoke comprising:
a first plate comprising ferromagnetic material and coupled to the at least one first $B_0$ magnet;
a frame comprising ferromagnetic material and coupled to the first plate
wherein the at least one first $B_0$ magnet and the at least one second $B_0$ magnet are arranged relative to one another so that an imaging region is provided there between,
wherein the different heights of the first plurality of permanent magnet rings and the different heights of the second plurality of permanent magnet rings are selected to obtain a first level of magnetic field homogeneity within a first field of view in the imaging region that is smaller than a second level of magnetic field homogeneity in the first field of view that would be obtained with an arrangement of the first plurality of permanent magnet rings having equal heights and the second plurality of permanent magnet rings having equal heights,
wherein the first field of view includes a sphere having a diameter in a range of 17-23 cm,
wherein the first plurality of permanent magnet rings is concentric about a common center,
wherein the first plurality of permanent magnet rings comprises a first permanent magnet ring closer to the common center than a second permanent magnet ring, and wherein a first height of permanent magnet segments in the first permanent magnet ring is smaller than a second height of permanent magnet segments in the second permanent magnet ring, and
wherein the first plurality of permanent magnet rings comprises a third permanent magnet ring farther from the common center than the second permanent magnet ring, and wherein a third height of permanent magnet segments in the third permanent magnet ring is greater than the second height of the permanent magnet segments in the second permanent magnet ring.

2. The apparatus of claim 1, wherein each of the first plurality of permanent magnet rings has a respective different height.

3. The apparatus of claim 1, wherein each of the second plurality of permanent magnet rings has a respective different height.

4. The apparatus of claim 1, wherein the first level of magnetic field of homogeneity is at least a factor of two smaller than the second level of magnetic homogeneity.

5. The apparatus of claim 1,
wherein the different heights of the first plurality of permanent magnet rings and the different heights of the second plurality of permanent magnet rings are selected to obtain, in the imaging region, the first field of view having a first volume and a first level of magnetic field homogeneity, and
wherein the first volume is greater than a second volume of a second field of view having the first level of magnetic field homogeneity that would be obtained if heights of the first plurality of permanent magnet rings were equal and heights of the second plurality of permanent magnet rings were equal.

6. The apparatus of claim 1, wherein the first plurality of permanent magnet rings comprises a fourth permanent magnet ring farther from the common center than the third permanent magnet ring, and wherein a fourth height of permanent magnet segments in the fourth permanent magnet ring is greater than the third height of permanent magnet segments in the third permanent magnet ring.

7. The apparatus of claim 1, wherein multiple permanent magnet segments in the first permanent magnet ring have the first height, and wherein multiple permanent magnet segments in the second permanent magnet ring have the second height.

8. The apparatus of claim 1, wherein each of the permanent magnet segments in the first permanent magnet ring have the first height, and wherein each of the permanent magnet segments in the second permanent magnet ring have the second height.

9. The apparatus of claim 1, wherein the permanent magnet segments in the first permanent magnet ring comprise circular arc segments.

10. The apparatus of claim 1, wherein the permanent magnet segments in the first permanent magnet ring comprise rectangular blocks.

11. The apparatus of claim 1, wherein the permanent magnet segments in the first permanent magnet ring comprise trapezoidal blocks.

12. The apparatus of claim 1, wherein the second plurality of permanent magnet rings is concentric about a common center.

13. The apparatus of claim 12, wherein the first plurality of permanent magnet rings and the second plurality of permanent magnet rings have a same number of rings such that each permanent magnet ring in the first plurality of permanent magnet rings has a corresponding permanent magnet ring in the second plurality of permanent magnet rings, and wherein each pair of corresponding permanent magnet rings have permanent magnet segments of a same height.

14. The apparatus of claim 1, wherein the at least one first $B_0$ magnet and the at least one second $B_0$ magnet contribute to the $B_0$ magnetic field for the magnetic resonance imaging system, the $B_0$ magnetic field having a field strength of less than or equal to 0.1 T and greater than or equal to 50 mT.

15. An apparatus for providing a $B_0$ magnetic field for a magnetic resonance imaging system, the apparatus comprising:

at least one first $B_0$ magnet configured to produce a first magnetic field to contribute to the $B_0$ magnetic field for the magnetic resonance imaging system, the at least one first $B_0$ magnet comprising a first plurality of permanent magnet rings including three concentric rings at least two of which have respective different heights, wherein neighboring rings among the three concentric rings are separated from each other by a respective gap;

at least one second $B_0$ magnet configured to produce a second magnetic field to contribute to the $B_0$ magnetic field for the magnetic resonance imaging system, the at least one first $B_0$ magnet comprising a second plurality of permanent magnet rings including three concentric rings at least two of which have respective different heights; and a yoke configured to capture and direct at least some magnetic flux generated by the at least one first $B_0$ magnet to increase a magnetic flux density within an imaging region, the yoke comprising:

a first plate comprising ferromagnetic material and coupled to the at least one first $B_0$ magnet;

a frame comprising ferromagnetic material and coupled to the first plate, wherein the at least one first $B_0$ magnet and the at least one second $B_0$ magnet are arranged relative to one another so that an imaging region is provided therebetween, wherein the different heights of the first plurality of permanent magnet rings and the different heights of the second plurality of permanent magnet rings are selected to obtain, in the imaging region, a first field of view having a first volume and a first magnetic field homogeneity, wherein the first volume is greater than a second volume of a second field of view having the first magnetic field homogeneity that would be obtained if heights of the first plurality of permanent magnet rings were equal and heights of the second plurality of permanent magnet rings were equal, wherein the first volume is at least 10 percent larger than the second volume, wherein the first plurality of permanent magnet rings is concentric about a common center, wherein the first plurality of permanent magnet rings comprises a first permanent magnet ring closer to the common center than a second permanent magnet ring, and wherein a first height of permanent magnet segments in the first permanent magnet ring is smaller than a second height of permanent magnet segments in the second permanent magnet ring, and wherein the first plurality of permanent magnet rings comprises a third permanent magnet ring farther from the common center than the second permanent magnet ring, and wherein a third height of permanent magnet segments in the third permanent magnet ring is greater than the second height of the permanent magnet segments in the second permanent magnet ring.

16. An apparatus for providing a $B_0$ magnetic field for a magnetic resonance imaging system, the apparatus comprising:

at least one first $B_0$ magnet configured to produce a first magnetic field to contribute to the $B_0$ magnetic field for the magnetic resonance imaging system, the at least one first $B_0$ magnet comprising a first plurality of permanent magnet rings including three concentric rings at least two of which have respective different heights, wherein neighboring rings among the three concentric rings are separated from each other by a respective gap; and a yoke configured to capture and direct at least some magnetic flux generated by the at least one first $B_0$ magnet to increase a magnetic flux density within an imaging region, the yoke comprising:

a first plate comprising ferromagnetic material and coupled to the at least one first B0 magnet;

a frame comprising ferromagnetic material and coupled to the first plate; and first additional ferromagnetic material coupled to the first plate to compensate for magnetic saturation induced in the first plate.

17. An apparatus for providing a $B_0$ magnetic field for a magnetic resonance imaging system, the apparatus comprising:

at least one first $B_0$ magnet configured to produce a first magnetic field to contribute to the $B_0$ magnetic field for the magnetic resonance imaging system, the at least one first $B_0$ magnet comprising a first plurality of permanent magnet rings including three concentric rings at least two of which have respective different heights, wherein neighboring rings among the three concentric rings are separated from each other by a respective gap; and a yoke configured to capture and direct at least some magnetic flux generated by the at least one first $B_0$ magnet to increase a magnetic flux density within an imaging region, the yoke comprising:
  a first plate comprising ferromagnetic material and coupled to the at least one first $B_0$ magnet;
  a frame comprising ferromagnetic material and coupled to the first plate, wherein:
    the first plate comprises a first set of one or more holes to compensate for magnetic saturation induced in the first plate.

* * * * *